US012672323B2

(12) United States Patent
Nakano

(10) Patent No.: US 12,672,323 B2
(45) Date of Patent: Jun. 30, 2026

(54) SEMICONDUCTOR DEVICE INCLUDING AN ORGANIC FILM COVERING A PROJECTING STRUCTURE

(71) Applicant: ROHM CO., LTD., Kyoto (JP)

(72) Inventor: Yuki Nakano, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 496 days.

(21) Appl. No.: 18/025,957

(22) PCT Filed: Nov. 4, 2021

(86) PCT No.: PCT/JP2021/040546
§ 371 (c)(1),
(2) Date: Mar. 13, 2023

(87) PCT Pub. No.: WO2022/113679
PCT Pub. Date: Jun. 2, 2022

(65) Prior Publication Data
US 2023/0369392 A1      Nov. 16, 2023

(30) Foreign Application Priority Data
Nov. 27, 2020    (JP) ................................. 2020-196698

(51) Int. Cl.
*H10D 62/10*          (2025.01)
*H10W 74/10*          (2026.01)
(Continued)

(52) U.S. Cl.
CPC ........ *H10D 62/117* (2025.01); *H10W 74/147* (2026.01); *H10D 8/60* (2025.01);
(Continued)

(58) Field of Classification Search
CPC .... H10D 62/117; H10D 8/60; H10D 62/8325; H10D 30/665; H10D 30/655;
(Continued)

(56) References Cited

U.S. PATENT DOCUMENTS

| | | |
|---|---|---|
| 2019/0080976 A1 | 3/2019 | Kudou et al. |
| 2021/0233873 A1* | 7/2021 | Ito ....................... H10D 62/8325 |
| 2021/0234038 A1* | 7/2021 | Uchida .................. H10D 8/051 |

FOREIGN PATENT DOCUMENTS

| | | |
|---|---|---|
| DE | 102019201936 A1 | 10/2019 |
| DE | 112020000853 T5 | 11/2021 |

(Continued)

OTHER PUBLICATIONS

Office Action issued on Aug. 18, 2023, in corresponding German patent Application No. 11 2021 003 938.5, 14 pages.
(Continued)

*Primary Examiner* — Shahed Ahmed
(74) *Attorney, Agent, or Firm* — XSENSUS LLP

(57)          ABSTRACT
A semiconductor device includes a chip which has a first main surface on one side and a second main surface on the other side and which includes an active surface set at an inner portion of the first main surface and an outside surface set at a peripheral edge portion of the first main surface, a functional device which is formed at the active surface side, a projecting structure which includes an inorganic substance and projects at the outside surface side, and an organic film which covers the projecting structure.

21 Claims, 36 Drawing Sheets

(51) Int. Cl.

| | |
|---|---|
| *H10D 8/60* | (2025.01) |
| *H10D 30/66* | (2025.01) |
| *H10D 62/832* | (2025.01) |
| *H10W 74/40* | (2026.01) |
| *H10W 74/43* | (2026.01) |
| *H10W 74/47* | (2026.01) |

(52) U.S. Cl.

CPC ....... *H10D 30/668* (2025.01); *H10D 62/8325* (2025.01); *H10W 74/43* (2026.01); *H10W 74/47* (2026.01); *H10W 74/481* (2026.01)

(58) Field of Classification Search

CPC .......... H10D 8/00–825; H01L 23/3192; H01L 23/291; H01L 23/293; H01L 23/298; H01L 21/0445–0495; H10W 74/147; H10W 74/43; H10W 74/47; H10W 74/481

See application file for complete search history.

(56) References Cited

FOREIGN PATENT DOCUMENTS

| | | | | | |
|---|---|---|---|---|---|
| JP | 2020068223 | A | * | 4/2020 | ......... H10D 62/8325 |
| WO | 2020012810 | A1 | | 1/2020 | |
| WO | 2020/035938 | A1 | | 2/2020 | |
| WO | 2020/105097 | A1 | | 5/2020 | |

OTHER PUBLICATIONS

International Search Report and Written Opinion mailed on Jan. 11, 2022, received for PCT Application PCT/JP2021/040546, filed on Nov. 4, 2021, 14 pages including English Translation.

Notice of Reasons for Refusal dated Nov. 20, 2025 in corresponding Japanese patent application No. 2022-565175 (9 pages; with English machine translation).

* cited by examiner

SD

1

SEMICONDUCTOR DEVICE INCLUDING AN ORGANIC FILM COVERING A PROJECTING STRUCTURE

CROSS-REFERENCE TO RELATED APPLICATIONS

The present application is based on PCT filing PCT/JP2021/040546, filed Nov. 4, 2021, which claims priority to Japanese Patent Application No. 2020-196698, filed Nov. 27, 2020, the entire contents of each are incorporated herein by reference.

Technical Field

The present invention relates to a semiconductor device.

BACKGROUND ART

Patent Literature 1 discloses a semiconductor device including a semiconductor substrate, an interlayer insulating layer, an electrode, an inorganic protective layer, and an organic protective layer. The interlayer insulating layer covers the semiconductor substrate. The electrode covers the semiconductor substrate and the interlayer insulating layer. The inorganic protective layer covers the electrode and the interlayer insulating layer. The organic protective layer covers the inorganic protective layer, the electrode and the interlayer insulating layer.

CITATION LIST

Patent Literature

Patent Literature 1: United States Patent Publication Application No. 2019/0080976 Specification

SUMMARY OF INVENTION

Technical Problem

One embodiment of the present invention provides a semiconductor device capable of improving reliability.

Solution to Problem

One embodiment of the present invention provides a semiconductor device including a chip which has a first main surface on one side and a second main surface on the other side and which includes an active surface set at an inner portion of the first main surface and an outside surface set at a peripheral edge portion of the first main surface, a functional device which is formed at the active surface side, a projecting structure which includes an inorganic substance and projects at the outside surface side, and an organic film which covers the projecting structure.

The aforementioned as well as yet other objects, features, and effects of the present invention will be made clear by the following description of the embodiments with reference to the accompanying drawings.

2

Figure 2:
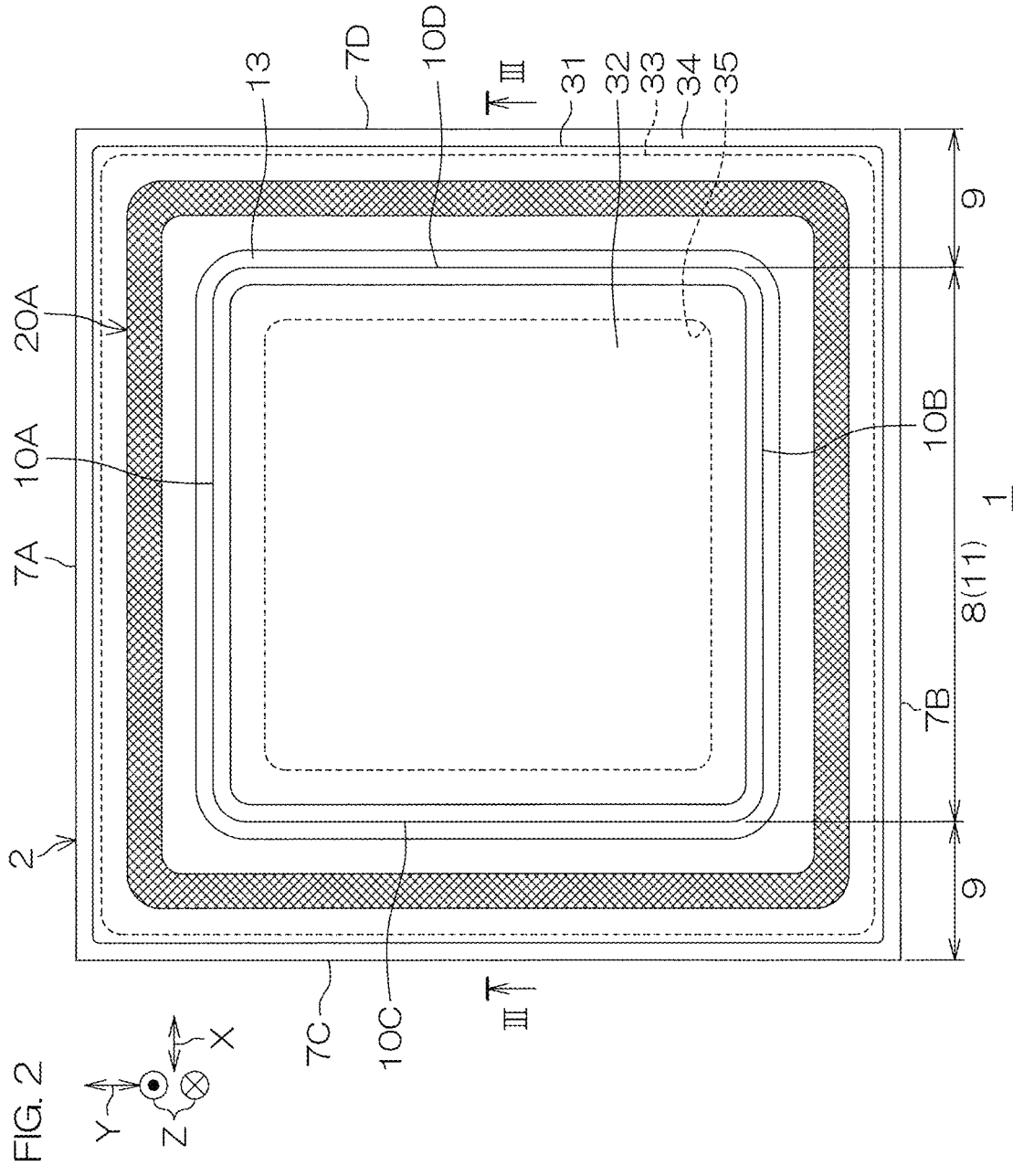

FIG. 2 is a plan view which shows an internal structure of the SiC semiconductor device.

Figure 3:
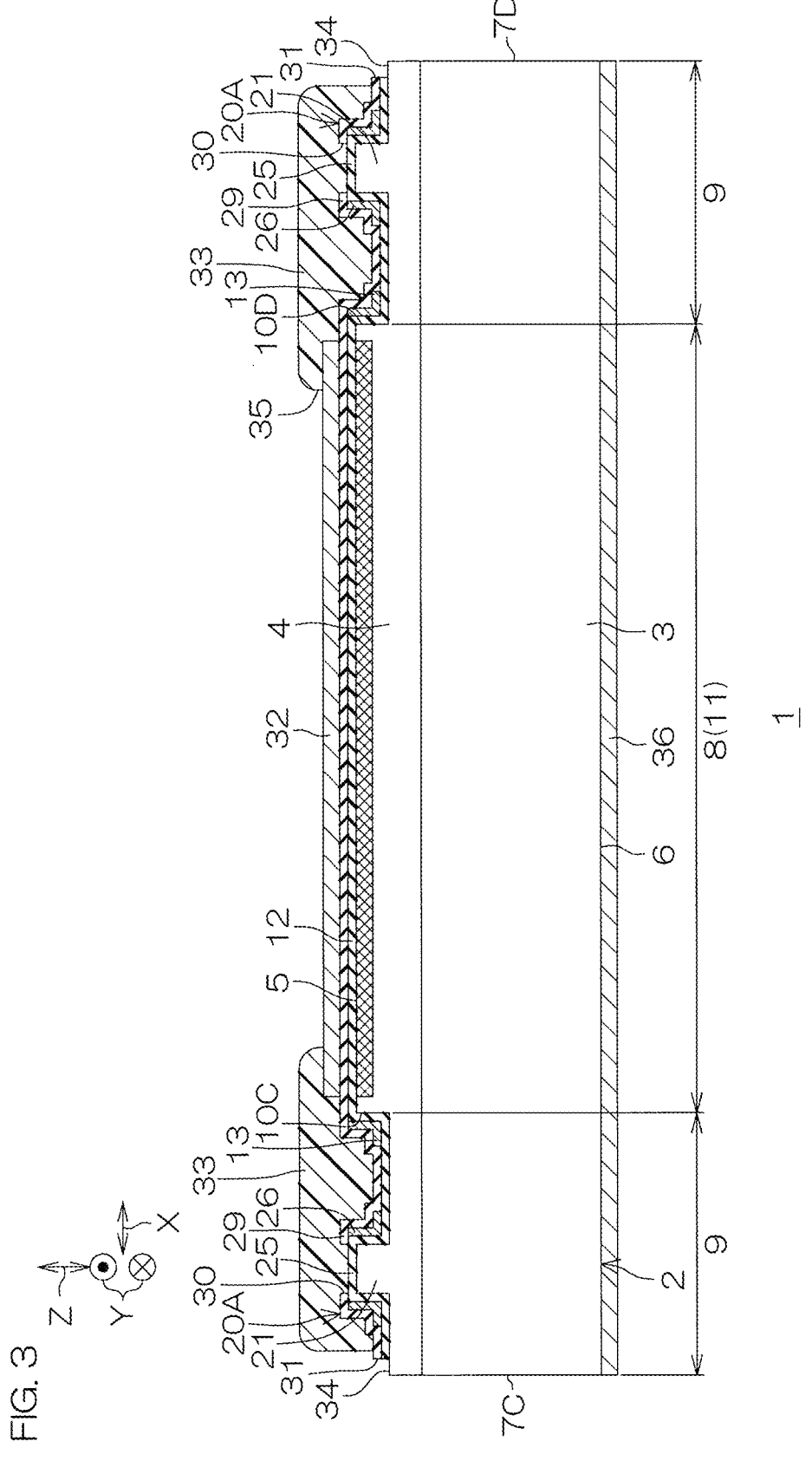

FIG. 3 is a cross-sectional view taken along line III-III shown in FIG. 2.

Figure 4:
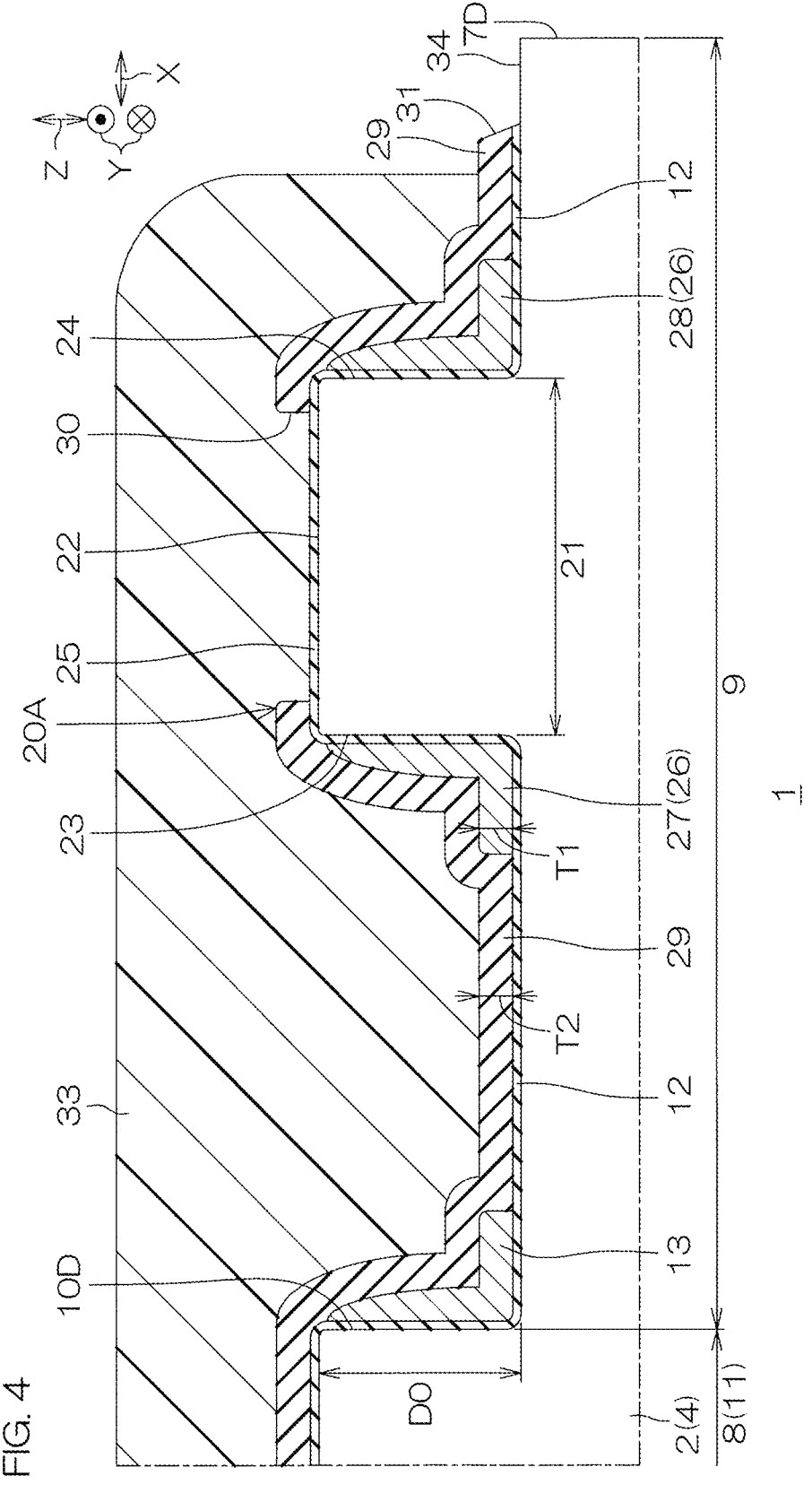

FIG. 4 is an enlarged cross-sectional view which shows a first projecting structure according to a first configuration example.

Figure 5A:
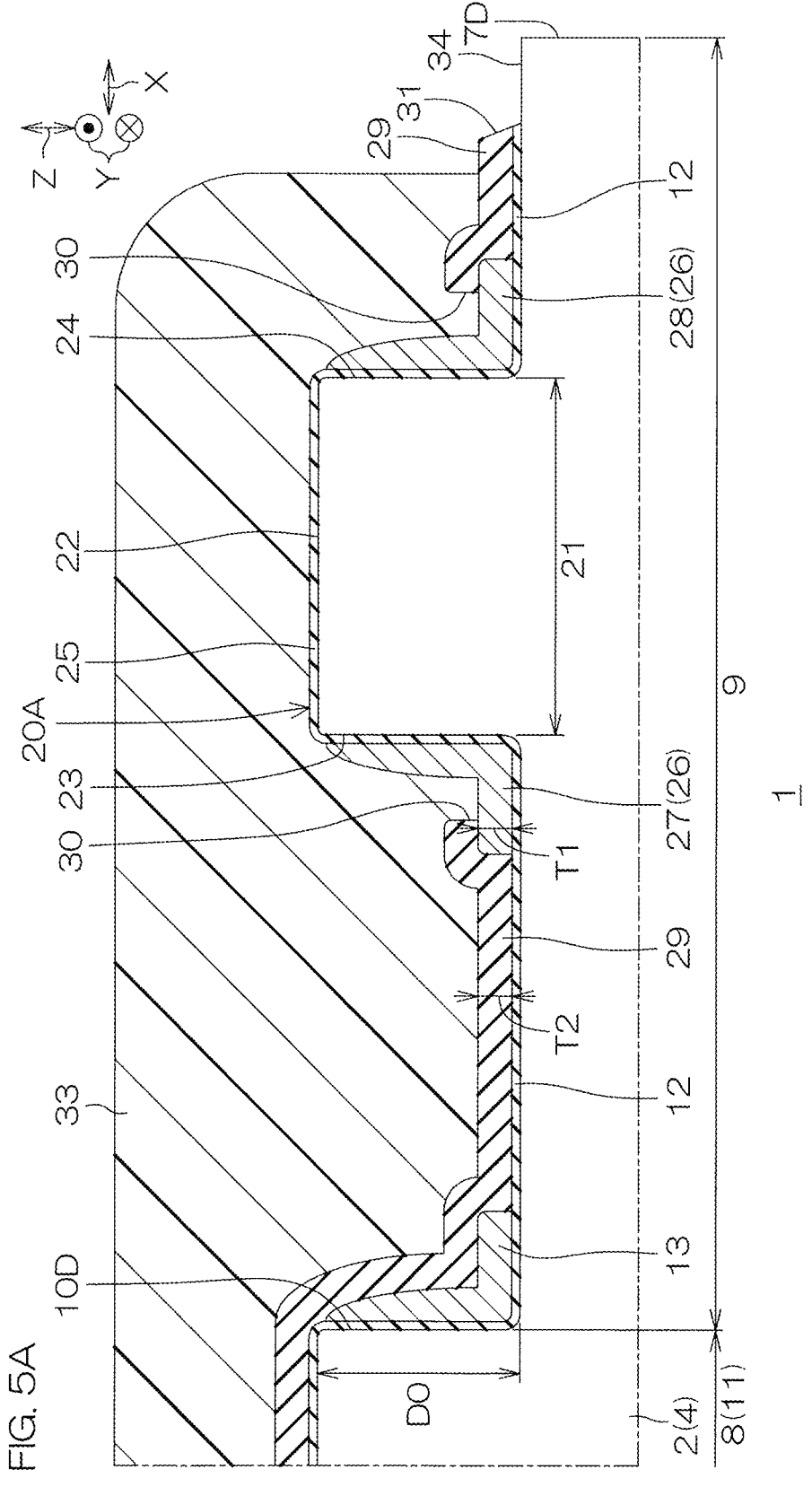

FIG. 5A is an enlarged cross-sectional view which shows the first projecting structure according to a second configuration example.

Figure 5B:
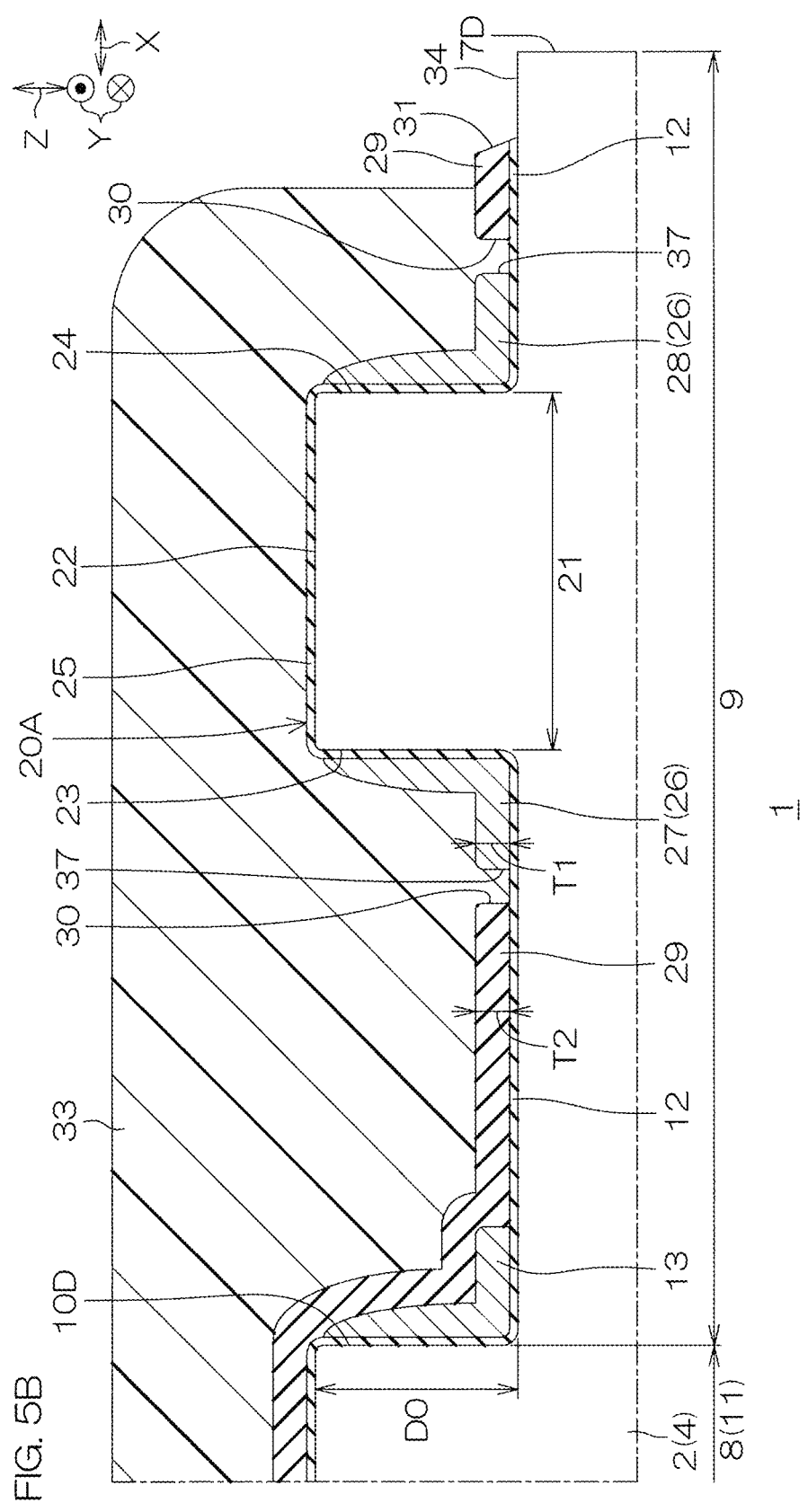

FIG. 5B is an enlarged cross-sectional view which shows the first projecting structure according to a third configuration example.

Figure 5C:
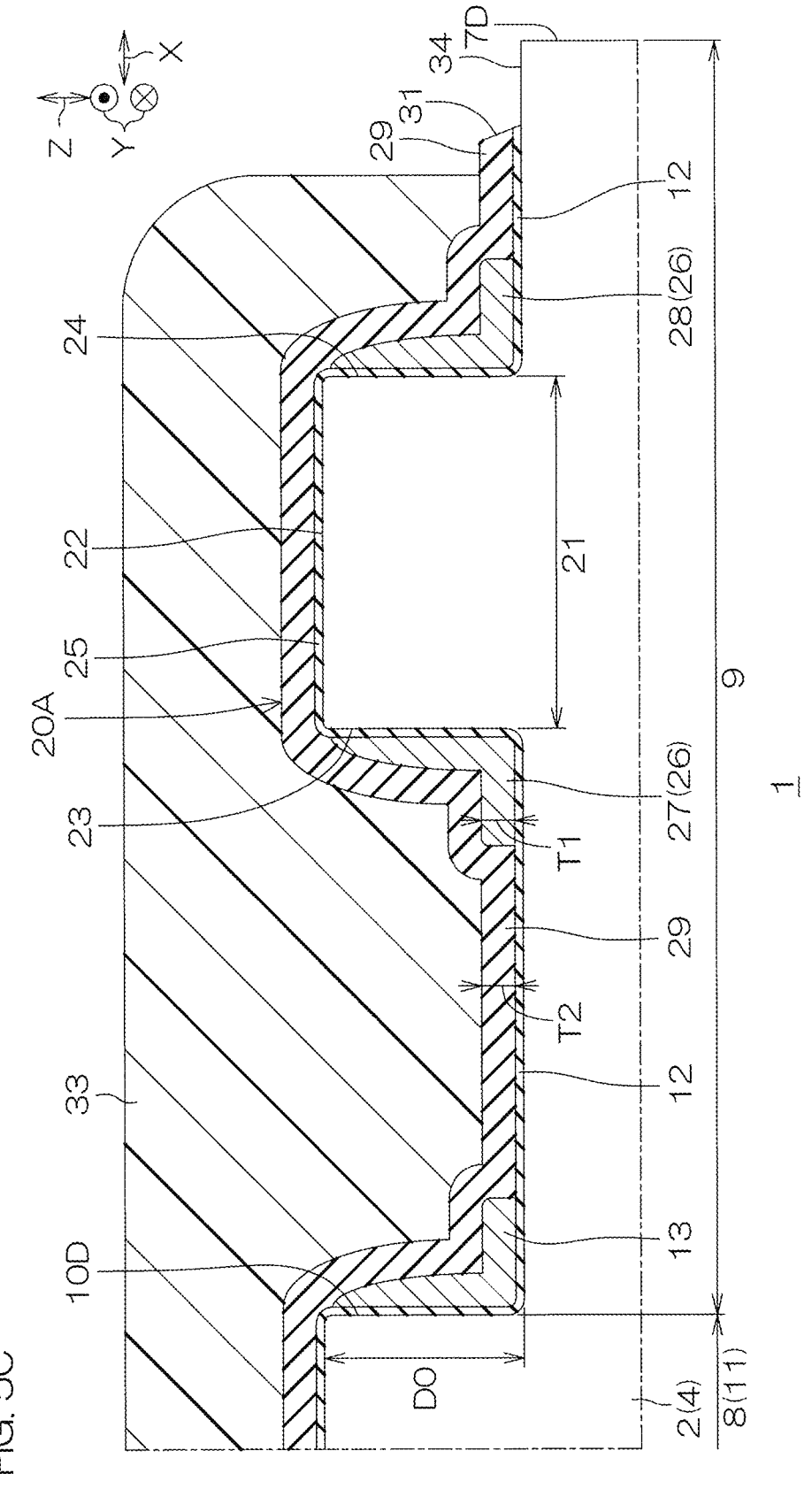

FIG. 5C is an enlarged cross-sectional view which shows the first projecting structure according to a fourth configuration example.

Figure 6:
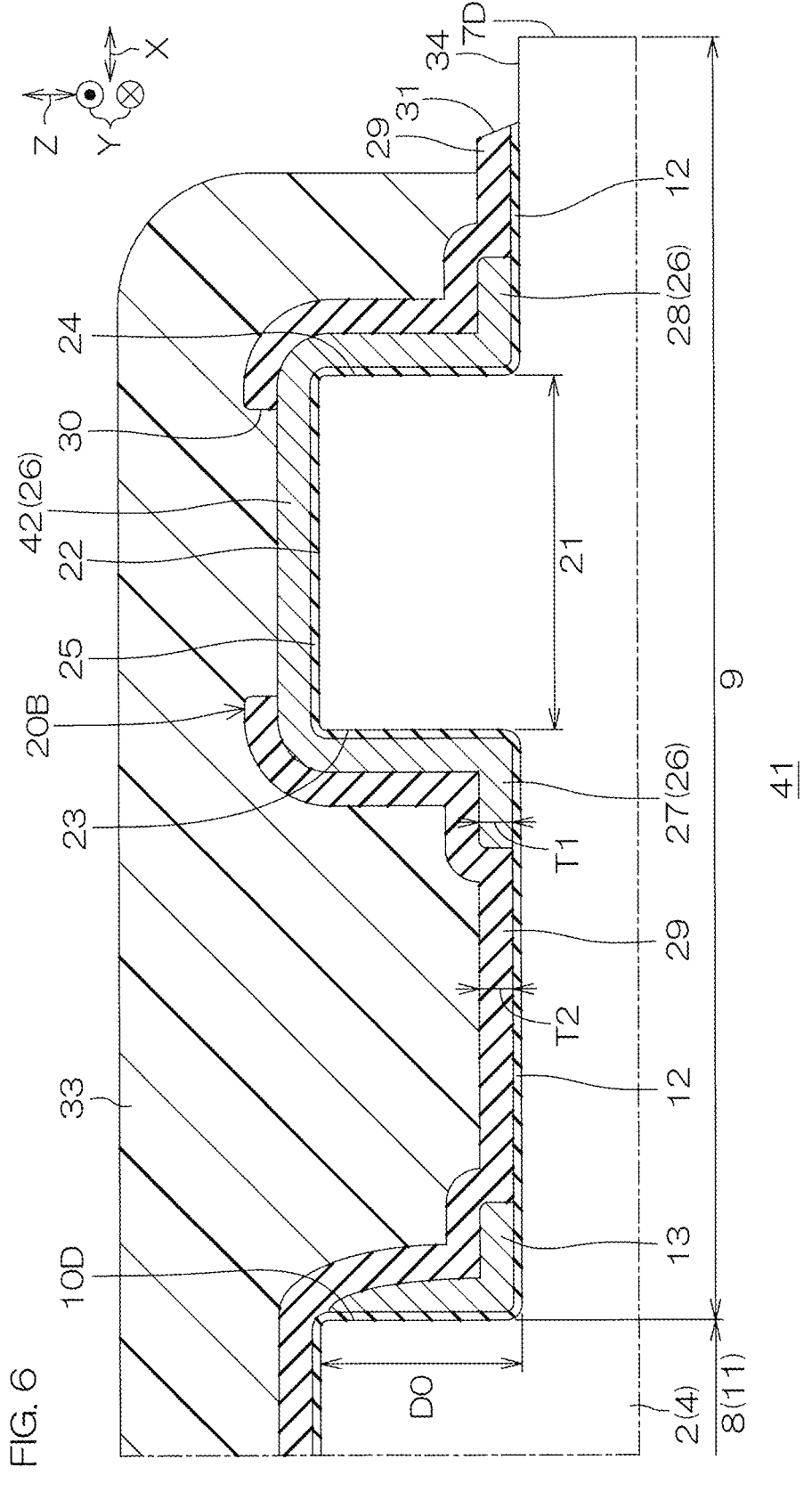

FIG. 6 corresponds to FIG. 4 and is an enlarged cross-sectional view which shows an SiC semiconductor device according to a second embodiment of the present invention with a second projecting structure according to the first configuration example.

Figure 7A:
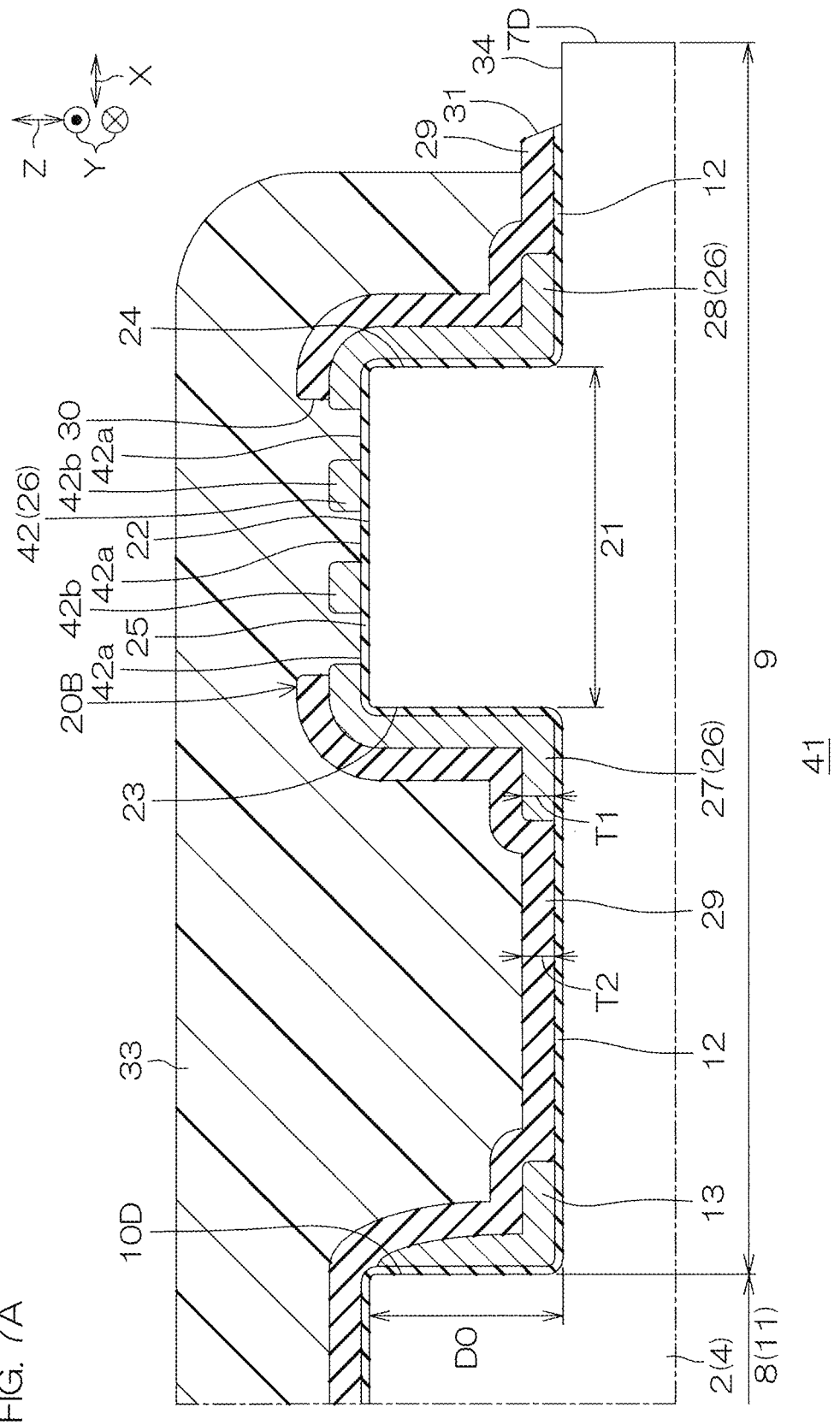

FIG. 7A is an enlarged cross-sectional view which shows the second projecting structure according to the second configuration example.

Figure 7B:
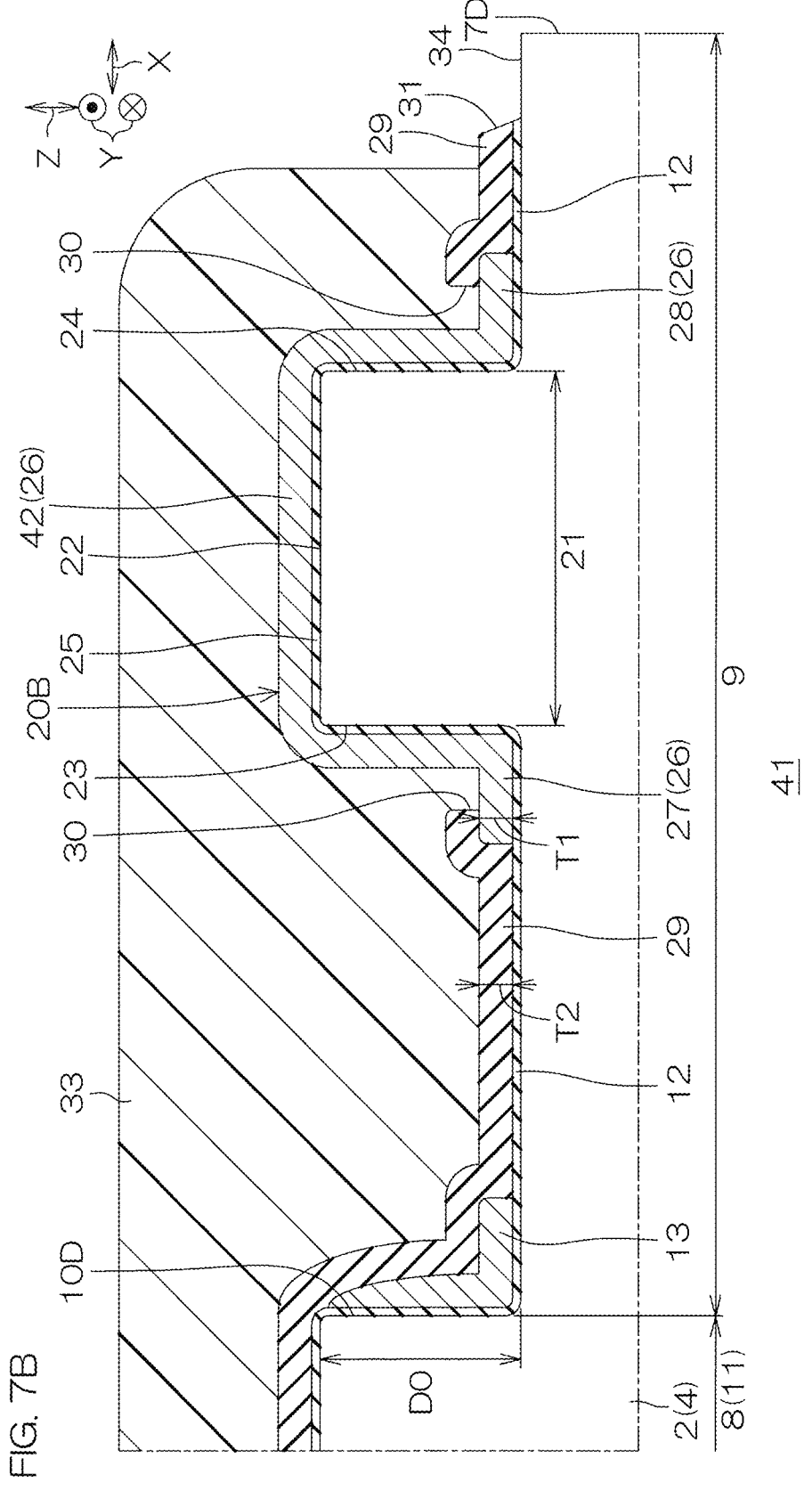

FIG. 7B is an enlarged cross-sectional view which shows the second projecting structure according to the third configuration example.

Figure 7C:
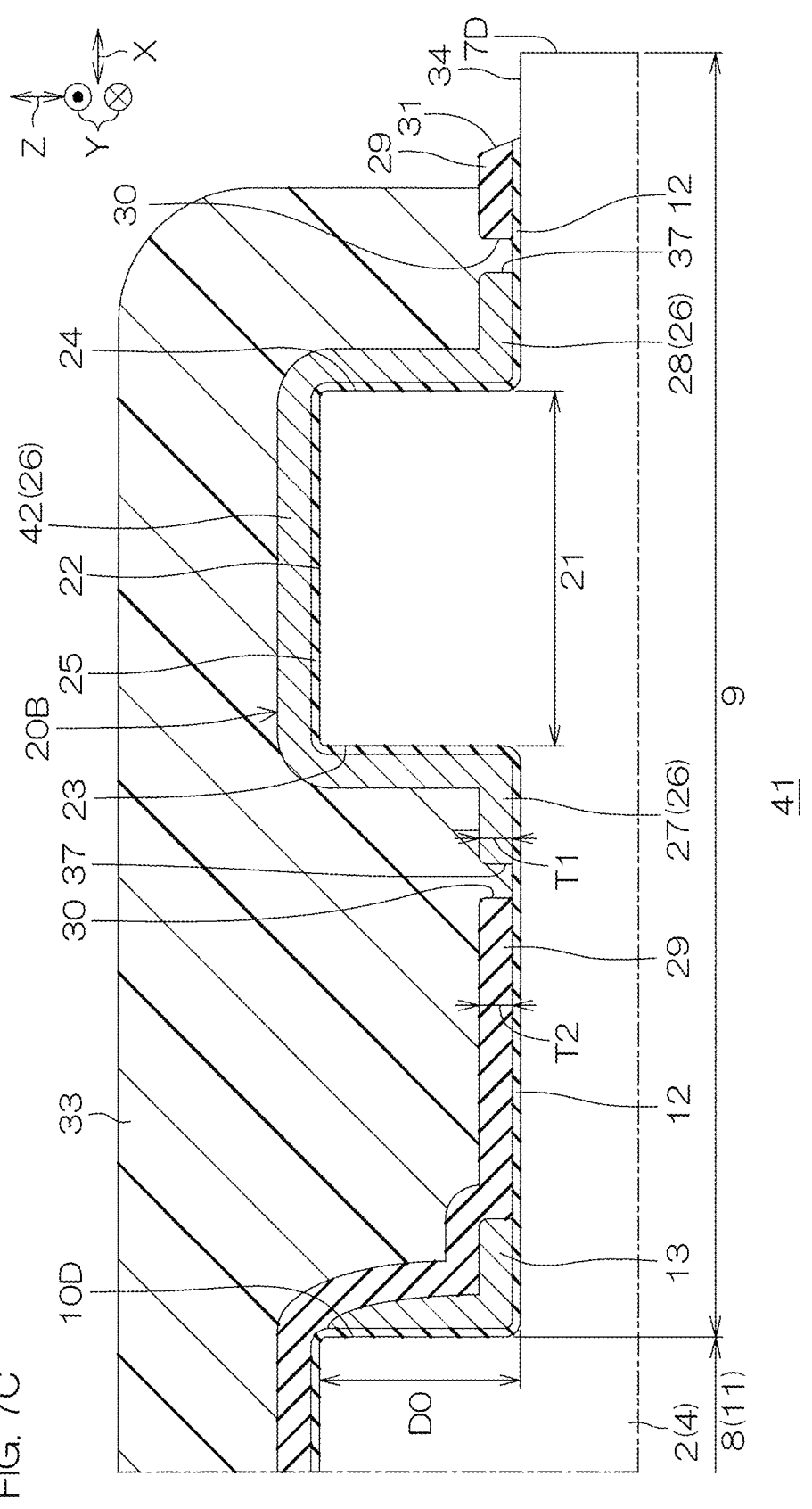

FIG. 7C is an enlarged cross-sectional view which shows the second projecting structure according to the fourth configuration example.

Figure 7D:
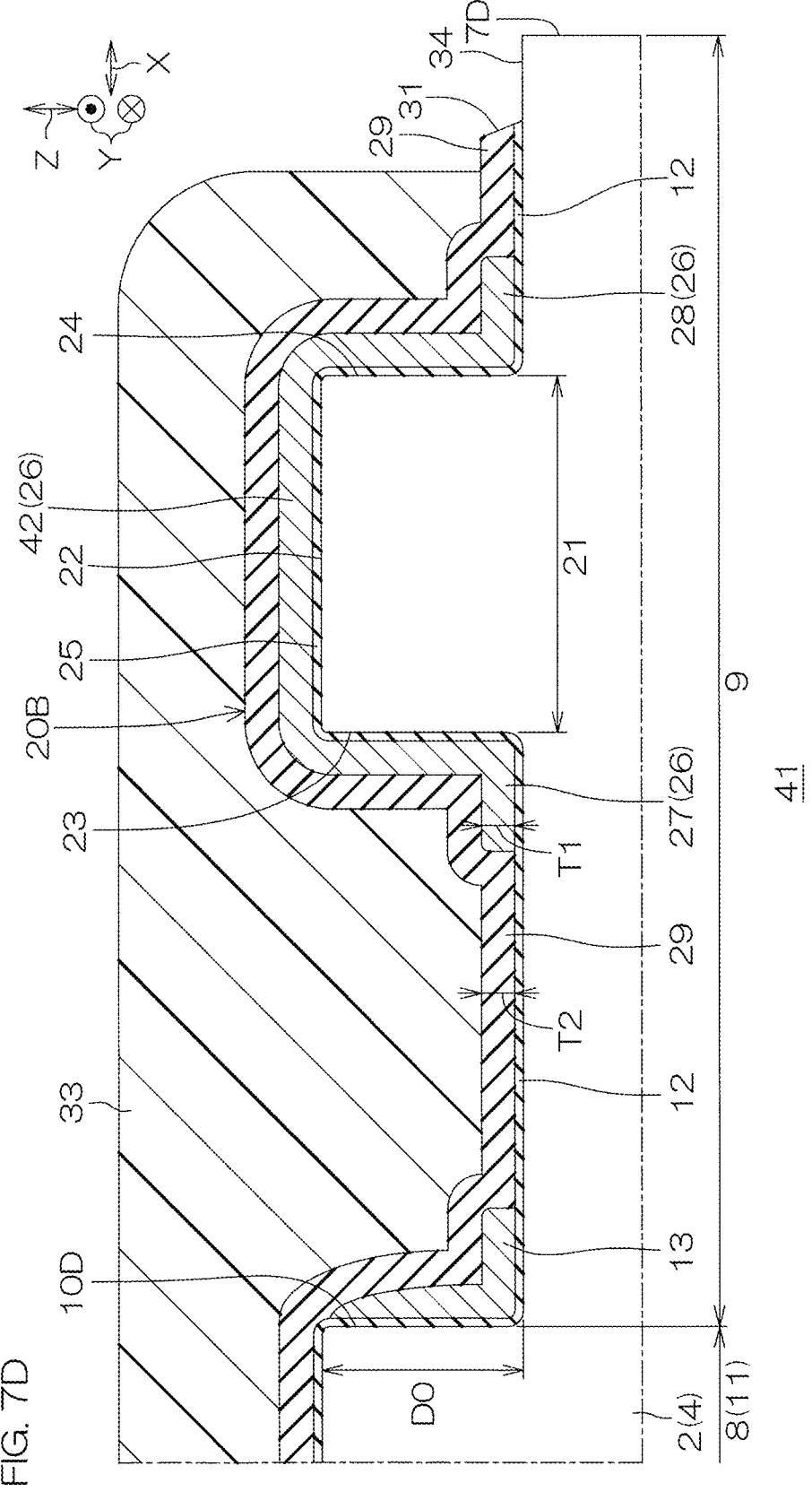

FIG. 7D is an enlarged cross-sectional view which shows the second projecting structure according to a fifth configuration example.

Figure 8:
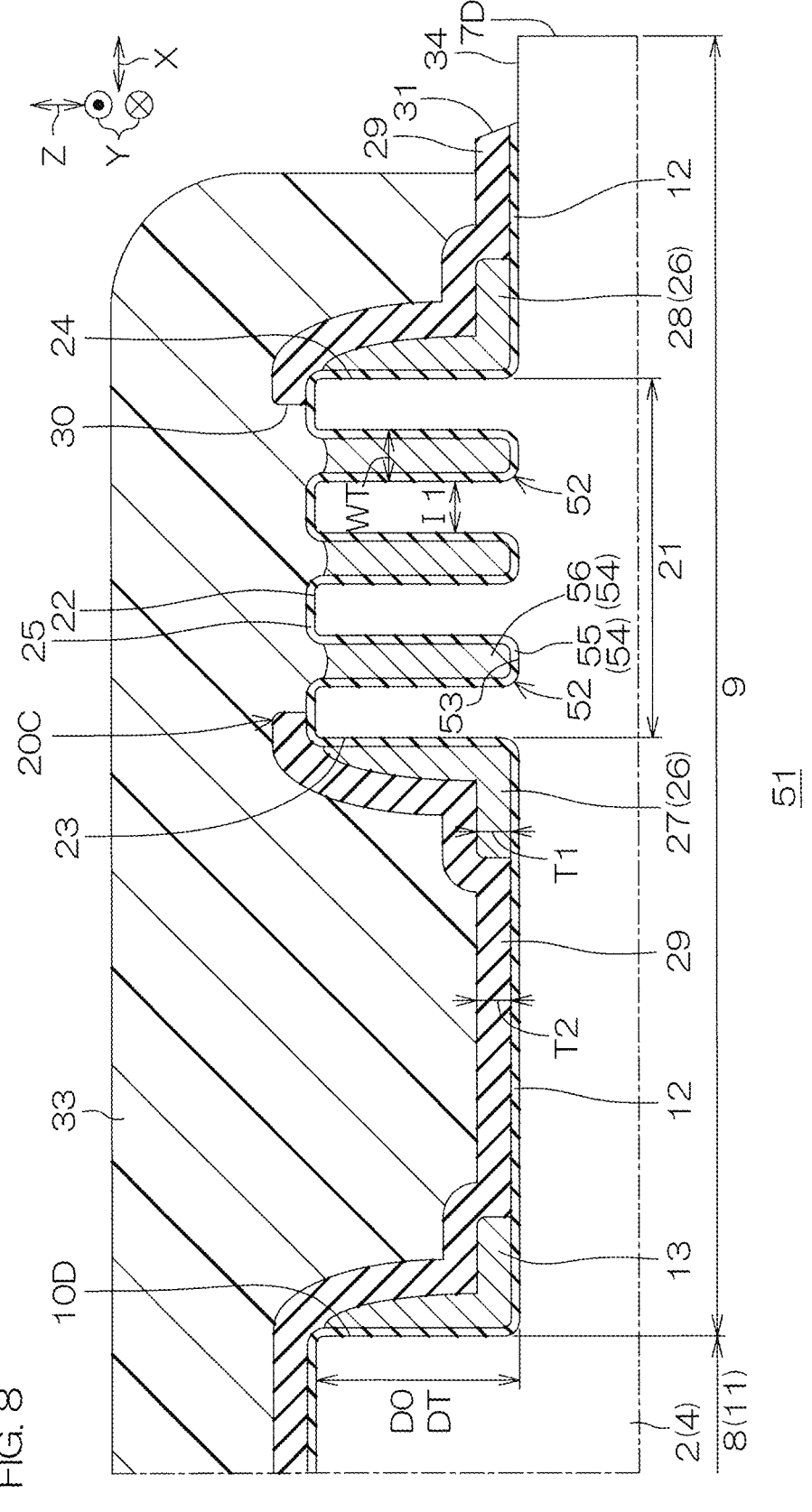

FIG. 8 corresponds to FIG. 4 and is an enlarged cross-sectional view which shows an SiC semiconductor device according to a third embodiment of the present invention with a third projecting structure of the first configuration example.

Figure 9A:
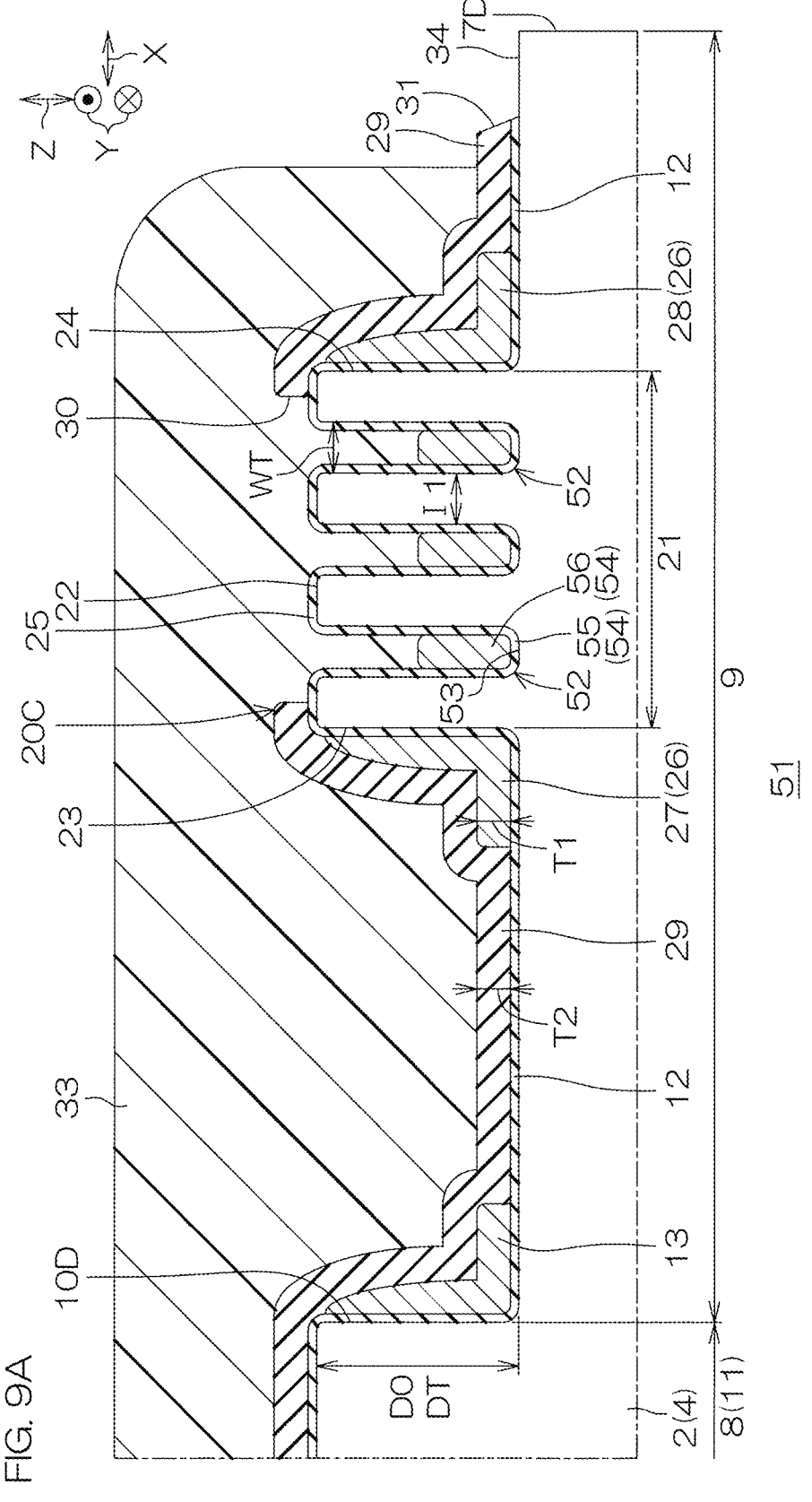

FIG. 9A is an enlarged cross-sectional view which shows the third projecting structure according to the second configuration example.

Figure 9B:
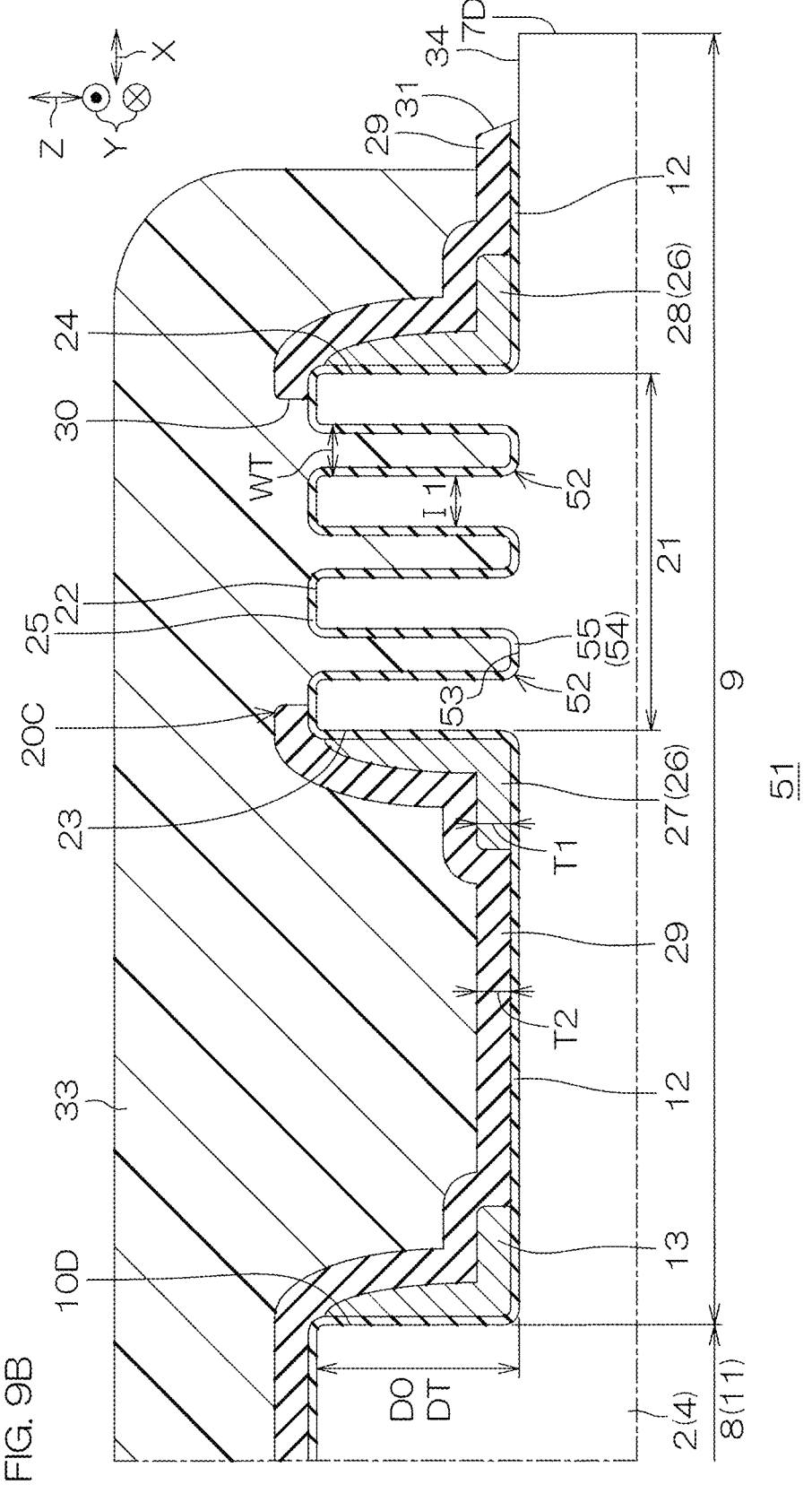

FIG. 9B is an enlarged cross-sectional view which shows the third projecting structure according to the third configuration example.

Figure 9C:
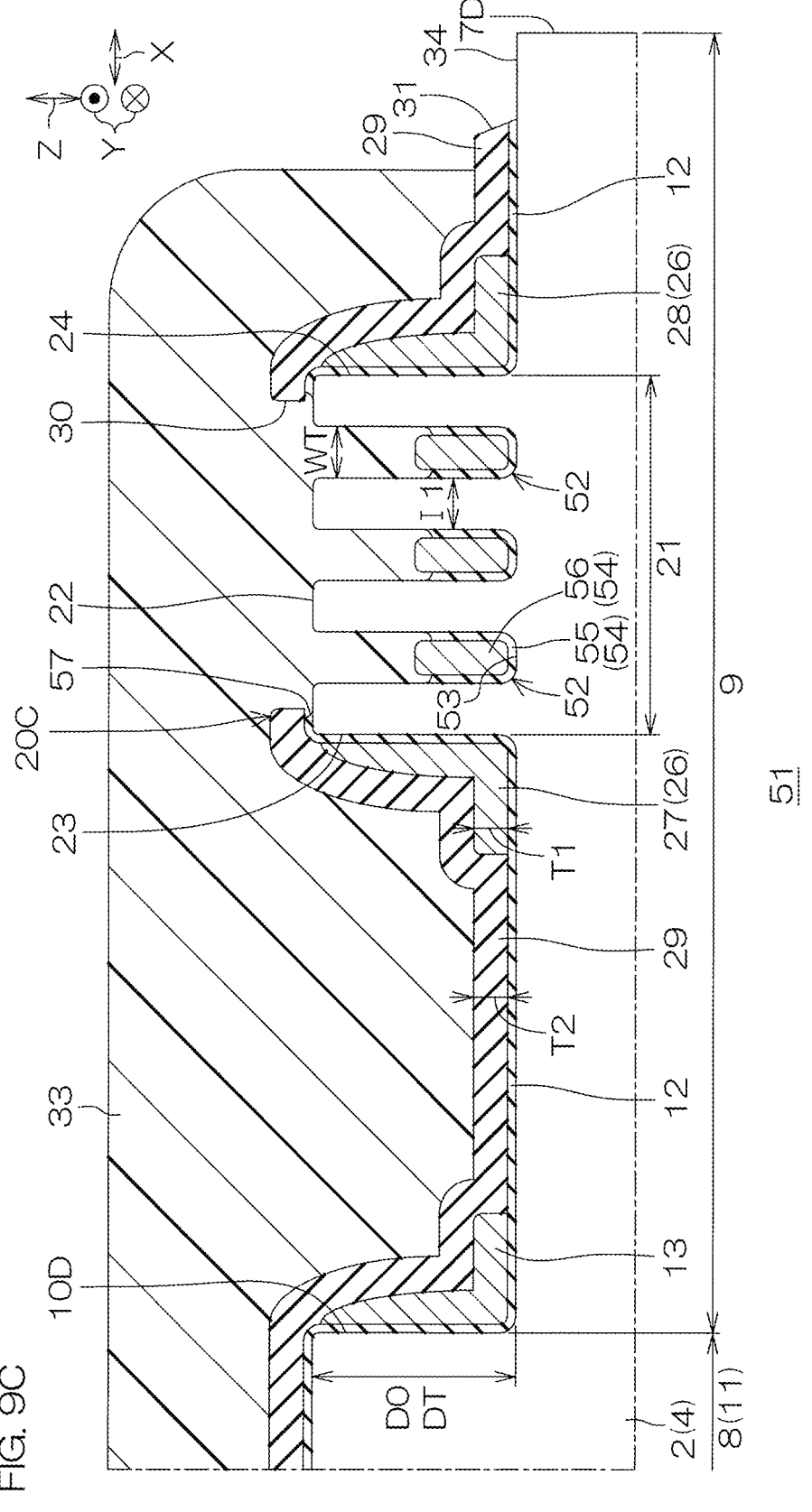

FIG. 9C is an enlarged cross-sectional view which shows the third projecting structure according to the fourth configuration example.

Figure 9D:
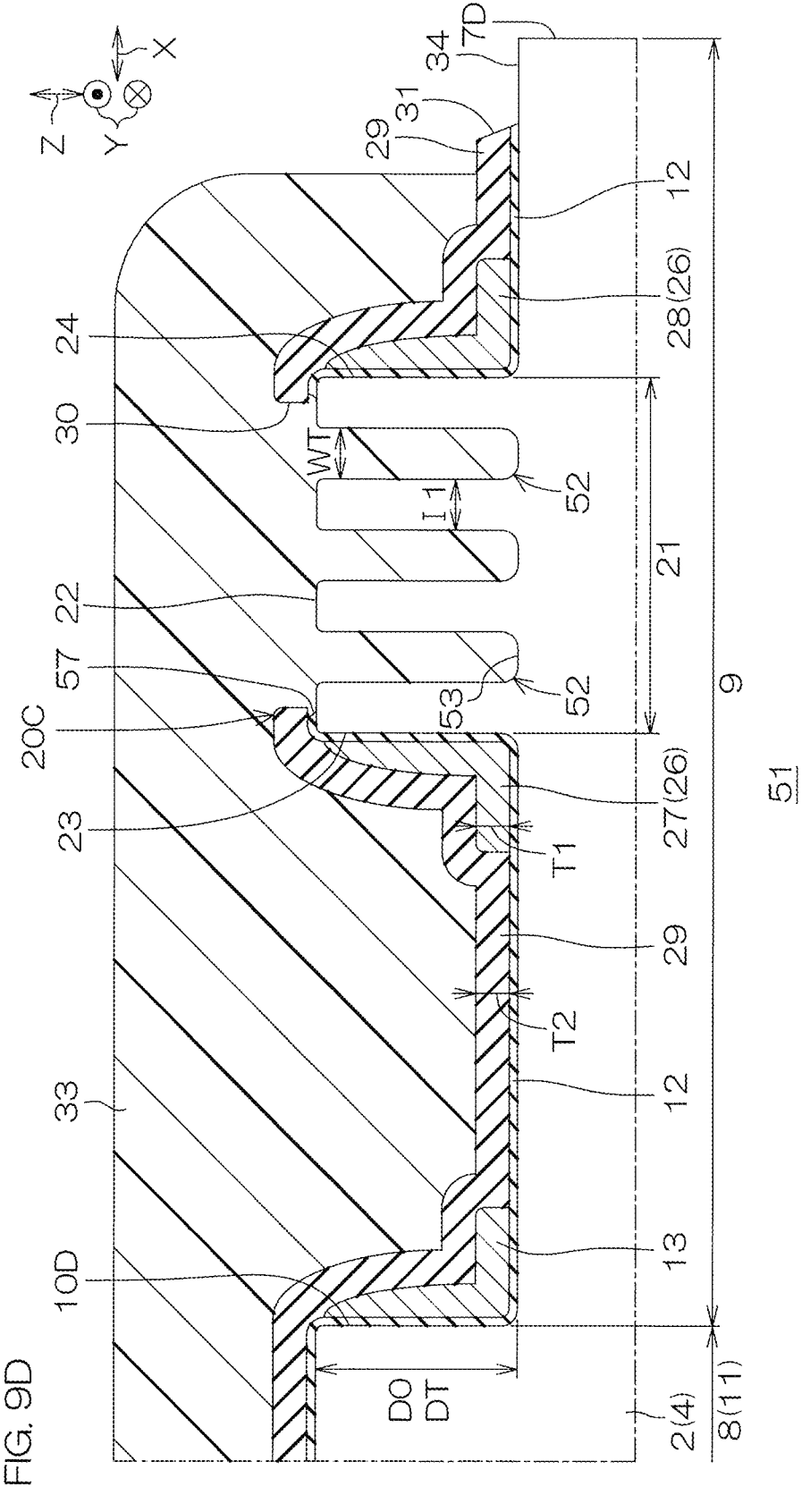

FIG. 9D is an enlarged cross-sectional view which shows the third projecting structure according to the fifth configuration example.

Figure 9E:
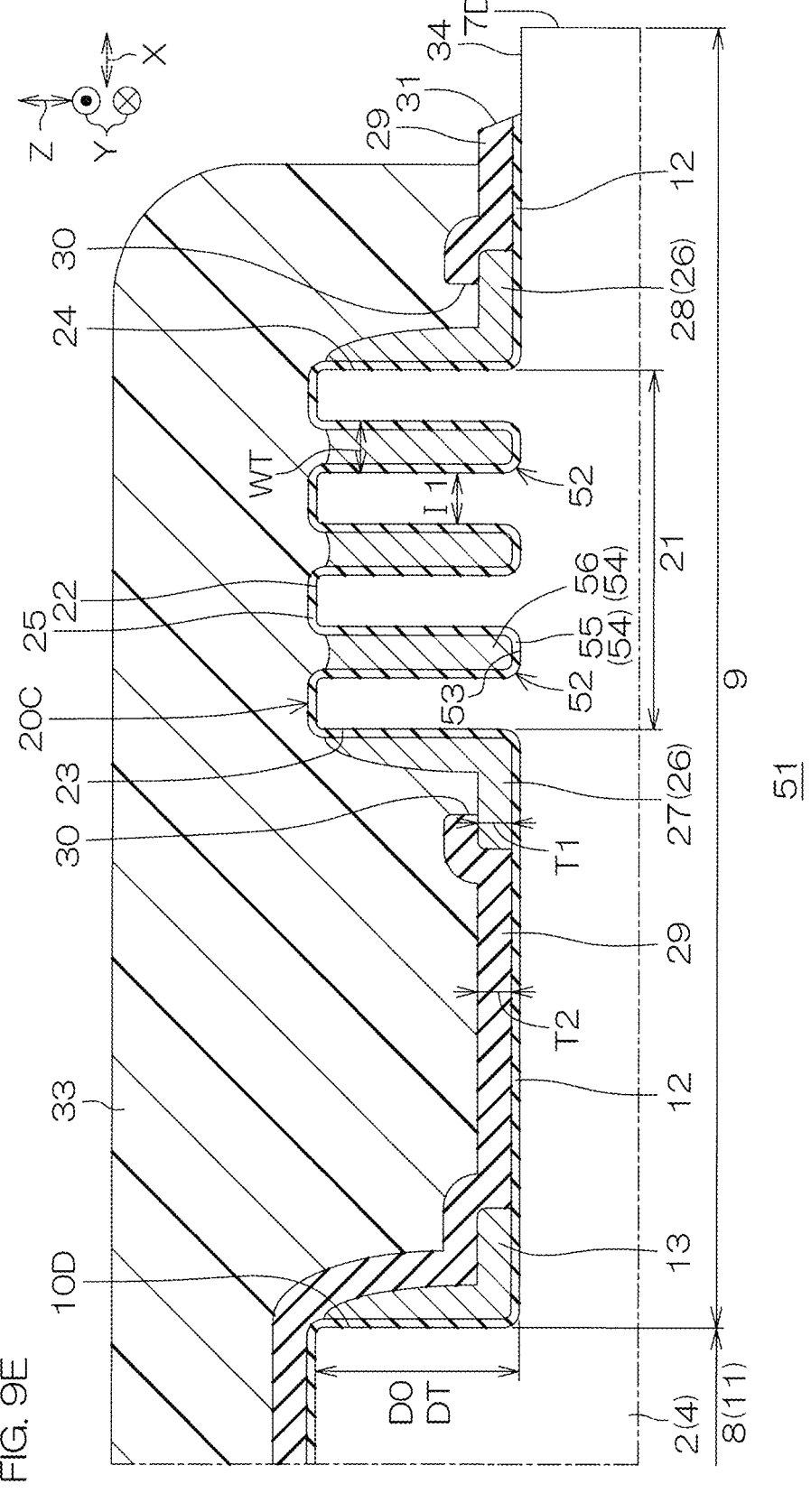

FIG. 9E is an enlarged cross-sectional view which shows the third projecting structure according to a sixth configuration example.

Figure 9F:
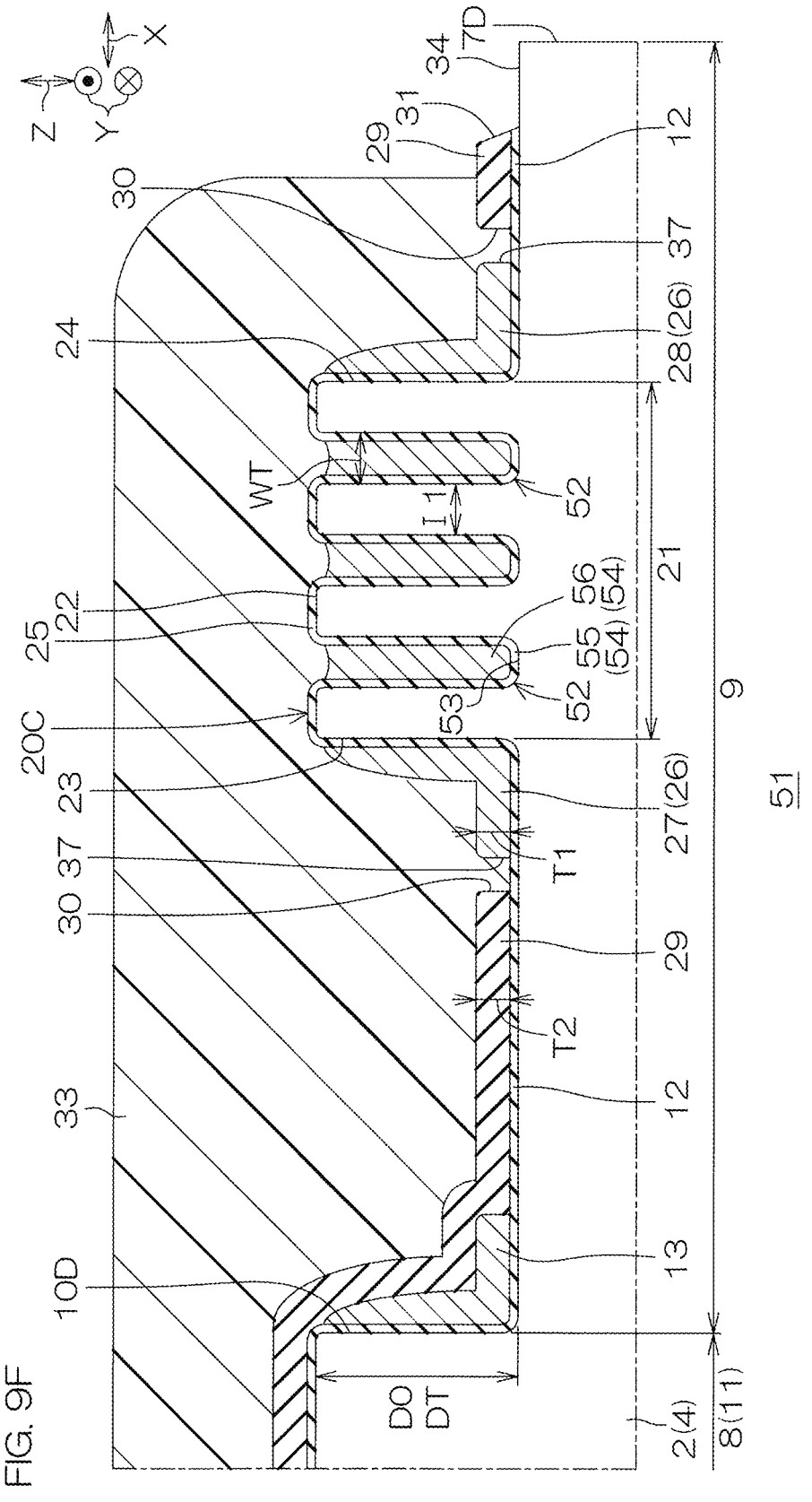

FIG. 9F is an enlarged cross-sectional view which shows the third projecting structure according to a seventh configuration example.

Figure 9G:
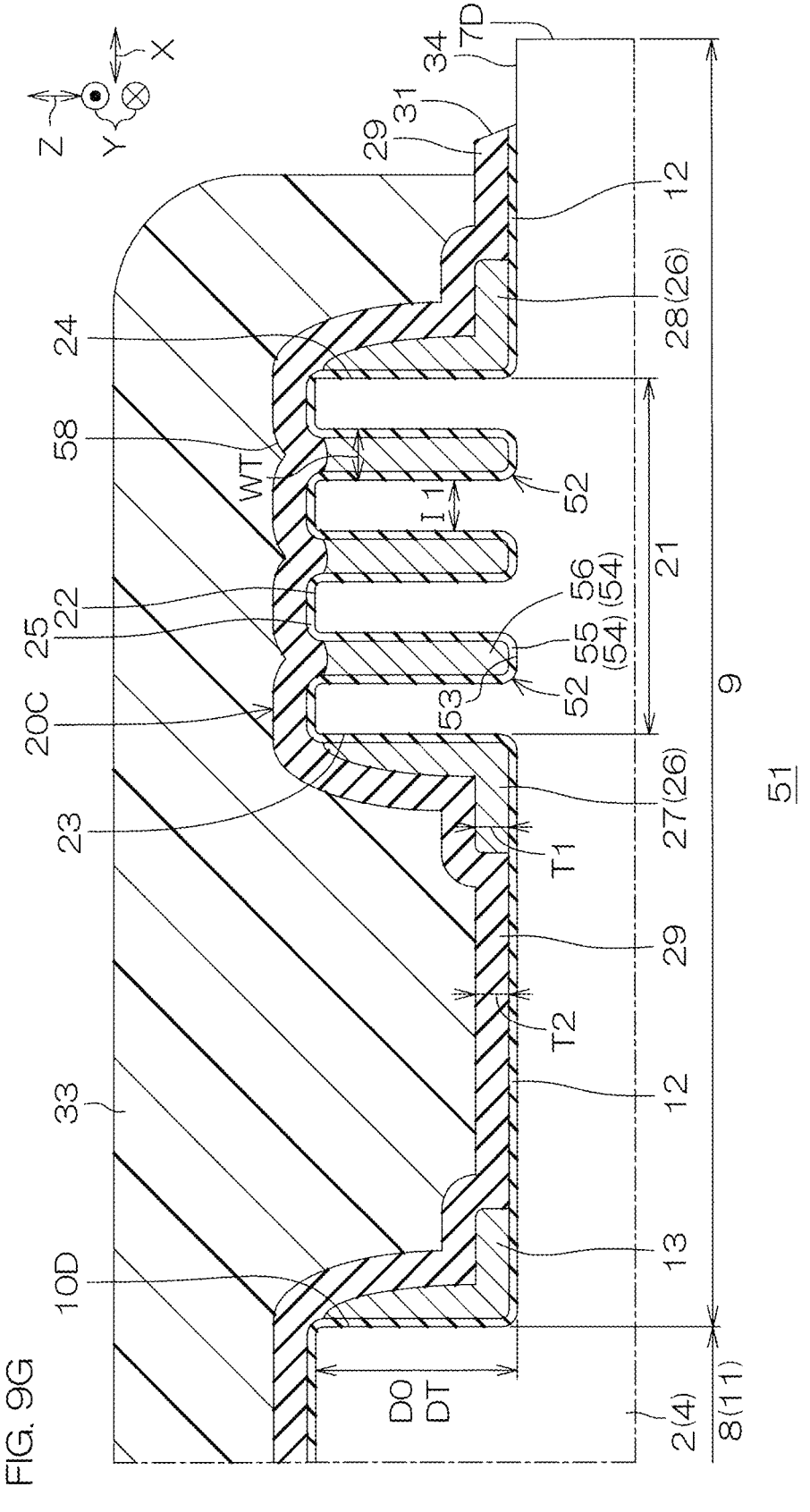

FIG. 9G is an enlarged cross-sectional view which shows the third projecting structure according to an eighth configuration example.

Figure 9H:
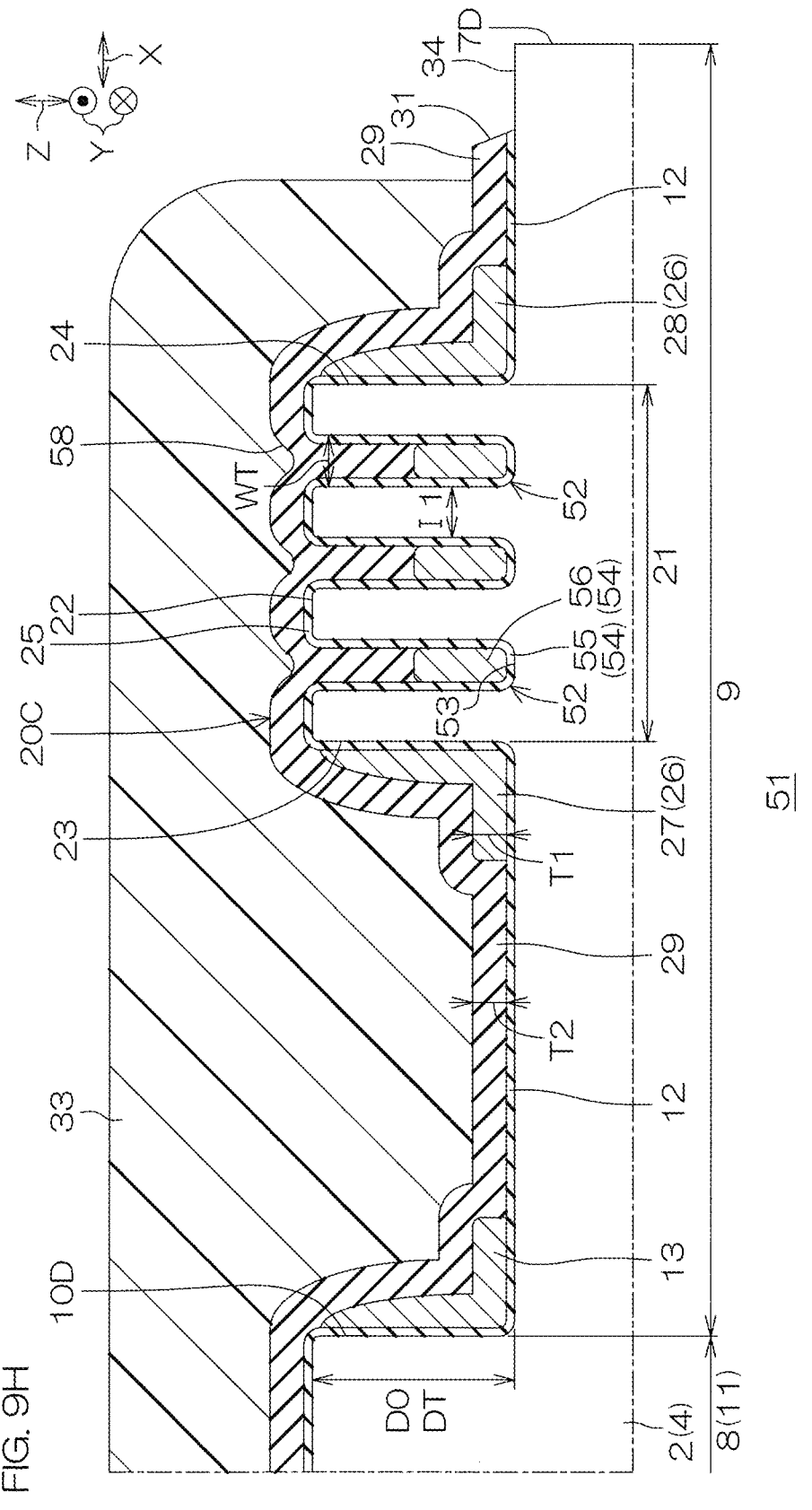

FIG. 9H is an enlarged cross-sectional view which shows the third projecting structure according to a ninth configuration example.

Figure 9I:
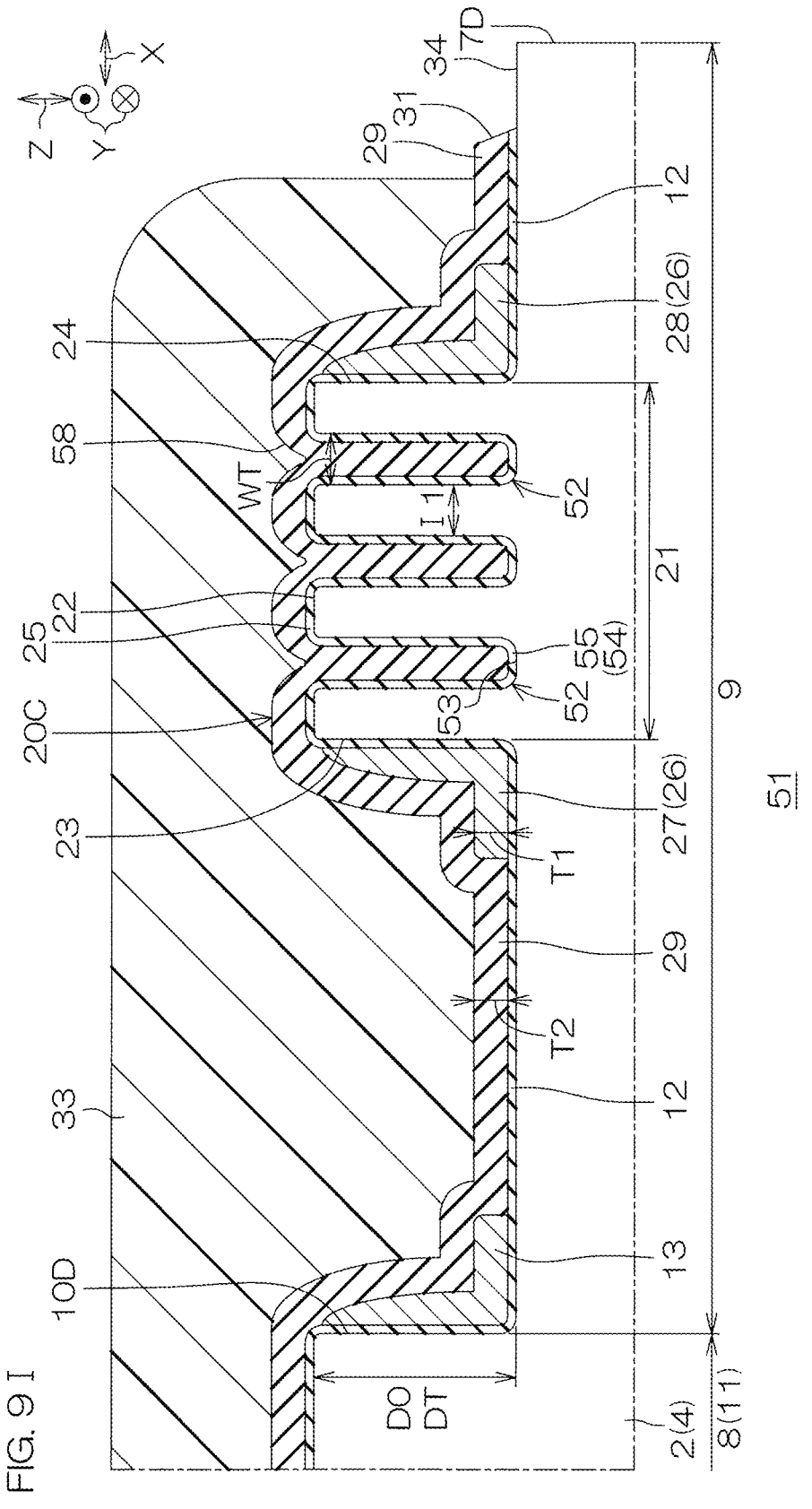

FIG. 9I is an enlarged cross-sectional view which shows the third projecting structure according to a tenth configuration example.

Figure 9J:
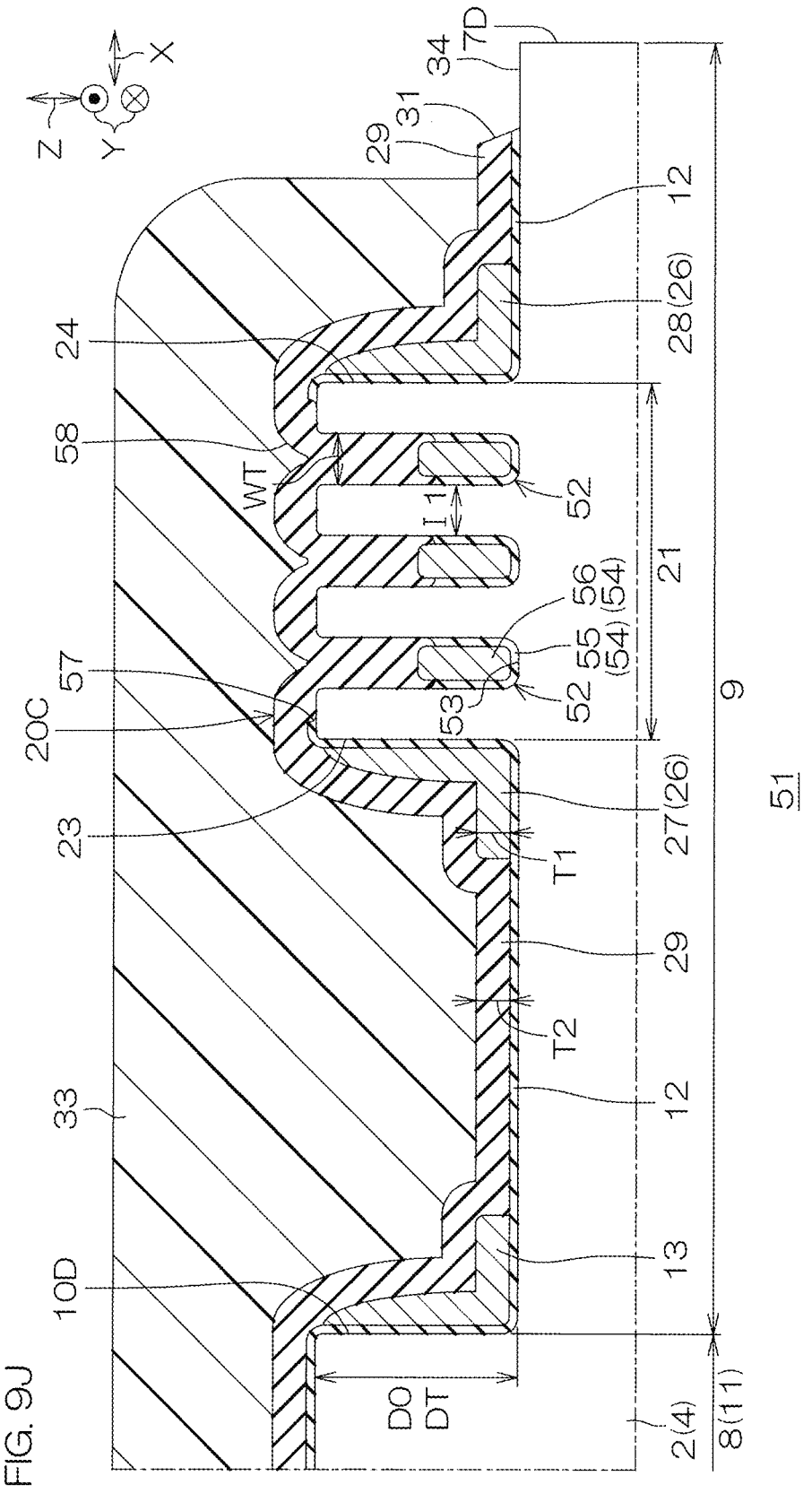

FIG. 9J is an enlarged cross-sectional view which shows the third projecting structure according to an eleventh configuration example.

Figure 9K:
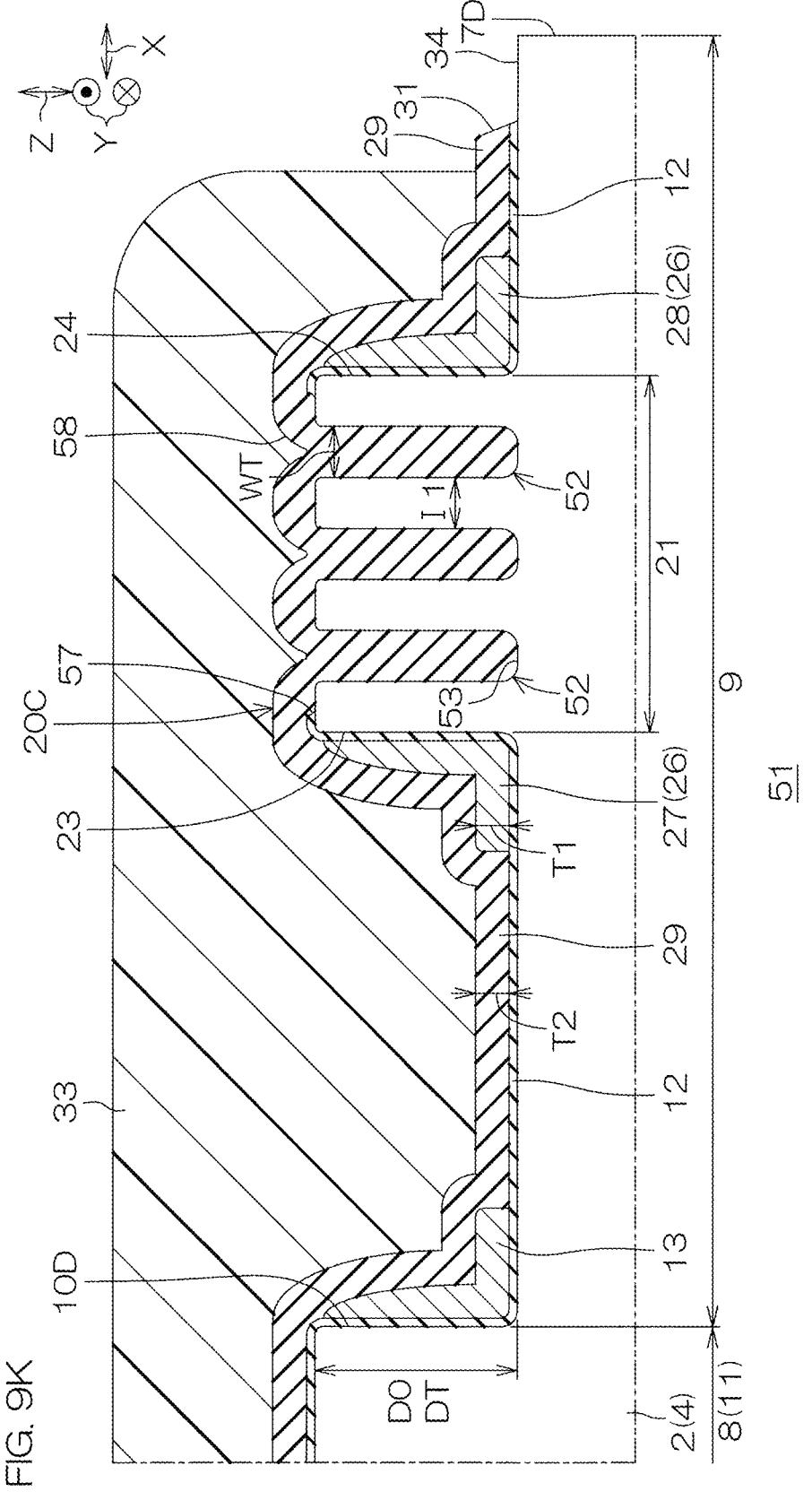

FIG. 9K is an enlarged cross-sectional view which shows the third projecting structure according to a twelfth configuration example.

Figure 10:
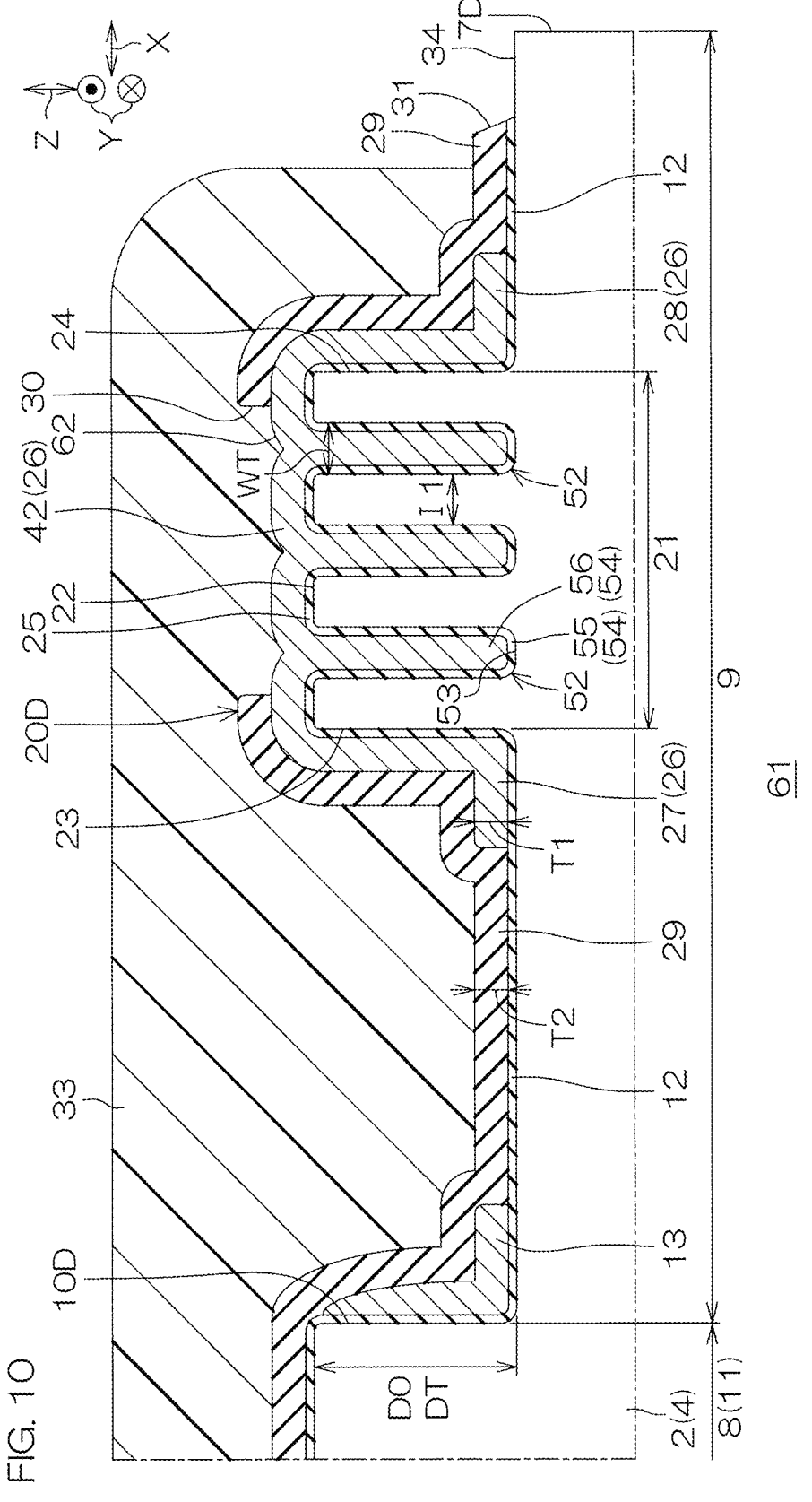

FIG. 10 corresponds to FIG. 4 and is an enlarged cross-sectional view which shows an SiC semiconductor device according to a fourth embodiment of the present invention with a fourth projecting structure according to the first configuration example.

Figure 11A:
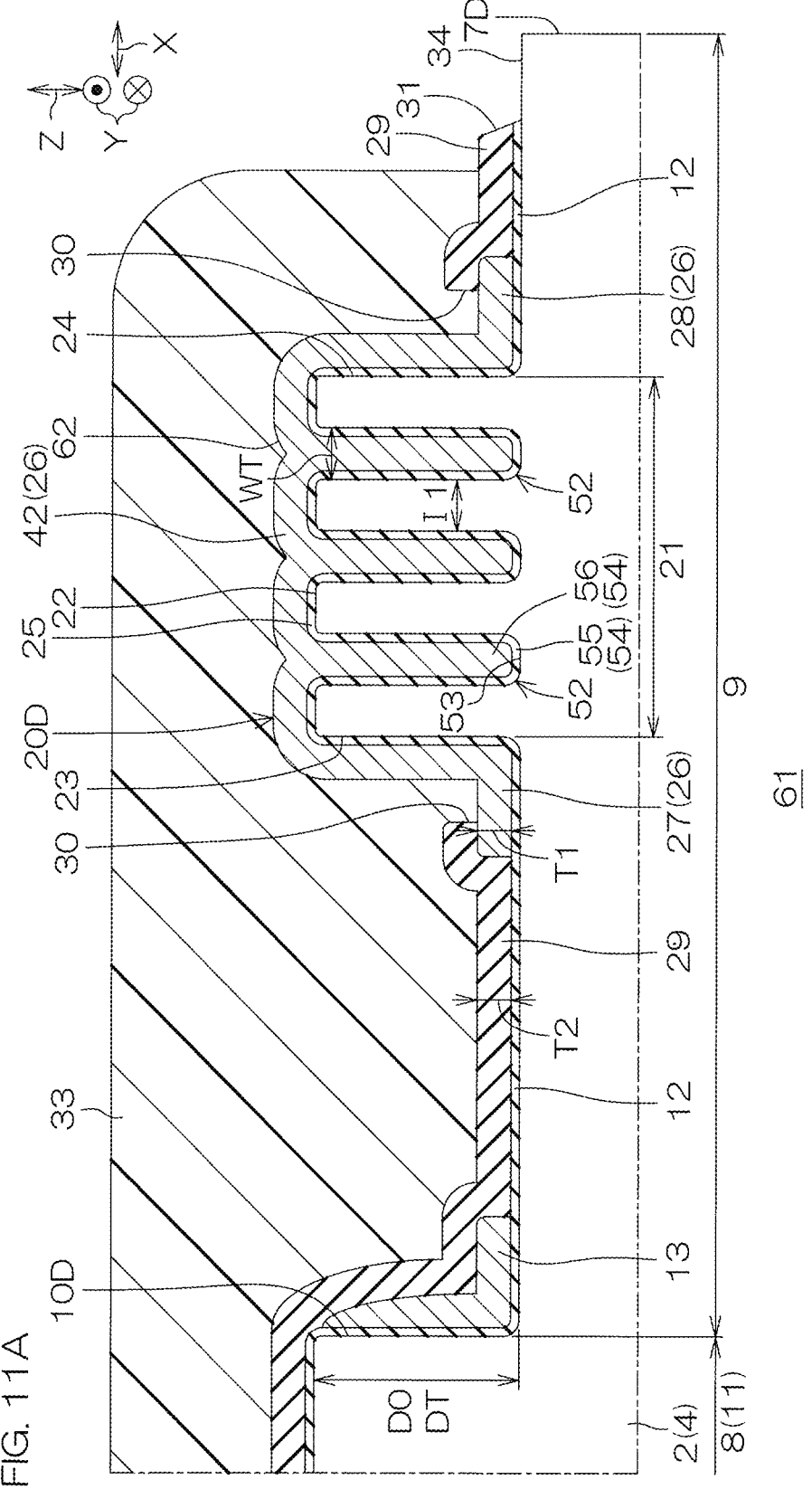

FIG. 11A is an enlarged cross-sectional view which shows the fourth projecting structure according to the second configuration example.

Figure 11B:
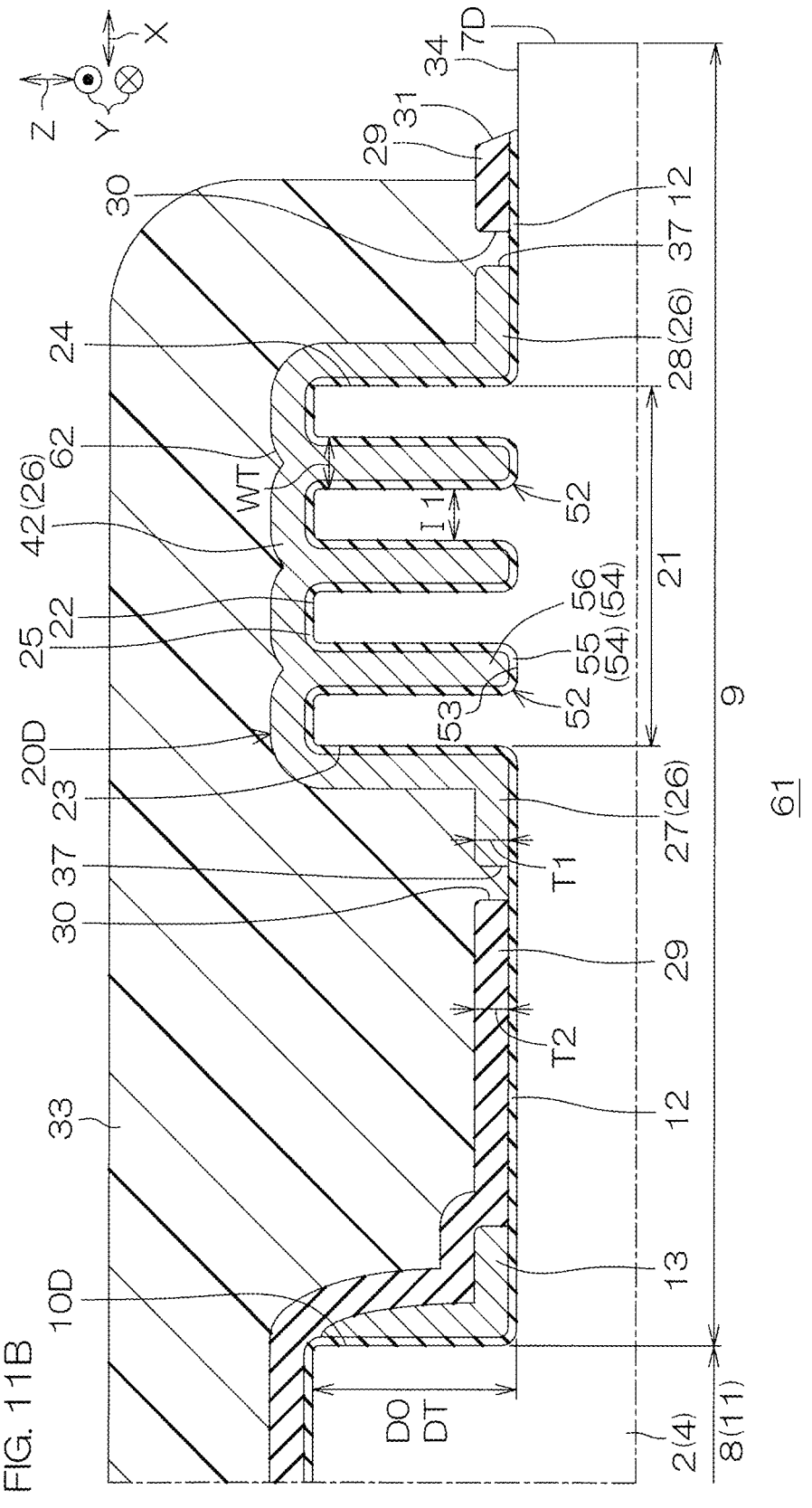

FIG. 11B is an enlarged cross-sectional view which shows the fourth projecting structure according to the third configuration example.

Figure 11C:
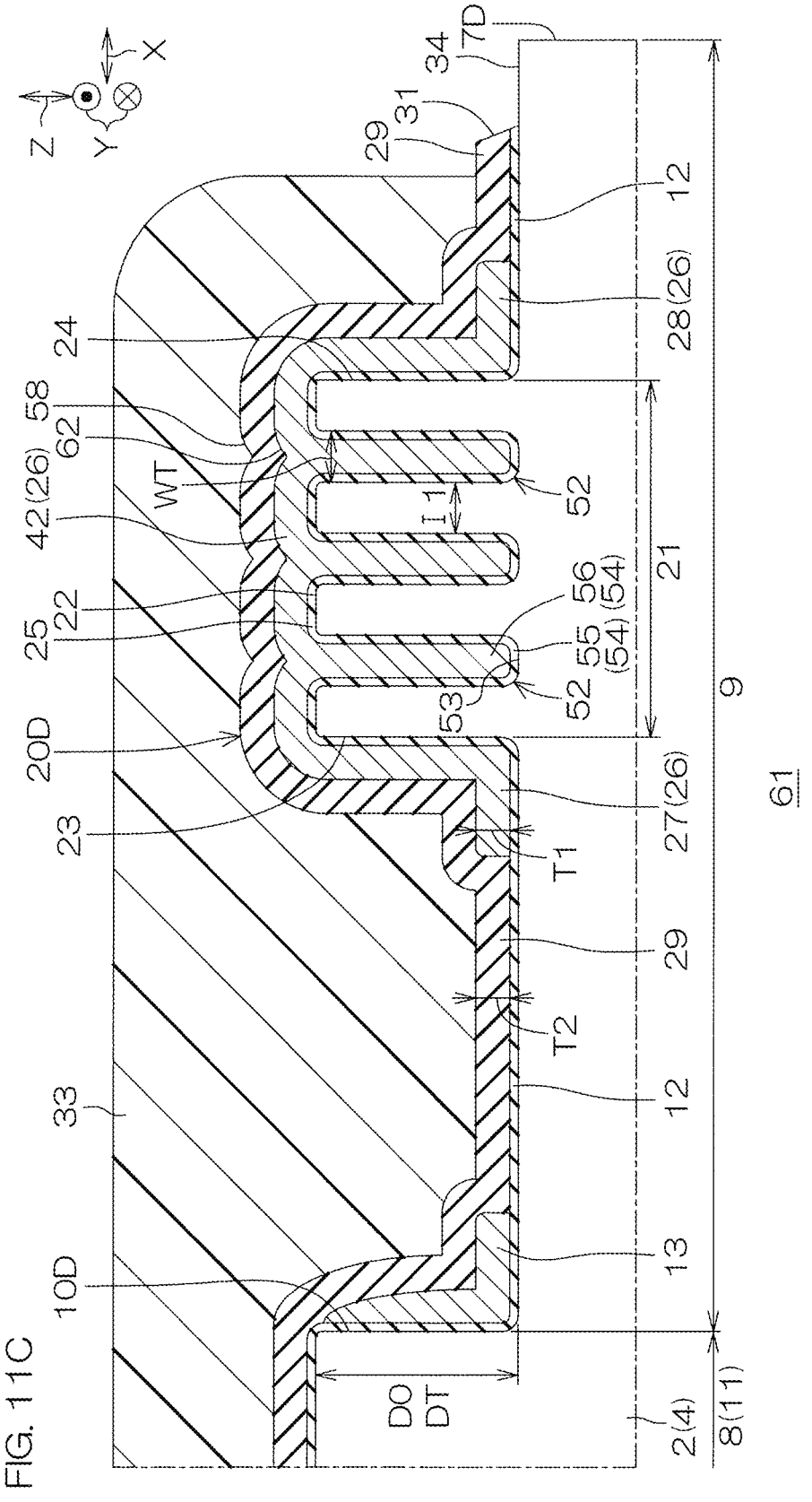

FIG. 11C is an enlarged cross-sectional view which shows the fourth projecting structure according to the fourth configuration example.

Figure 12:
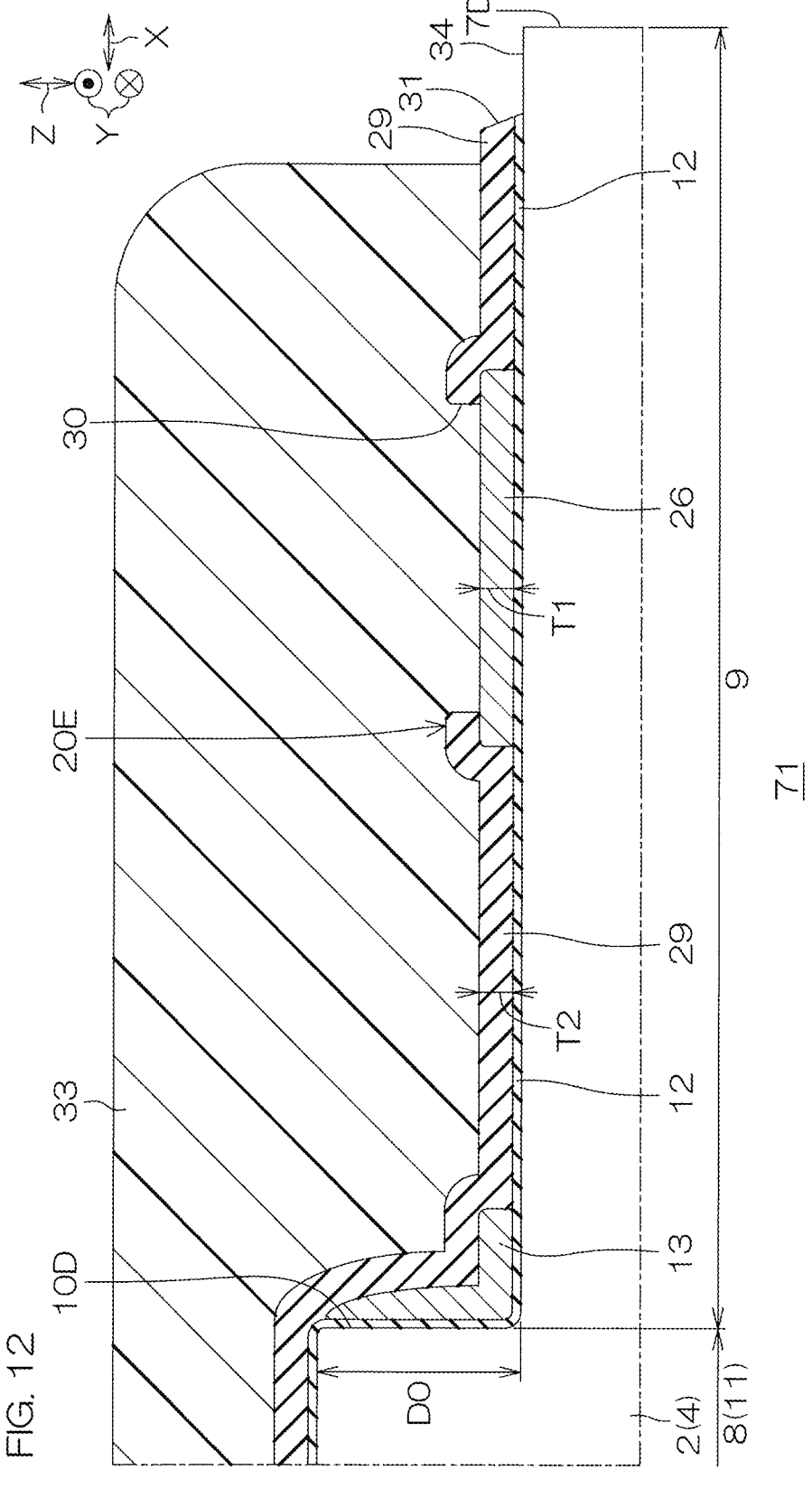

FIG. 12 corresponds to FIG. 4 and is an enlarged cross-sectional view which shows an SiC semiconductor device according to a fifth embodiment of the present invention together with a fifth projecting structure according to the first configuration example.

Figure 13A:
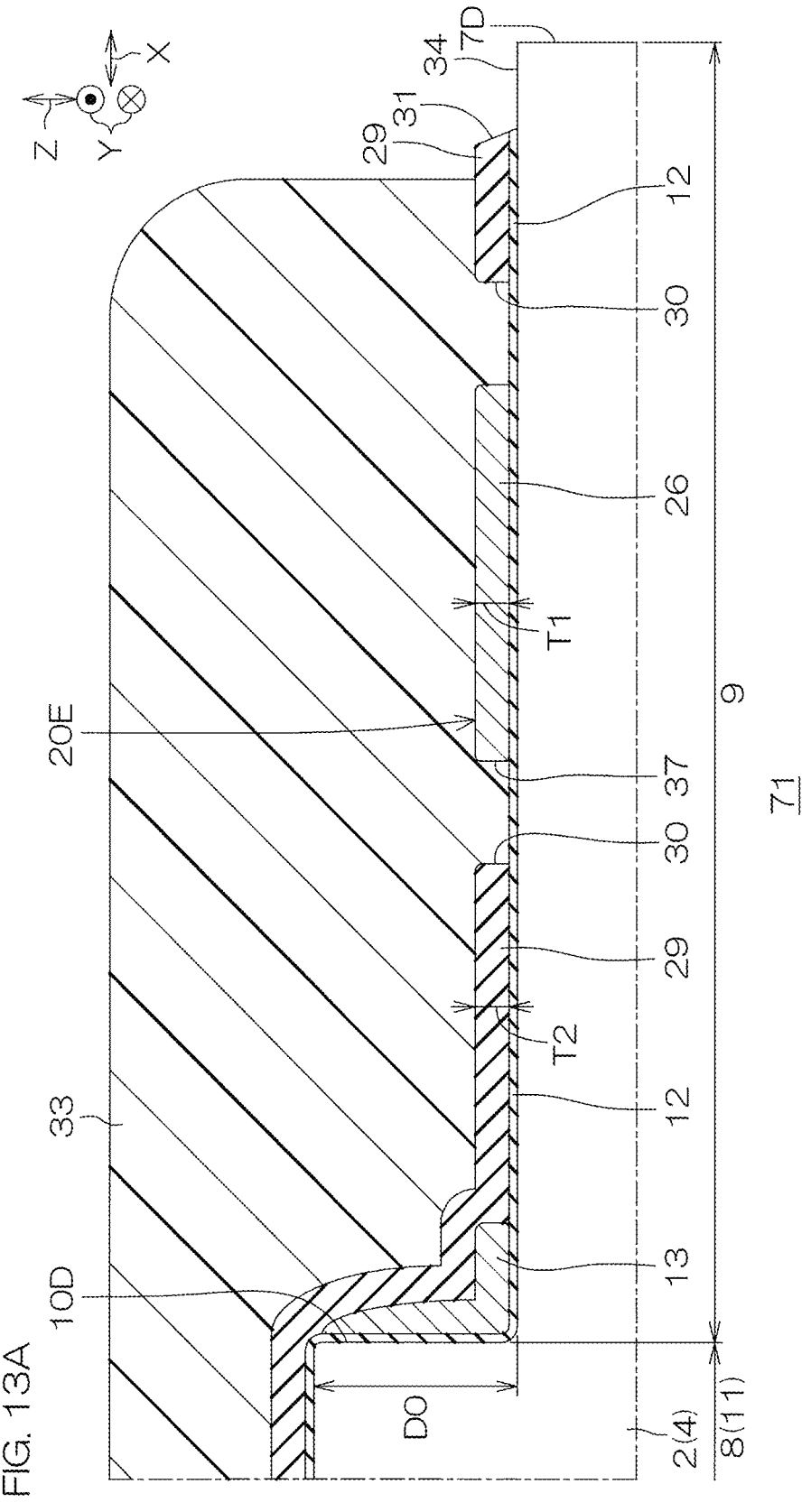

FIG. 13A is an enlarged cross-sectional view which shows the fifth projecting structure according to the second configuration example.

Figure 13B:
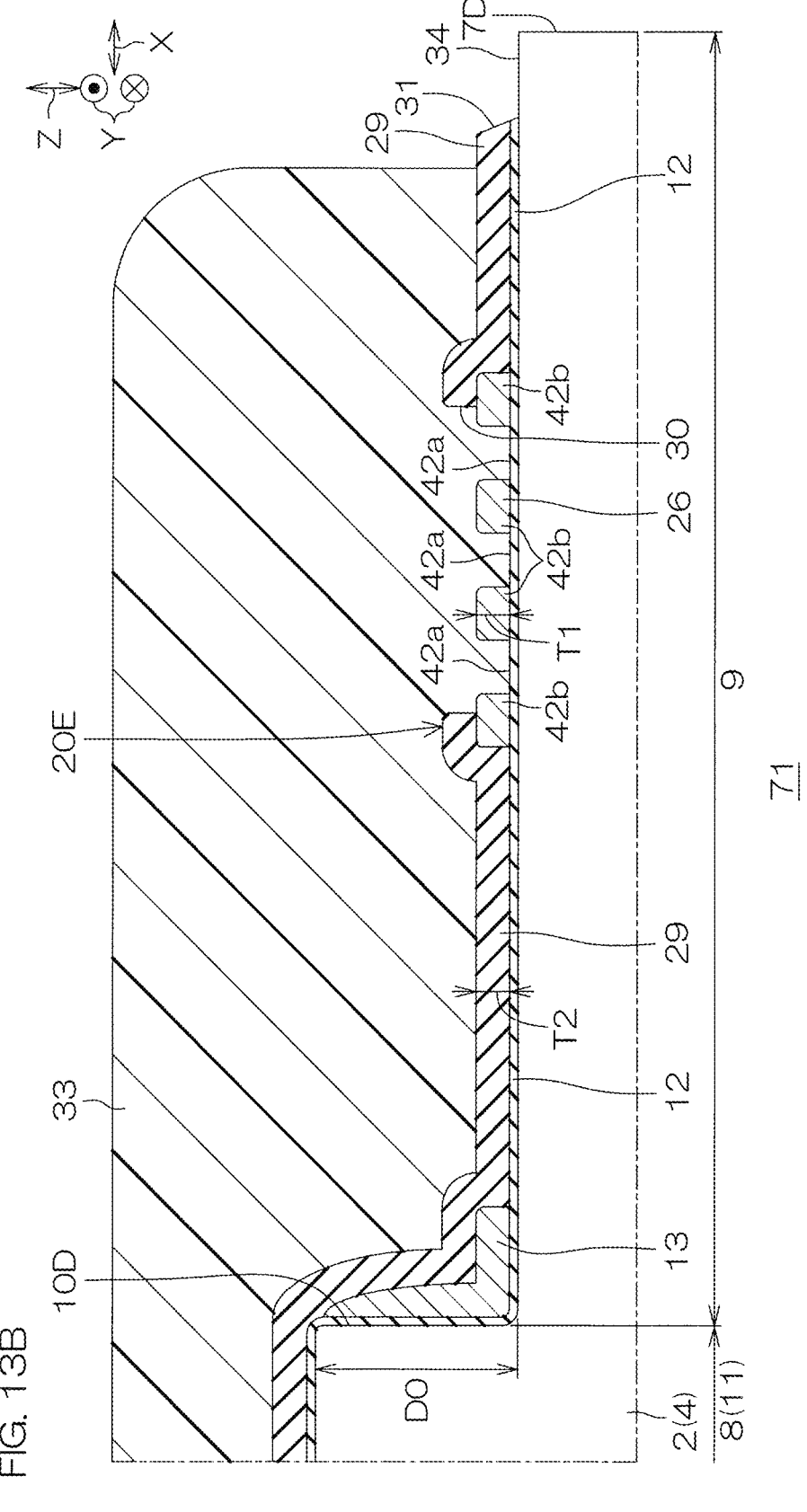

FIG. 13B is an enlarged cross-sectional view which shows the fifth projecting structure according to the third configuration example.

Figure 13C:
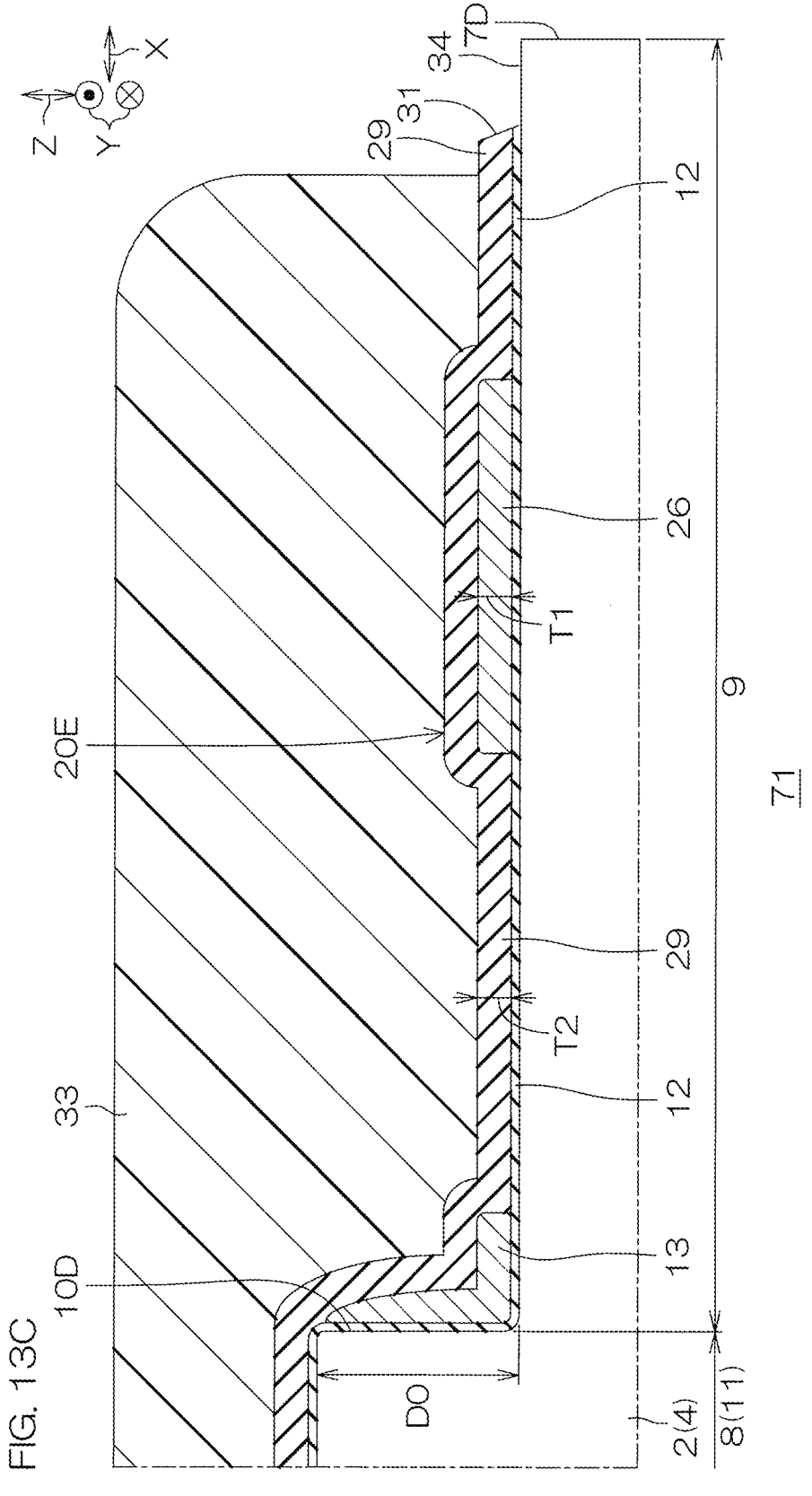

FIG. 13C is an enlarged cross-sectional view which shows the fifth projecting structure according to the fourth configuration example.

Figure 14:
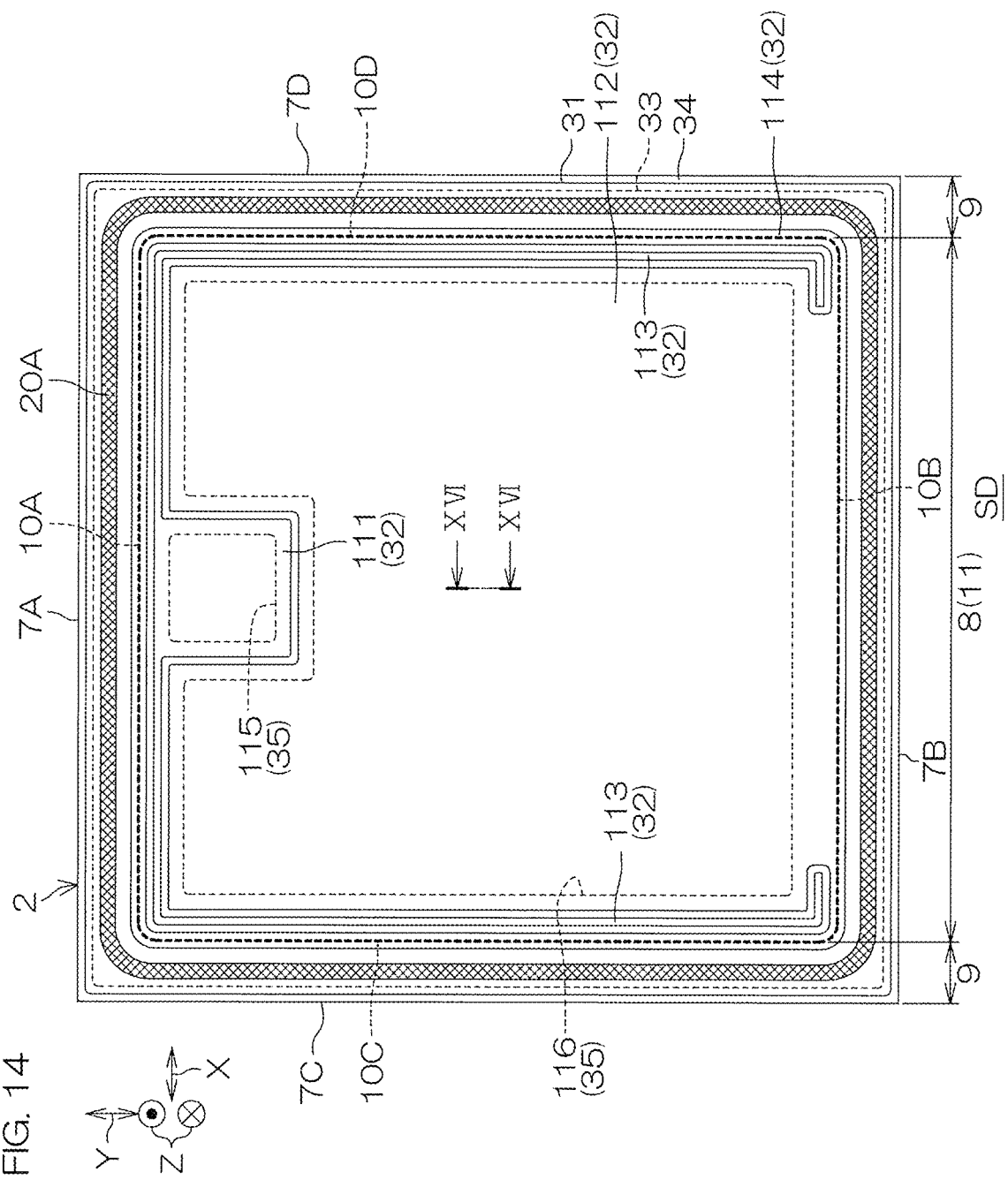

FIG. 14 is a plan view for describing a configuration example in which an SiC-MISFET is applied as a functional device in the first to fifth embodiments.

Figure 15:
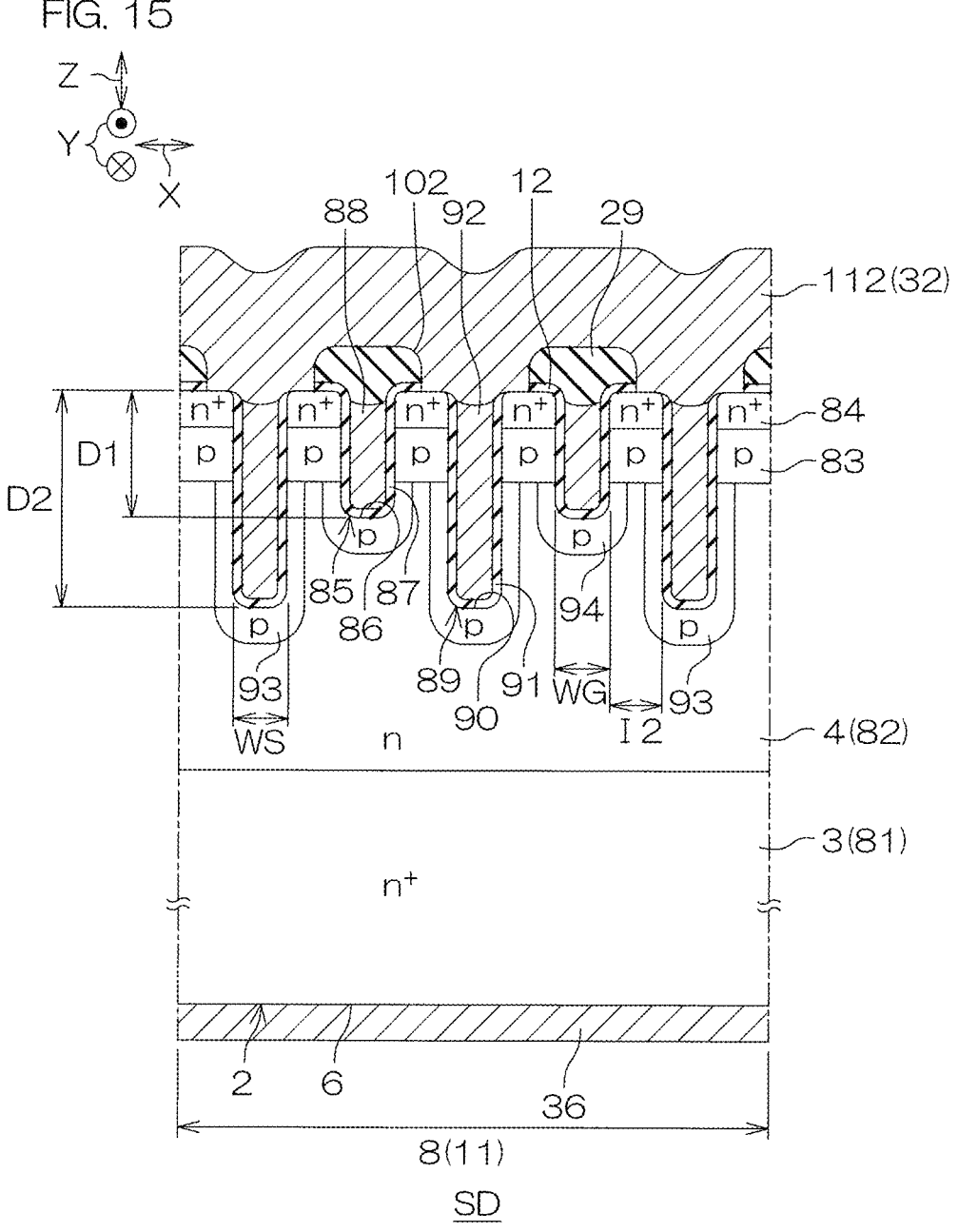

FIG. 15 is a cross-sectional view taken along line XV-XV shown in FIG. 14.

Figure 16A:
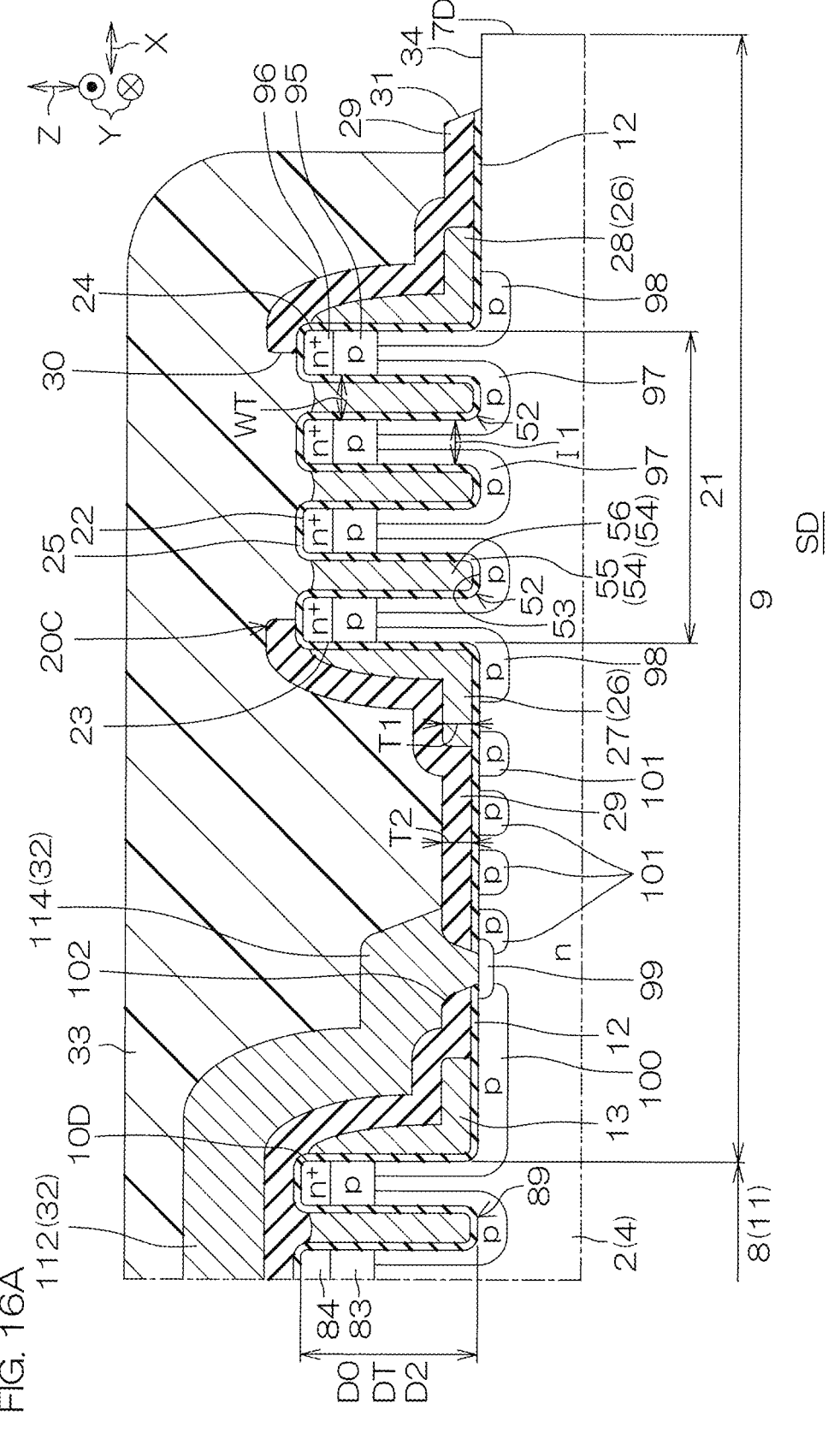

FIG. 16A is a cross-sectional view which shows a cross-sectional structure along line XVI-XVI shown in FIG. 15 with the third projecting structure.

Figure 16B:
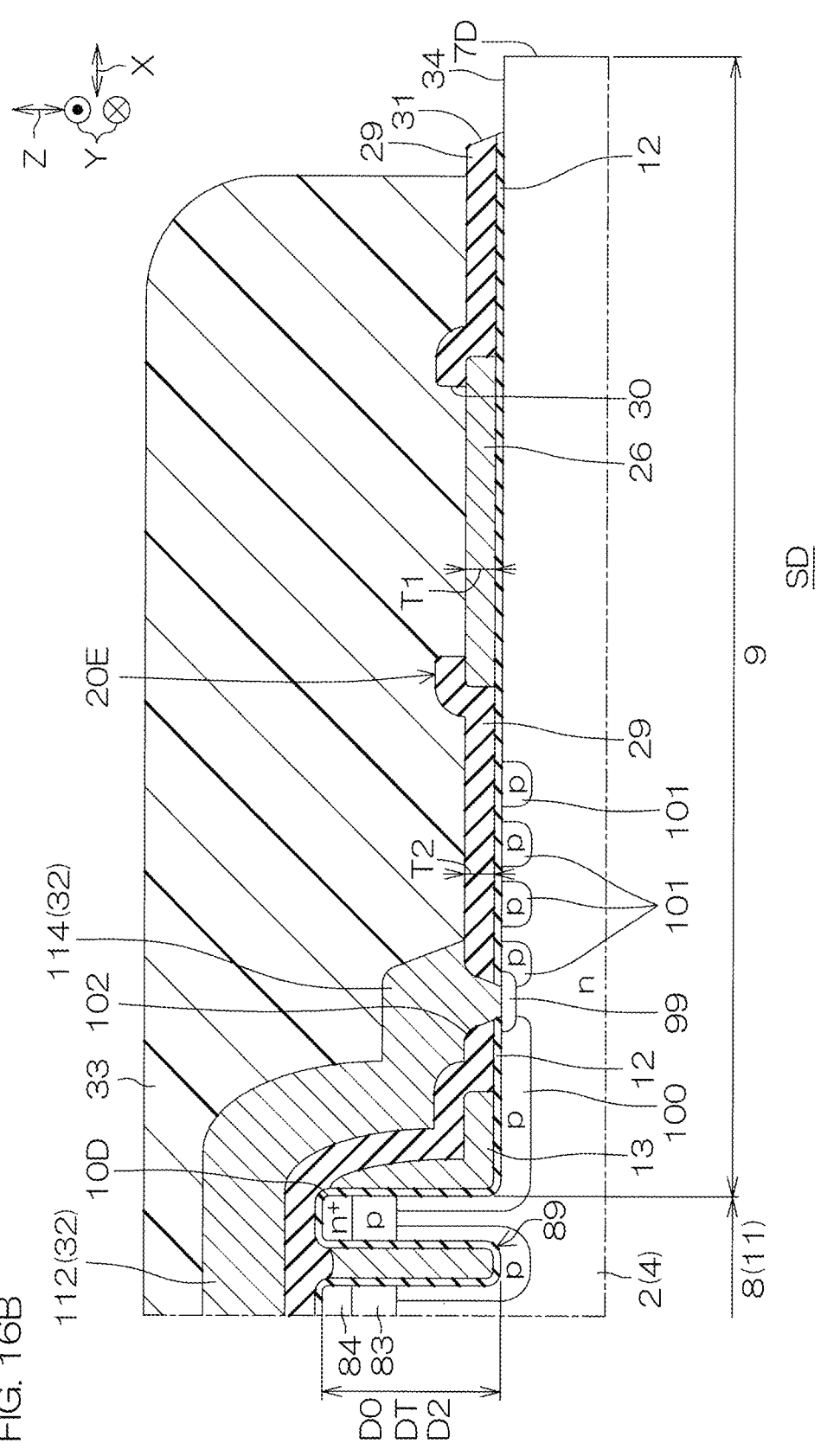

FIG. 16B is a cross-sectional view which shows a cross-sectional structure along line XVI-XVI shown in FIG. 15 with the fifth projecting structure.

DESCRIPTION OF EMBODIMENTS

Figure 1:
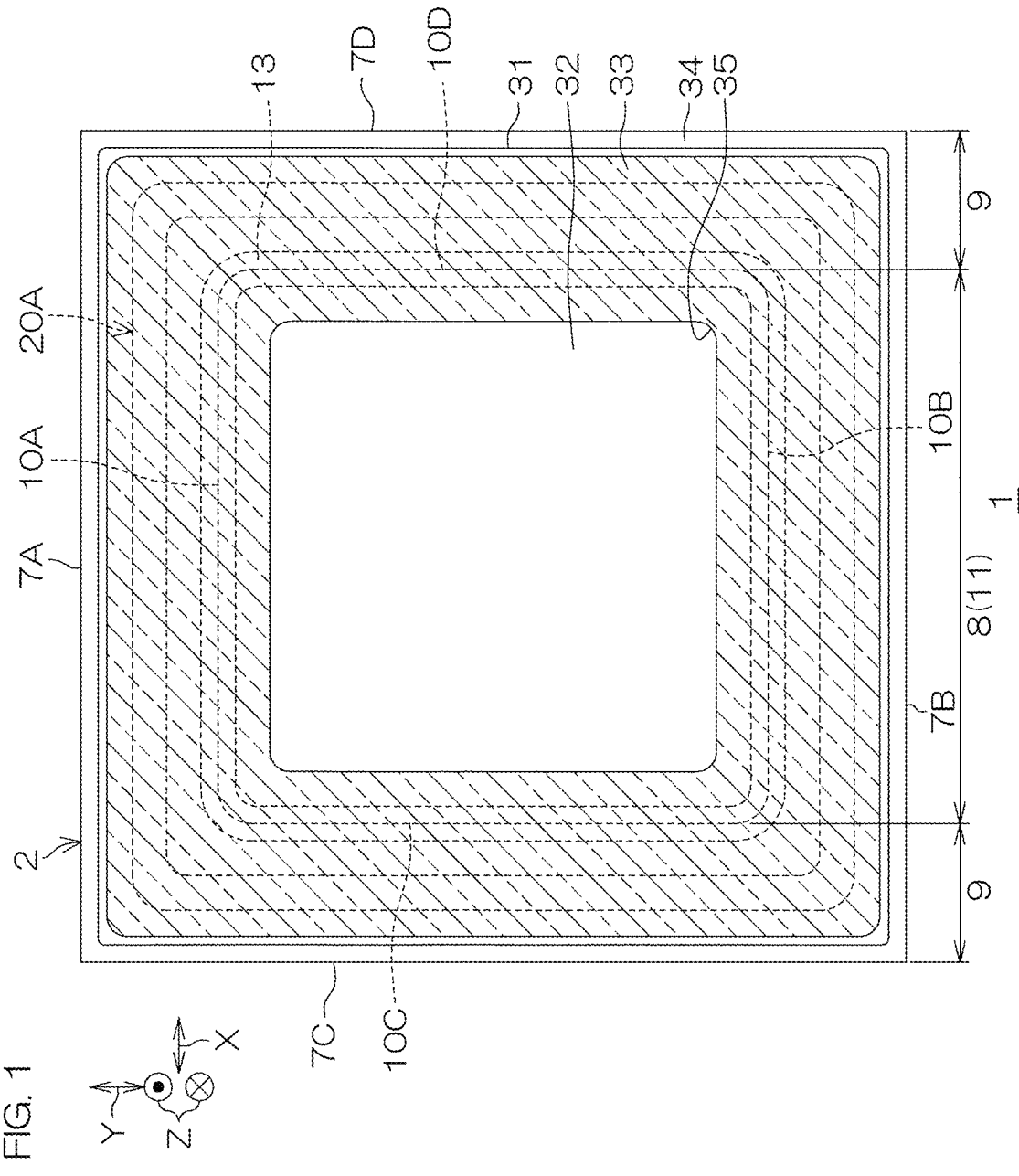
FIG. 1 is a plan view which shows an SiC semiconductor device according to a first embodiment of the present invention.

FIG. 1 is a plan view which shows an SiC semiconductor device 1 according to the first embodiment of the present invention. FIG. 2 is a plan view which shows an internal structure of the SiC semiconductor device 1. FIG. 3 is a cross-sectional view taken along line III-III shown in FIG. 2. FIG. 4 is an enlarged cross-sectional view which shows a first projecting structure 20A according to the first configuration example.

With reference to FIG. 1 to FIG. 4, in this embodiment, the SiC semiconductor device 1 is an electronic component that includes an SiC chip 2 (chip/semiconductor chip) constituted of a hexagonal SiC (silicon carbide) monocrystal. The hexagonal SiC monocrystal has a plurality of kinds of polytypes that include a 2H (Hexagonal)-SiC monocrystal, a 4H—SiC monocrystal, a 6H—SiC monocrystal, etc. In this embodiment, an example is shown in which the SiC chip 2 is constituted of a 4H—SiC monocrystal, and yet other polytypes are not excluded.

The Sic chip 2 is formed in a rectangular parallelepiped shape. In this embodiment, the SiC chip 2 has a laminated structure which includes an SiC substrate 3 (semiconductor substrate) and an SiC epitaxial layer 4 (epitaxial layer). The SiC epitaxial layer 4 has an impurity concentration different from an impurity concentration of the SiC substrate 3. Preferably, the SiC epitaxial layer 4 has an impurity concentration less than the impurity concentration of the SiC substrate 3.

A thickness of the SiC substrate 3 may be not less than 5 μm and not more than 300 μm. The thickness of the SiC substrate 3 is preferably not less than 50 μm and not more than 250 μm. The SiC epitaxial layer 4 preferably has a thickness which is less than the thickness of the SiC substrate 3. The thickness of the SiC epitaxial layer 4 may be not less than 1 μm and not more than 50 μm. The thickness of the SiC epitaxial layer 4 is preferably not less than 5 μm and not more than 20 μm.

The SiC chip 2 has a first main surface 5 on one side and a second main surface 6 on the other side as well as first to fourth side surfaces 7A to 7D which connect the first main surface 5 and the second main surface 6. The first main surface 5 is formed by the SiC epitaxial layer 4, the second main surface 6 is formed by the SiC substrate 3, and the first to fourth side surfaces 7A to 7D are formed by the SiC substrate 3 and the SiC epitaxial layer 4. The first main surface 5 is a device surface in which a functional device is formed, and the second main surface 6 is a non-device surface in which a functional device is not formed.

The first main surface 5 and the second main surface 6 are formed in a quadrilateral shape in plan view as viewed in a normal direction Z thereto (hereinafter, referred to simply as "plan view"). The first main surface 5 and the second main surface 6 may be formed in a square shape or a rectangular shape in plan view. The first main surface 5 and the second main surface 6 are arranged along c-planes of the SiC monocrystal. Preferably, the first main surface 5 is formed by a silicon plane of the SiC monocrystal and the second main surface 6 is formed by a carbon plane of the SiC monocrystal.

The first main surface 5 and the second main surface 6 may have an off angle which is inclined in a predetermined off direction at a predetermined angle with respect to the c-plane. The off direction is preferably an a-axis direction ([11-20] direction) of the SiC monocrystal. The off angle may be exceeding 0° and not more than 10°. The off angle is preferably not more than 5°. The off angle is particularly preferably not less than 2° and not more than 4.5°.

The first side surface 7A and the second side surface 7B extend in a first direction X along the first main surface 5 and face each other in a second direction Y intersecting the first direction X (specifically, orthogonal thereto). The third side surface 7C and the fourth side surface 7D extend in the second direction Y and face each other in the first direction X. In this embodiment, the first direction X is an m-axis direction ([1-100] direction) of the SiC monocrystal, and the second direction Y is the a-axis direction ([11-20] direction) of the SiC monocrystal. That is, the first side surface 7A and the second side surface 7B are formed of the a-planes of the SiC monocrystal, and the third side surface 7C and the fourth side surface 7D are formed of the m-planes of the SiC monocrystal. The first to fourth side surfaces 7A to 7D respectively form a peripheral edge of the first main surface 5 and a peripheral edge of the second main surface 6.

The first main surface 5 has an active surface 8, an outside surface 9, and first to fourth connecting surfaces 10A to 10D. The active surface 8, the outside surface 9 and the first to fourth connecting surfaces 10A to 10D demarcate an active mesa 11 in the first main surface 5. The active surface 8 may be referred to as a "first surface," the outside surface 9 may be referred to as a "second surface" or a "peripheral surface," and the active mesa 11 may be referred to as a "mesa."

The active surface 8 is formed at an interval inward from the peripheral edge of the first main surface 5 (first to fourth side surfaces 7A to 7D). The active surface 8 has a flat surface extending in the first direction X and in the second direction Y and exposes the SiC epitaxial layer 4. That is, the active surface 8 has an off angle corresponding to the first main surface 5. The active surface 8 is formed in a quadrilateral shape having four sides parallel to the peripheral edge of the first main surface 5 in plan view. In this embodiment, a corner portion of the active surface 8 is formed in a curved shape toward the peripheral edge of the first main surface 5. Therefore, in this embodiment, the active surface 8 is formed in a quadrilateral shape with four corners thereof are curved in plan view.

The outside surface 9 is positioned outside the active surface 8 and depressed from the active surface 8 toward a thickness direction of the SiC chip 2 (toward the second main surface 6 side). Specifically, the outside surface 9 is depressed at a depth that is less than the thickness of the SiC epitaxial layer 4. That is, the outside surface 9 is located at the second main surface 6 side with respect to the active surface 8 and exposes the SiC epitaxial layer 4. The outside surface 9 is formed in a band shape extending along the active surface 8 in plan view. Specifically, the outside surface 9 is formed in an annular shape (specifically, in a quadrilateral annular shape) that surrounds the active surface 8 in plan view.

The outside surface 9 has a flat surface extending in the first direction X and in the second direction Y and is formed substantially parallel to the active surface 8. That is, the outside surface 9 has an off angle corresponding to the first main surface 5. The outside surface 9 is in communication with the first to fourth side surfaces 7A to 7D. The outside surface 9 is depressed from the active surface 8 at a depression depth DO in the thickness direction of the SiC chip 2 (on the second main surface 6 side). The depression depth DO may be not less than 0.1 μm and not more than 10 μm. The depression depth DO is preferably not more than 5 μm. The depression depth DO is particularly preferably not more than 2.5 μm.

The first to fourth connecting surfaces 10A to 10D extend in the normal direction Z and connect the active surface 8 and the outside surface 9. The first connecting surface 10A is located at the first side surface 7A side, the second connecting surface 10B is located at the second side surface 7B side, the third connecting surface 100 is located at the third side surface 7C side, and the fourth connecting surface 10D is located at the fourth side surface 7D side. The first connecting surface 10A and the second connecting surface 10B extend in the first direction X and face each other in the second direction Y. The third connecting surface 100 and the fourth connecting surface 10D extend in the second direction Y and face each other in the first direction X. The first connecting surface 10A and the second connecting surface 10B are arranged along the a-planes of the SiC monocrystal, and the third connecting surface 100 and the fourth connecting surface 10D are arranged along the m-planes of the SiC monocrystal. The first to fourth connecting surfaces 10A to 10D expose the SiC epitaxial layer 4.

The first to fourth connecting surfaces 10A to 10D may be formed substantially vertical to the active surface 8 and the outside surface 9. In this case, the active mesa 11 of a quadrilateral prism shape is demarcated in the first main surface 5. The first to fourth connecting surfaces 10A to 10D may be inclined obliquely downward from the active surface 8 toward the outside surface 9. In this case, the active mesa 11 of a truncated quadrilateral pyramid shape is demarcated in the first main surface 5.

An inclination angle of each of the first to fourth connecting surfaces 10A to 10D may be not less than 90° and not more than 135°. The inclination angle of each of the first to fourth connecting surfaces 10A to 10D is an angle formed between each of the first to fourth connecting surfaces 10A to 10D and the active surface 8 in the SiC chip 2. The inclination angle of each of the first to fourth connecting surfaces 10A to 10D are preferably not more than 95°.

As described above, the SiC semiconductor device 1 includes the active mesa 11 which is formed in the SiC epitaxial layer 4 in the first main surface 5. The active mesa 11 is formed only in the SiC epitaxial layer 4 and not formed in the SiC substrate 3.

Although not illustrated specifically, the SiC semiconductor device 1 incudes a functional device which is formed in the active surface 8 side. In FIG. 3, a position at which the functional device is formed is indicated by cross hatching. The functional device is formed by using an inside and an outside of the SiC chip 2 at the active surface 8 side. The functional device may include at least one of a semiconductor switching device, a semiconductor rectifying device and a passive device.

The semiconductor switching device may include at least one of a MISFET (Metal Insulator Semiconductor Field Effect Transistor), a BJT (Bipolar Junction Transistor), an IGBT (Insulated Gate Bipolar Junction Transistor) and a JFET (Junction Field Effect Transistor). The semiconductor rectifying device may include at least one of a pn junction diode, a pin junction diode, a Zener diode, an SBD (Schottky Barrier Diode) and an FRD (Fast Recovery Diode). The passive device may include at least one of a resistor, a capacitor, an inductor and a fuse.

The functional device may include a circuit network in which at least two of the semiconductor switching device, the semiconductor rectifying device and the passive device are combined. The circuit network may be an integrated circuit such as an LSI (Large Scale Integration), an SSI (Small Scale Integration), an MSI (Medium Scale Integration), a VLSI (Very Large Scale Integration), a ULSI (Ultra-Very Large Scale Integration), etc. The functional device formed in the SiC chip 2 (active surface 8) is typically one or both of the MISFET and the SBD.

The SiC semiconductor device 1 includes a main surface insulating film 12 which covers the first main surface 5. The main surface insulating film 12 includes at least one of a silicon oxide film, a silicon nitride film, and a silicon oxynitride film. Preferably, the main surface insulating film 12 has a single layer structure which is constituted of a silicon oxide film. Particularly preferably, the main surface insulating film 12 includes a silicon oxide film which is constituted of an oxide of the SiC chip 2. A thickness of the main surface insulating film 12 may be not less than 10 nm and not more than 500 nm.

The main surface insulating film 12 covers the active surface 8, the outside surface 9 and the first to fourth connecting surfaces 10A to 10D as a film shape. Specifically, the main surface insulating film 12 has one surface on the SiC chip 2 side and another surface on the opposite side of the one surface. The main surface insulating film 12 is formed as a film shape such that both of one surface and another surface extend along the active surface 8, the outside surface 9 and the first to fourth connecting surfaces 10A to 10D. The main surface insulating film 12 is formed at an interval inward from a peripheral edge of the outside surface 9 (first to fourth side surfaces 7A to 7D) and has a peripheral end wall which exposes a peripheral edge portion of the outside surface 9 (SiC chip 2).

The SiC semiconductor device 1 includes a side wall structure 13 which is formed on the main surface insulating film 12 such as to cover at least one (in this embodiment, all) of the first to fourth connecting surfaces 10A to 10D. The side wall structure 13 preferably does not have a nitride film (nitride) at least on an outer surface. Examples of the nitride film (nitride) include a silicon nitride film (silicon nitride), a silicon oxynitride film (silicon oxynitride), etc.

The side wall structure 13 is preferably constituted of an inorganic substance other than a nitride. The side wall structure 13 is particularly preferably constituted of a polysilicon film. The side wall structure 13 may be constituted of a conductive polysilicon film which includes an impurity or may be constituted of an impurity non-doped polysilicon film which does not include an impurity. The side wall structure 13 may be constituted of an n-type polysilicon film which is doped with an n-type impurity and/or a p-type polysilicon film which is doped with a p-type impurity.

The side wall structure 13 is formed in a band shape extending along the first to fourth connecting surfaces 10A to 10D in plan view. In this embodiment, the side wall structure 13 is formed in an annular shape (specifically, in a quadrilateral annular shape) which surrounds the active surface 8 in plan view and covers the first to fourth connecting surfaces 10A to 10D. A portion of the side wall structure 13 which covers four corners of the active surface 8 (corner portions of the first to fourth connecting surfaces 10A to 10D) is formed in a curved shape toward the peripheral edge of the first main surface 5. In this embodiment, the side wall structure 13 is formed in a quadrilateral annular shape with the four corners thereof curved in plan view.

The side wall structure 13 includes a portion which extends as a film shape along the outside surface 9 and a portion which extends as a film shape along the first to fourth connecting surfaces 10A to 10D. The portion of the side wall structure 13 which extends as a film shape along the outside surface 9 covers the outside surface 9 in a region on the outside surface 9 side with respect to the active surface 8. The portion of the side wall structure 13 which extends as a film shape along the outside surface 9 may have a thickness which is less than a thickness of the active mesa 11 (depression depth DO). The portion of the side wall structure 13 which extends as a film shape along the first to fourth connecting surfaces 10A to 10D may have an outer surface which is inclined obliquely downward toward the outside surface 9 from the active surface 8.

An outer surface of the side wall structure 13 may be formed in a curved shape which projects in a direction away from the first to fourth connecting surfaces 10A to 10D. The outer surface of the side wall structure 13 may be formed in a curved shape which is depressed toward the first to fourth connecting surface 10A to 10D sides. The side wall structure 13 may have an overlap portion which rides on an edge of the active surface 8 from at least one of the first to fourth connecting surfaces 10A to 10D. In this case, the overlap portion faces the peripheral edge portion of the active surface 8 across the main surface insulating film 12.

With reference to FIG. 4, the SiC semiconductor device 1 includes at least one (in this embodiment, one) first projecting structure 20A (projecting structure) according to the first configuration example which projects at the outside surface 9 side. The first projecting structure 20A includes an inorganic substance (inorganic film). In this embodiment, the first projecting structure 20A is constituted of a projecting portion (protruding portion) which projects toward the opposite side of the second main surface 6 with the SiC chip 2 as a starting point, and forms an uneven structure on the outside surface 9. The first projecting structure 20A faces the active mesa 11 in a plane direction of the outside surface 9.

In this embodiment, the first projecting structure 20A has a thickness exceeding the thickness of the active mesa 11 and includes a portion which is positioned lower than the active surface 8 and a portion which is positioned higher than the active surface 8. That is, when a straight line which extends horizontally (in the first direction X or the second direction Y) from the active surface 8 in a cross-sectional view is set, an upper end portion (tip portion) of the first projecting structure 20A traverses the straight line along the normal direction Z. The first projecting structure 20A is constituted of an ornamental structure which is electrically separated from the functional device. The ornamental structure means a structure which does not operate as the functional device (the same shall apply hereinafter). The "ornamental structure" may be referred to as an "accessory pattern." The first projecting structure 20A is formed in an electrically floating state.

Preferably, the first projecting structure 20A does not have a nitride film (nitride) at least on the outer surface. The first projecting structure 20A is preferably constituted of an inorganic substance other than a nitride. In this embodiment, the first projecting structure 20A includes a mesa portion 21 which is constituted of a portion of the SiC chip 2. Specifically, the mesa portion 21 is constituted of a portion of the SiC epitaxial layer 4. The mesa portion 21 forms a projecting portion which projects in a mesa shape toward the opposite side of the second main surface 6 at the outside surface 9. The mesa portion 21 forms a main body of the first projecting structure 20A.

The mesa portion 21 is formed at intervals from a peripheral edge of the active surface 8 (first to fourth connecting surfaces 10A to 10D) and the peripheral edge of the outside surface 9 (first to fourth side surfaces 7A to 7D) in plan view in a region between the peripheral edge of the active surface 8 and the peripheral edge of the outside surface 9. Specifically, the mesa portion 21 is formed at an interval from the side wall structure 13.

The mesa portion 21 is preferably arranged at a position which is closer to the peripheral edge of the outside surface 9 than the peripheral edge of the active surface 8. A distance between the peripheral edge of the outside surface 9 and the mesa portion 21 is preferably less than a distance between the peripheral edge of the active surface 8 and the mesa portion 21. The mesa portion 21 is formed in a band shape extending along the active surface 8 in plan view. In this embodiment, the mesa portion 21 is formed in an annular shape (specifically, in a quadrilateral annular shape) which surrounds the active surface 8 in plan view. The mesa portion 21 (first projecting structure 20A) may be formed with ends or may be formed in an endless shape in plan view.

The mesa portion 21 has a top surface 22, a first wall surface 23 at the active surface 8 side, and a second wall surface 24 at the peripheral edge side of the outside surface 9. The top surface 22 is located at substantially the same plane as the active surface 8 and extends parallel to the active surface 8 and the outside surface 9. In other embodiments, the top surface 22 may be located at the outside surface 9 side with respect to the active surface 8. That is, when a straight line extending from the active surface 8 horizontally (in the first direction X or the second direction Y) in a cross-sectional view is set, the top surface 22 may be formed at an interval from the straight line to the outside surface 9 side.

The top surface 22 has an off angle corresponding to the active surface 8 (outside surface 9). The first wall surface 23 and the second wall surface 24 form a first side and a second side of the first projecting structure 20A. The first wall surface 23 has four sides parallel to the active surface 8 in plan view. The second wall surface 24 has four sides parallel to the first wall surface 23 in plan view. Planar shapes of the first wall surface 23 and the second wall surface 24 may be arbitrary, respectively, and are not necessarily required to be formed parallel to the active surface 8 and may be formed in a meandering manner.

The first wall surface 23 and the second wall surface 24 may be formed substantially vertical to the top surface 22. In this case, the mesa portion 21 of a quadrilateral prism shape in a cross-sectional view is demarcated in the first main surface 5. The first wall surface 23 and the second wall surface 24 may be inclined obliquely downward toward the outside surface 9 from the top surface 22. In this case, the mesa portion 21 of a mesa shape in a cross-sectional view is demarcated in the first main surface 5.

An inclination angle of each of the first wall surface 23 and the second wall surface 24 may be not less than 90° and not more than 135°. The inclination angle of each of the first wall surface 23 and the second wall surface 24 are an angle which is made between the first wall surface 23 and the top surface 22 and between the second wall surface 24 and the top surface 22 in the mesa portion 21, respectively. The inclination angle of each of the first wall surface 23 and the second wall surface 24 is preferably not more than 95°.

The first projecting structure 20A includes a mesa insulating film 25 which covers the mesa portion 21. The mesa insulating film 25 is preferably constituted of an inorganic substance other than a nitride. The mesa insulating film 25 preferably includes a silicon oxide film. The mesa insulating film 25 particularly preferably includes a silicon oxide film that is constituted of an oxide of the mesa portion 21. The mesa insulating film 25 covers the top surface 22, the first wall surface 23 and the second wall surface 24 of the mesa portion 21 as a film shape.

Specifically, the mesa insulating film 25 has one surface on the SiC chip 2 side and another surface on the opposite side of the one surface. The mesa insulating film 25 is formed as a film shape such that both of one surface and another surface extend along the top surface 22, the first wall surface 23 and the second wall surface 24. The mesa insulating film 25 preferably covers an entire region of the top surface 22, an entire region of the first wall surface 23 and an entire region of the second wall surface 24 of the mesa portion 21. The mesa insulating film 25 electrically insulates the mesa portion 21 from outside. The mesa insulating film 25 is continuous with the main surface insulating film 12 at a base portion of the mesa portion 21. The mesa insulating film 25 may be regarded as a portion of the main surface insulating film 12.

The first projecting structure 20A includes a first inorganic film 26 which selectively covers the mesa portion 21. The first inorganic film 26 is constituted of an inorganic substance other than a nitride. The first inorganic film 26 is preferably constituted of an inorganic substance which is relatively large in adhesion force to an organic substance. The first inorganic film 26 is particularly preferably constituted of a polysilicon film. The first inorganic film 26 may be constituted of a conductive polysilicon film that includes an impurity or may be constituted of an impurity non-doped polysilicon film that does not include an impurity. The first inorganic film 26 may be constituted of an n-type polysilicon film which is doped with an n-type impurity and/or a p-type polysilicon film which is doped with a p-type impurity. The first inorganic film 26 is preferably constituted of the same material as the side wall structure 13.

The first inorganic film 26 has a first thickness T1. The first thickness T1 is preferably less than the thickness (depression depth DO) of the active mesa 11 (mesa portion 21). The first thickness T1 preferably exceeds the thickness of the main surface insulating film 12. Preferably, the first thickness T1 is substantially equal to a thickness of a portion of the side wall structure 13 which extends as a film shape along the outside surface 9. The first thickness T1 may be not less than 10 nm and not more than 1000 nm.

The first inorganic film 26 is formed on the main surface insulating film 12 and on the mesa insulating film 25 such as to cover at least one of the first wall surface 23 and the second wall surface 24 of the mesa portion 21. In this embodiment, the first inorganic film 26 includes a first covering film 27 which covers the first wall surface 23 and a second covering film 28 which covers the second wall surface 24 and selectively exposes the top surface 22. The first covering film 27 and the second covering film 28 are each similar in mode to the side wall structure 13. The first covering film 27 may be referred to as a "side wall structure at the first mesa side," and the second covering film 28 may be referred to as a "side wall structure at the second mesa side."

The first covering film 27 is formed at an interval from the active surface 8 (side wall structure 13) in plan view and formed in a band shape extending along the first wall surface 23. In this embodiment, the first covering film 27 is formed in an annular shape (specifically, in a quadrilateral annular shape) extending along the first wall surface 23 in plan view. The first covering film 27 may cover substantially an entire region of the first wall surface 23.

The first covering film 27 may cover the first wall surface 23 at an interval from the top surface 22 of the mesa portion 21 to the base portion side thereof such as to expose an upper wall portion of the first wall surface 23. The first covering film 27 includes a portion which extends as a film shape along the outside surface 9 and a portion which extends as a film shape along the first wall surface 23. The portion of the first covering film 27 which extends as a film shape along the outside surface 9 covers the outside surface 9 in a region on the outside surface 9 side with respect to the top surface 22.

The second covering film 28 is formed at an interval from the peripheral edge of the outside surface 9 (first to fourth side surfaces 7A to 7D) in plan view and formed in a band shape extending along the second wall surface 24. In this embodiment, the second covering film 28 is formed in an annular shape (specifically, in a quadrilateral annular shape) extending along the second wall surface 24 in plan view. The second covering film 28 may cover substantially an entire region of the second wall surface 24.

The second covering film 28 may cover the second wall surface 24 at an interval from the top surface 22 of the mesa portion 21 to the base portion side thereof such as to expose the upper wall portion of the second wall surface 24. The second covering film 28 includes a portion which extends as a film shape along the outside surface 9 and a portion which extends as a film shape along the second wall surface 24. The portion of the second covering film 28 which extends as a film shape along the outside surface 9 covers the outside surface 9 in a region on the outside surface 9 side with respect to the top surface 22.

The first projecting structure 20A includes a second inorganic film 29. The second inorganic film 29 may be referred to as an "interlayer insulating film" or an "intermediate insulating film." The second inorganic film 29 is constituted of an inorganic substance other than a nitride which is different from the first inorganic film 26. The second inorganic film 29 may be constituted of an inorganic insulator which is smaller in adhesion force to an organic substance than the first inorganic film 26. The second inorganic film 29 may have a laminated structure that includes a plurality of inorganic films or may have a single layer structure that is constituted of a single inorganic film. The second inorganic film 29 preferably includes a silicon oxide film. The second inorganic film 29 may have a single layer structure that is constituted of a single silicon oxide film or may have a laminated structure that is constituted of a plurality of silicon oxide films.

When the second inorganic film 29 includes a plurality of silicon oxide films, properties of the plurality of silicon oxide films are arbitrary. The second inorganic film 29 may include at least one of an NSG film (Nondoped Silicate Glass film), a PSG film (Phosphorus Silicate Glass film), and a BPSG film (Boron Phosphorus Silicate Glass film). The NSG film is constituted of an impurity non-doped silicon oxide film. The PSG film is constituted of a silicon oxide film which is doped with phosphorus. The BPSG film is constituted of a silicon oxide film which is doped with boron and phosphorus.

A thickness of the NSG film may be not less than 10 nm and not more than 500 nm. A thickness of the PSG film may be not less than 10 nm and not more than 500 nm. A thickness of the BPSG film may be not less than 10 nm and not more than 500 nm. The second inorganic film 29 may include the NSG film and the PSG film laminated in this order from the SiC chip 2 side. The second inorganic film 29 has a second thickness T2 (total thickness). The second thickness T2 is preferably not less than 10 nm and not more than 1500 nm. The second thickness T2 preferably exceeds the thickness of the main surface insulating film 12. The second thickness T2 preferably exceeds the first thickness T1 of the first inorganic film 26 (T1<T2).

The second inorganic film 29 covers the main surface insulating film 12 on the outside surface 9. The second inorganic film 29 has one surface on the SiC chip 2 side and another surface on the opposite side of the one surface. The second inorganic film 29 is formed such that both of one surface and another surface extend along an outer surface of the main surface insulating film 12 and an outer surface of the first inorganic film 26. In this embodiment, the second inorganic film 29 rides on the first covering film 27 and the second covering film 28 from both sides of the first wall surface 23 and the second wall surface 24 of the mesa portion 21 and selectively covers the top surface 22 of the mesa portion 21. Specifically, the second inorganic film 29 selectively covers a portion which covers the top surface 22 in the mesa insulating film 25.

The second inorganic film 29 forms one first projecting structure 20A with the mesa portion 21, the mesa insulating film 25 and the first inorganic film 26 (first covering film 27 and second covering film 28). The second inorganic film 29 may partially cover the first covering film 27 such as to partially expose the first covering film 27. The second inorganic film 29 may cover an entire region of the first covering film 27. The second inorganic film 29 may partially cover the second covering film 28 such as to partially expose the second covering film 28. The second inorganic film 29 may cover an entire region of the second covering film 28.

In this embodiment, the second inorganic film 29 has at least one opening 30 which selectively exposes a portion of the mesa insulating film 25 which covers the top surface 22. An opening area of the opening 30 in a cross-sectional view is preferably equal to or larger than an area of the portion of the top surface 22 which is covered by the second inorganic film 29. As a matter of course, the opening area of the opening 30 may be smaller than the area of the covered portion. It is sufficient that the opening 30 exposes only at least a portion of the top surface 22, and a planar shape thereof is arbitrary.

The opening 30 may be formed in a polygonal shape (for example, quadrilateral shape) or in a circular shape in plan view. The opening 30 may be formed as a line or in an annular shape extending along the mesa portion 21 in plan view. As a matter of course, the opening 30 may be formed as a line (for example, in a zigzag shape) extending in any direction. Further, a plurality of the openings 30 may be formed at an interval along the mesa portion 21.

The second inorganic film 29 is led out from the mesa portion 21 side toward the peripheral edge (first to fourth side surfaces 7A to 7D) side of the outside surface 9 and covers the main surface insulating film 12 as a film shape in a region between the peripheral edge of the outside surface 9 and the mesa portion 21. The second inorganic film 29 has a peripheral end wall which is formed at an interval inward from the peripheral edge of the outside surface 9 and exposes a peripheral edge portion of the outside surface 9 (SiC chip 2). The peripheral end wall of the second inorganic film 29 demarcates a notch opening 31 which exposes the peripheral edge portion of the outside surface 9 (SiC chip 2) with the peripheral end wall of the main surface insulating film 12.

The second inorganic film 29 is led out from the mesa portion 21 side toward the active surface 8 side and covers the main surface insulating film 12 as a film shape in a region between the active surface 8 and the first inorganic film 26. The second inorganic film 29 rides on the side wall structure 13 from above the main surface insulating film 12. The second inorganic film 29 covers an entire region of the side wall structure 13 as a film shape and is led out onto the active surface 8 by traversing the first to fourth connecting surfaces 10A to 10D. The second inorganic film 29 covers the active surface 8 across the main surface insulating film 12.

The second inorganic film 29 has a portion which covers the active surface 8 and a portion which covers the top surface 22 of the mesa portion 21. The portion of the second inorganic film 29 which covers the top surface 22 of the mesa portion 21 is located at the same plane as the portion of the second inorganic film 29 which covers the active surface 8. As described above, the second inorganic film 29 forms a portion of the first projecting structure 20A at the outside surface 9 and at the same time covers the active surface 8, the outside surface 9 and the first to fourth connecting surfaces 10A to 10D (side wall structure 13).

The SiC semiconductor device 1 includes a first main surface electrode 32 which is formed on the main surface insulating film 12 and electrically connected to the functional device. In FIG. 1 to FIG. 3, an example is shown in which one first main surface electrode 32 is arranged on the active surface 8 but not arranged on the outside surface 9. It suffices that the first main surface electrode 32 is arranged in a region at the active surface 8 side rather than in the first projecting structure 20A in plan view and a planar shape and the number of the first main surface electrode 32 are arbitrary.

Preferably, the first main surface electrode 32 does not cover the first projecting structure 20A. Preferably, the first main surface electrode 32 is not formed in a region between the first projecting structure 20A and the peripheral edge of the outside surface 9 on the second inorganic film 29 (outside surface 9). That is, preferably, a metal film is not formed in a region between a peripheral edge of the SiC chip 2 and the first projecting structure 20A in plan view. The first main surface electrode 32 penetrates through the main surface insulating film 12 and the second inorganic film 29 and is electrically connected to the functional device.

The first main surface electrode 32 preferably has a laminated structure which includes a barrier metal film and a main electrode film that are laminated in this order from the SiC chip 2 side. The barrier metal film is preferably constituted of a Ti-based metal film. The barrier metal film may have a single layer structure or a laminated structure that includes at least one of a Ti film and a TiN film. The main electrode film is preferably constituted of a Cu-based metal film or an Al-based metal film. The main electrode film may include at least one among a pure Cu film (Cu film with purity of not less than 99%), a pure Al film (Al film with purity of not less than 99%), an AlCu alloy film, an AlSi alloy film, and an AlSiCu alloy film.

The SiC semiconductor device 1 does not have a nitride film which covers the first projecting structure 20A (mesa portion 21). The SiC semiconductor device 1 does not have a nitride film which covers a region between the first projecting structure 20A (mesa portion 21) and the active surface 8. The SiC semiconductor device 1 does not have a nitride film which covers a region between the first projecting structure 20A (mesa portion 21) and the peripheral edge of the outside surface 9. The SiC semiconductor device 1 does not have a nitride film which covers the first main surface electrode 32.

The SiC semiconductor device 1 includes an organic film 33 which covers the first projecting structure 20A on the outside surface 9 side. The organic film 33 may also be referred to as a "protective film" or an "organic insulating film." The organic film 33 has a lower hardness than a hardness of the first inorganic film 26 and a hardness of the second inorganic film 29. In other words, the organic film 33 has an elastic modulus that is smaller than an elastic modulus of the first inorganic film 26 and an elastic modulus of the second inorganic film 29 and functions as a cushioning material (protective film) against an external force. The organic film 33 protects the SiC chip 2, the first main surface electrode 32, etc., from the external force.

Preferably, the organic film 33 includes a photosensitive resin. The photosensitive resin may be of a negative type or a positive type. The organic film 33 may include at least one among a polyimide film, a polyamide film, and a polybenzoxazole film. Preferably, the organic film 33 has a thickness exceeding the thickness of the active mesa 11. Particularly preferably, the thickness of the organic film 33 exceeds the thickness of the first main surface electrode 32. The thickness of the organic film 33 may be not less than 1 μm and not more than 50 μm. The thickness of the organic film 33 is preferably not less than 5 μm and not more than 20 μm.

The organic film 33 directly covers the first projecting structure 20A. Therefore, a nitride film is not interposed between the first projecting structure 20A and the organic film 33. Further, a nitride film is not interposed between the mesa portion 21 (SiC chip 2) and the organic film 33. Only an inorganic substance other than a nitride film is interposed between the mesa portion 21 and the organic film 33. The organic film 33 directly covers the second inorganic film 29 in the first projecting structure 20A and covers the first inorganic film 26 across the second inorganic film 29. Specifically, the organic film 33 rides on the second inorganic film 29 from both sides of the first wall surface 23 and the second wall surface 24 of the mesa portion 21 and covers an entire region of the first covering film 27 and an entire region of the second covering film 28 across the second inorganic film 29.

The organic film 33 enters into the opening 30 from above the second inorganic film 29 and directly covers the mesa insulating film 25 inside the opening 30. The organic film 33 covers the top surface 22 of the mesa portion 21 across the mesa insulating film 25 inside the opening 30. The organic film 33 is engaged with the first projecting structure 20A and at the same time engaged with the opening 30. As described above, the organic film 33 directly covers an entire region of the first projecting structure 20A in plan view.

The organic film 33 is led out from the first projecting structure 20A side toward the peripheral edge (first to fourth side surfaces 7A to 7D) side of the outside surface 9 and covers the second inorganic film 29 in a region between the peripheral edge of the outside surface 9 and the first inorganic film 26. The organic film 33 has a peripheral end wall which is formed at an interval inward from the peripheral edge of the outside surface 9.

That is, the peripheral end wall of the organic film 33 demarcates a dicing street 34 which is positioned in a region between the mesa portion 21 and the peripheral edge of the outside surface 9 and exposes the peripheral edge portion of the outside surface 9 (peripheral edge portion of the first main surface 5). The peripheral end wall of the organic film 33 may be formed at the active surface 8 side at an interval from the peripheral end wall (notch opening 31) of the second inorganic film 29. That is, the dicing street 34 may expose not only the peripheral edge portion of the outside surface 9 but also the second inorganic film 29. As a matter of course, the organic film 33 may cover the notch opening 31 and the peripheral edge portion of the outside surface 9.

The organic film 33 is led out from the first projecting structure 20A side toward the active surface 8 side and covers the second inorganic film 29 in a region between the active surface 8 and the first projecting structure 20A. The organic film 33 covers the side wall structure 13 across the second inorganic film 29 and is led out onto the active surface 8 by traversing the first to fourth connecting surfaces 10A to 10D. Preferably, the organic film 33 covers an entire region of the side wall structure 13.

The organic film 33 directly covers a peripheral edge portion of the first main surface electrode 32 on the active surface 8. That is, a nitride film is not interposed between the first main surface electrode 32 and the organic film 33. Preferably, the organic film 33 covers the peripheral edge portion of the first main surface electrode 32 along its entire periphery. The organic film 33 has at least one pad opening 35 which exposes an inner portion of the first main surface electrode 32. As described above, the organic film 33 refills a step between the active surface 8 and the outside surface 9 and covers the active surface 8 (peripheral edge portion of the first main surface electrode 32), the outside surface 9 (first projecting structure 20A), and the first to fourth connecting surfaces 10A to 10D (side wall structure 13).

The SiC semiconductor device 1 includes a second main surface electrode 36 which is formed on the second main surface 6. The second main surface electrode 36 covers an entire region of the second main surface 6 and is continuous with the first to fourth side surfaces 7A to 7D. The second main surface electrode 36 is electrically connected to the SiC chip 2 (SiC substrate 3). Specifically, the second main surface electrode 36 forms an ohmic contact with the SiC chip 2 (SiC substrate 3). The second main surface electrode 36 may include at least one among a Ti film, an Ni film, a Pd film, an Au film, and an Ag film. The second main surface electrode 36 may include, as an example, a Ti film, an Ni film, a Pd film, and an Au film laminated in this order from the second main surface 6 side.

The first projecting structure 20A is not limited to the mode shown in FIG. 4, etc., and can assume various types of modes. Hereinafter, with reference to FIG. 5A to FIG. 5C, other configuration examples of the first projecting structure 20A will be shown. FIG. 5A is an enlarged cross-sectional view which shows the first projecting structure 20A according to the second configuration example. The same reference sign is hereinafter given to the structure corresponding to each structure shown in FIG. 4, etc., and a description thereof is omitted.

With reference to FIG. 5A, the second inorganic film 29 has the opening 30 which partially exposes one or both (in this embodiment, both) of the first covering film 27 and the second covering film 28 of the first inorganic film 26. The organic film 33 directly covers one or both (in this embodiment, both) of the first covering film 27 and the second covering film 28 inside the opening 30.

FIG. 5B is an enlarged cross-sectional view which shows the first projecting structure 20A according to the third configuration example. The same reference sign is hereinafter given to the structure corresponding to each structure shown in FIG. 4, etc., and a description thereof is omitted. With reference to FIG. 5B, the second inorganic film 29 has the opening 30 which exposes an entire region of one or both (in this embodiment, both) of the first covering film 27 and the second covering film 28 of the first inorganic film 26. The opening 30 forms a gap 37 with one or both (in this embodiment, both) of the first covering film 27 and the second covering film 28.

That is, in this embodiment, the first projecting structure 20A includes the gap 37 which is formed between the first inorganic film 26 and the second inorganic film 29. The width of the gap 37 is arbitrary and may be not less than 0.1 μm and not more than 50 μm. The organic film 33 directly covers the first inorganic film 26 inside the opening 30. The organic film 33 enters into the gap 37 and directly covers one or both (in this embodiment, both) of the first covering film 27 and the second covering film 28 inside the gap 37.

FIG. 5C is an enlarged cross-sectional view which shows the first projecting structure 20A according to the fourth configuration example. The same reference sign is hereinafter given to the structure corresponding to each structure shown in FIG. 4, etc., and a description thereof is omitted. With reference to FIG. 5C, in this embodiment, the second inorganic film 29 covers an entire region of the top surface 22 of the mesa portion 21 and does not have the opening 30. The organic film 33 faces an entire region of the mesa portion 21 and an entire region of the first inorganic film 26 across the second inorganic film 29.

The SiC semiconductor device 1 may include at least two of the first projecting structures 20A according to the first to fourth configuration examples at the same time. The SiC semiconductor device 1 may include the first projecting structure 20A which has at least two features among the features of the first projecting structures 20A according to the first to fourth configuration examples at the same time.

As described above, the SiC semiconductor device 1 includes the SiC chip 2 (chip), the functional device, the first projecting structure 20A (projecting structure), and the organic film 33. The SiC chip 2 has the first main surface 5 on one side and the second main surface 6 on the other side. The first main surface 5 includes the active surface 8 set at the inner portion thereof and the outside surface 9 set at the peripheral edge portion thereof. The functional device is formed at the active surface 8 side. The first projecting structure 20A includes the inorganic substance and projects at the outside surface 9 side. That is, the first projecting structure 20A is formed at the outside surface 9 side such as to project to the opposite side of the second main surface 6. The organic film 33 covers the first projecting structure 20A.

Semiconductor devices are used in various environments depending on their applications, and therefore are required to have durability suitable for various operating conditions and environments. Among other things, an SiC semiconductor device which includes an SiC as a base material is expected, in terms of physical characteristics (electrical characteristics) of SiC, to be mounted on vehicles, etc., such as a hybrid vehicle, an electric vehicle, and a fuel cell vehicle in which a motor is used as a driving source. Accordingly, the SiC semiconductor device is required to have excellent durability suitable for severe operating conditions and environments, as compared with an Si semiconductor device which includes Si (silicon) as a base material.

The durability of the SiC semiconductor device is evaluated, for example, by a high temperature and high humidity bias test. In the high temperature and high humidity bias test, electrical characteristics of the SiC semiconductor device are evaluated in a state of being exposed to high temperature and high humidity environments. In high temperature environments, an external stress resulting from thermal expansion is applied to the organic film 33, and the organic film 33 may be peeled from the SiC chip 2. In high humidity environments, water (moisture) enters into a peeled portion of the organic film 33, by which the electrical characteristics of the SiC semiconductor device may be varied (deteriorated). These events result in a decrease in reliability of the SiC semiconductor device.

In this respect, according to the SiC semiconductor device 1, adhesion force of the organic film 33 with respect to the SiC chip 2 can be enhanced by the first projecting structure 20A. It is thereby possible to suppress peeling of the organic film 33 from the SiC chip 2. Thus, it is possible to provide the SiC semiconductor device 1 capable of improving reliability.

Preferably, the first projecting structure 20A is formed in the electrically floating state. That is, the first projecting structure 20A is preferably constituted of the ornamental structure that is electrically separated from the functional device. According to this structure, it is possible to suppress a variation in electrical characteristics of the functional device due to the first projecting structure 20A.

Preferably, a nitride film is not interposed between the first projecting structure 20A and the organic film 33. Preferably, a nitride film is not interposed between the outside surface 9 and the organic film 33. Preferably, the first projecting structure 20A does not have a nitride film. According to these structures, it is possible to prevent peeling of the organic film 33, with peeling of the nitride film as a starting point.

The first projecting structure 20A is preferably constituted of an inorganic substance. Preferably, a metal film is not formed in a region between the peripheral edge of the SiC chip 2 and the projecting structure in plan view. The first projecting structure 20A is preferably formed at intervals from the peripheral edge of the SiC chip 2 and the active surface 8 in plan view.

The first projecting structure 20A may have the first side (first wall surface 23) at the active surface 8 side and the second side (second wall surface 24) at the peripheral edge side of the outside surface 9. The organic film 33 preferably covers the first projecting structure 20A such as to cover both of the first side and the second side in plan view. Preferably, the organic film 33 covers an entire region of the first projecting structure 20A in plan view.

The first projecting structure 20A may be formed in a band shape extending along the active surface 8 in plan view. The first projecting structure 20A may surround the active surface 8 in plan view. The first projecting structure 20A may be formed in an annular shape in plan view. The organic film 33 may cover a portion of the active surface 8 in plan view.

The SiC semiconductor device 1 may include the first main surface electrode 32 which covers the active surface 8 in plan view. The organic film 33 may cover a portion of the first main surface electrode 32. In high temperature environments, a stress resulting from thermal expansion occurs in the first main surface electrode 32. When a nitride film which covers the first main surface electrode 32 is formed, the nitride film may be peeled from the first main surface electrode 32 due to a stress resulting from the first main surface electrode 32. In high humidity environments, the first main surface electrode 32, etc., may be deteriorated due to water (moisture) which entered into a peeled portion of the nitride film.

Therefore, a nitride film is preferably not interposed between the first main surface electrode 32 and the organic film 33. According to this structure, it is possible to reduce starting points of peeling a structure which covers the first main surface electrode 32. That is, it is possible to prevent peeling of the organic film 33 on the first main surface electrode 32, with peeling of the nitride film as a starting point.

A stress of the first main surface electrode 32 concentrates at the vicinity of an edge portion (peripheral edge portion) of the first main surface electrode 32. Accordingly, when a nitride film which covers the vicinity of the edge portion of the first main surface electrode 32 is formed, peeling of the nitride film occurs easily. Therefore, in such a structure that has the organic film 33 which covers the edge portion of the first main surface electrode 32, it is particularly preferable that a nitride film is not interposed between a peripheral edge portion of the first main surface electrode 32 and the organic film 33.

The first main surface 5 may include the active surface 8, the outside surface 9 which is depressed to the second main surface 6 side with respect to the active surface 8, and the first to fourth connecting surfaces 10A to 10D which connect the active surface 8 and the outside surface 9. That is, the SiC semiconductor device 1 may have the active mesa 11 which is demarcated by the active surface 8, the outside surface 9 and the first to fourth connecting surfaces 10A to 10D in the first main surface 5. In this case, the first projecting structure 20A preferably faces the active mesa 11 in the plane direction of the outside surface 9.

Further, in this case, the organic film 33 preferably fills a step between the active surface 8 and the outside surface 9 to cover the active surface 8 and the outside surface 9. According to this structure, adhesion force of the organic film 33 with respect to the SiC chip 2 can be enhanced by the active mesa 11 and the first projecting structure 20A. The SiC semiconductor device 1 may include the side wall structure 13 which covers the first to fourth connecting surfaces 10A to 10D. In this case, the organic film 33 preferably covers the side wall structure 13.

Preferably, the first projecting structure 20A includes the mesa portion 21 which is constituted of a portion of the SiC chip 2 and formed at the outside surface 9 such as to project toward the opposite side of the second main surface 6. Preferably, the first projecting structure 20A includes the first inorganic film 26 which covers at least a portion of the mesa portion 21 on the outside surface 9. Preferably, the first projecting structure 20A includes the second inorganic film 29 which covers at least a portion of the first inorganic film 26 on the outside surface 9.

In this case, preferably, the organic film 33 covers at least the second inorganic film 29 on the outside surface 9. According to this structure, adhesion force of the organic film 33 with respect to the SiC chip 2 can be enhanced by the first projecting structure 20A which includes the mesa portion 21, the first inorganic film 26, and the second inorganic film 29. It is thereby possible to suppress peeling of the organic film 33 from the SiC chip 2. Thus, it is possible to provide the SiC semiconductor device 1 capable of improving reliability.

Preferably, the second inorganic film 29 includes the inorganic substance different from the first inorganic film 26. Preferably, the first inorganic film 26 and the second inorganic film 29 are each formed in an electrically floating state. Preferably, the first inorganic film 26 and the second inorganic film 29 each include the inorganic substance other than a nitride. Preferably, a nitride film is not interposed between the second inorganic film 29 and the organic film 33. Preferably, a nitride film is not interposed between the first inorganic film 26 and the organic film 33.

Preferably, a nitride film is not interposed between the mesa portion 21 and the organic film 33. Preferably, a nitride film is not formed on a region between the active surface 8 and the mesa portion 21 at the outside surface 9. Preferably, a metal film is not formed in a region between the peripheral edge of the SiC chip 2 and the mesa portion 21 in plan view.

The mesa portion 21 is preferably formed at intervals from the peripheral edge of the SiC chip 2 and the active surface 8 in plan view. The mesa portion 21 may have the first side (first wall surface 23) at the active surface 8 side and the second side (second wall surface 24) at the peripheral edge side of the outside surface 9. In this case, the organic film 33 preferably covers the mesa portion 21 such as to cover both of the first side and the second side in plan view. Preferably, the organic film 33 covers an entire region of the mesa portion 21 in plan view.

The mesa portion 21 may be formed in a band shape extending along the active surface 8 in plan view. The mesa portion 21 may surround the active surface 8 in plan view. The mesa portion 21 may be formed in an annular shape in plan view. The organic film 33 may cover a portion of the active surface 8 in plan view.

The SiC semiconductor device 1 may include the first main surface electrode 32 which covers the active surface 8 in plan view. In this case, the organic film 33 may cover a portion of the first main surface electrode 32 at the active surface 8 side. In this case, preferably, a nitride film is not interposed between the first main surface electrode 32 and the organic film 33.

The first projecting structure 20A may include the mesa insulating film 25 which covers the mesa portion 21. In this case, the first inorganic film 26 preferably covers the mesa insulating film 25. The mesa insulating film 25 is preferably constituted of a silicon oxide film. Preferably, a nitride film is not interposed between the mesa portion 21 and the mesa insulating film 25. Preferably, the mesa portion 21 faces the active mesa 11 in the plane direction of the outside surface 9. Preferably, the mesa portion 21 has the top surface 22 which is located at the same plane as the active surface 8.

The first inorganic film 26 may include a polysilicon film, and the second inorganic film 29 may include a silicon oxide film. Preferably, the first inorganic film 26 includes a polysilicon film which is exposed from an outer surface. Preferably, the organic film 33 directly covers the first inorganic film 26 and the second inorganic film 29. Preferably, adhesion force of the organic film 33 to the first inorganic film 26 is larger than adhesion force of the organic film 33 to the second inorganic film 29.

The SiC chip 2 may include the SiC substrate 3 and the SiC epitaxial layer 4. In this case, the mesa portion 21 may be constituted of a portion of the SiC epitaxial layer 4. The SiC epitaxial layer 4 may have an impurity concentration different from that of the SiC substrate 3.

The second inorganic film 29 may have the opening 30 which overlaps at least a portion of the top surface 22 of the mesa portion 21 in plan view (refer to FIG. 4 to FIG. 5B). In this case, the second inorganic film 29 may cover an entire region of the first inorganic film 26 (refer to FIG. 4). The second inorganic film 29 may expose at least a portion of the first inorganic film 26 (refer to FIG. 5A and FIG. 5B). The second inorganic film 29 may expose an entire region of the first inorganic film 26 (refer to FIG. 5B).

In this case, the second inorganic film 29 may be formed on the outside surface 9 at an interval from the first inorganic film 26 such as to form the gap 37 with the first inorganic film 26 (refer to FIG. 5B). In this case, the organic film 33 may fill the gap 37 on the outside surface 9 to cover the mesa portion 21, the first inorganic film 26 and the second inorganic film 29 (refer to FIG. 5B). As a matter of course, the second inorganic film 29 may cover an entire region of the mesa portion 21 (refer to FIG. 5C).

FIG. 6 corresponds to FIG. 4 and is an enlarged cross-sectional view which shows an SiC semiconductor device 41 according to the second embodiment of the present invention with a second projecting structure 20B according to the first configuration example. The same reference sign is hereinafter given to the structure corresponding to each structure described for the SiC semiconductor device 1 and a description thereof is omitted.

With reference to FIG. 6, in place of the first projecting structure 20A, the SiC semiconductor device 41 includes at least one (in this embodiment, one) second projecting structure 20B (projecting structure) according to the first configuration example which projects at the outside surface 9 side. As with the first projecting structure 20A, the second projecting structure 20B includes the mesa portion 21, the mesa insulating film 25, the first inorganic film 26, and the second inorganic film 29. In this embodiment, the first inorganic film 26 includes a top surface covering portion 42 which covers the top surface 22 of the mesa portion 21 on the mesa insulating film 25 as a film shape, in addition to the first covering film 27 and the second covering film 28. The top surface covering portion 42 covers an entire region of the top surface 22 and is continuous with the first covering film 27 and the second covering film 28.

That is, the first inorganic film 26 covers the top surface 22 of the mesa portion 21, the first wall surface 23 thereof, and the second wall surface 24 thereof as a film shape. Specifically, the first inorganic film 26 has one surface on the SiC chip 2 side and another surface on the opposite side of the one surface. The first inorganic film 26 covers the top surface 22, the first wall surface 23 and the second wall surface 24 such that both of one surface and another surface extend along the top surface 22, the first wall surface 23 and the second wall surface 24. Preferably, the first inorganic film 26 covers an entire region of the mesa portion 21 as a film shape.

The second inorganic film 29 is formed as a film shape such that both of one surface and another surface extend along the outer surface (first covering film 27, second covering film 28, and top surface covering portion 42) of the first inorganic film 26. In this embodiment, the second inorganic film 29 rides on the first covering film 27 and the second covering film 28 from both sides of the first wall surface 23 and the second wall surface 24 of the mesa portion 21 and selectively covers the top surface covering portion 42.

In this embodiment, the second inorganic film 29 has at least one opening 30 which selectively exposes the top surface covering portion 42. An opening area of the opening 30 in a cross-sectional view is preferably equal to or larger than an area of a portion of the top surface covering portion 42 which is covered by the second inorganic film 29. As a matter of course, the opening area of the opening 30 may be smaller than the area of the covered portion. A description of the shape, etc., of the opening 30 is the same as the previous description, and therefore omitted.

In this embodiment, the organic film 33 includes a portion which directly covers the first inorganic film 26 and a portion which covers the first inorganic film 26 across the second inorganic film 29. Specifically, the organic film 33 rides on the second inorganic film 29 from both sides of the first wall surface 23 and the second wall surface 24 of the mesa portion 21 and covers entire regions of the first covering film 27 and the second covering film 28 across the second inorganic film 29.

The organic film 33 enters into the opening 30 from above the second inorganic film 29 and directly covers the top surface covering portion 42 of the first inorganic film 26 inside the opening 30. The organic film 33 covers the top surface 22 of the mesa portion 21 across the top surface covering portion 42 and the mesa insulating film 25 inside the opening 30. As described above, the organic film 33 directly covers an entire region of the second projecting structure 20B in plan view. The organic film 33 is engaged with the second projecting structure 20B and at the same time engaged with the opening 30. Further, the organic film 33 is in contact with the top surface covering portion 42 inside the opening 30.

The second projecting structure 20B is not limited to the mode shown in FIG. 6 and can assume various types of modes. Hereinafter, with reference to FIG. 7A to FIG. 7D, other configuration examples of the second projecting structure 20B will be shown. FIG. 7A is an enlarged cross-sectional view which shows the second projecting structure 20B according to the second configuration example. The same reference sign is hereinafter given to the structure corresponding to the structure shown in FIG. 6 and a description thereof is omitted.

With reference to FIG. 7A, the top surface covering portion 42 of the first inorganic film 26 may have at least one removed portion 42a and at least one covering portion 42b which are alternately formed along one or both of the first direction X and the second direction Y in a cross-sectional view. The removed portion 42a is constituted of an opening or a notched portion in which the first inorganic film 26 is partially removed such as to selectively expose the mesa insulating film 25. The covering portion 42b is constituted of a portion which selectively covers the mesa insulating film 25 in the first inorganic film 26.

It suffices that the top surface covering portion 42 has an uneven structure which is formed by the removed portion 42a and the covering portion 42b, and the position, the size, the planar shape, etc., of each of the removed portion 42a and the covering portion 42b are arbitrary. The top surface covering portion 42 can assume various types of modes, depending on the shape of at least one removed portion 42a and at least one covering portion 42b.

For example, when the top surface covering portion 42 has at least one removed portion 42a, at least the one removed portion 42a may be formed in a band shape, an annular shape, or a zigzag shape (in a meandering manner) extending in the first direction X and/or in the second direction Y in plan view. when the top surface covering portion 42 has a plurality of the removed portions 42a, the plurality of removed portions 42a may be formed as dots or stripes (in a plurality of band shapes) at an interval in the first direction X and/or in the second direction Y.

Similarly, when the top surface covering portion 42 has at least one covering portion 42b, at least the one covering portion 42b may be formed in a band shape, an annular shape, or a zigzag shape (in a meandering manner) extending in the first direction X and/or in the second direction Y in plan view. When the top surface covering portion 42 has a plurality of the covering portions 42b, the plurality of covering portions 42b may be formed as dots or stripes (in a plurality of band shapes) at an interval in the first direction X and/or in the second direction Y.

The organic film 33 enters into the removed portion 42a inside the opening 30 from above the covering portion 42b of the top surface covering portion 42 and directly covers the mesa insulating film 25 and the top surface covering portion 42 inside the removed portion 42a. In this embodiment, an example has been described in which the removed portion 42a exposes the mesa insulating film 25. However, the removed portion 42a may penetrate through the mesa insulating film 25 to expose the SiC chip 2 (SiC epitaxial layer 4). In this case, the organic film 33 directly covers the SiC chip 2, the mesa insulating film 25, and the top surface covering portion 42 inside the removed portion 42a.

FIG. 7B is an enlarged cross-sectional view which shows the second projecting structure 20B according to the third configuration example. The same reference sign is hereinafter given to the structure corresponding to each structure shown in FIG. 6 and a description thereof is omitted. With reference to FIG. 7B, the second inorganic film 29 has the opening 30 which partially exposes one or both (in this embodiment, both) of the first covering film 27 and the second covering film 28 of the first inorganic film 26, in addition to the top surface covering portion 42. The organic film 33 directly covers one or both (in this embodiment, both) of the first covering film 27 and the second covering film 28 inside the opening 30, in addition to the top surface covering portion 42.

FIG. 7C is an enlarged cross-sectional view which shows the second projecting structure 20B according to the fourth configuration example. The same reference sign is hereinafter given to the structure corresponding to each structure shown in FIG. 6 and a description thereof is omitted. With reference to FIG. 7C, the second inorganic film 29 has the opening 30 which exposes an entire region of one or both (in this embodiment, both) of the first covering film 27 and the second covering film 28 of the first inorganic film 26, in addition to the top surface covering portion 42. The opening 30 forms the gap 37 with one or both (in this embodiment, both) of the first covering film 27 and the second covering film 28.

That is, in this embodiment, the second projecting structure 20B includes the gap 37 formed between the first inorganic film 26 and the second inorganic film 29. The width of the gap 37 is arbitrary and may be not less than 0.1 μm and not more than 50 μm. In this embodiment, the organic film 33 directly covers one or both (in this embodiment, both) of the first covering film 27 and the second covering film 28 inside the opening 30, in addition to the top surface covering portion 42. The organic film 33 enters into the gap 37 and directly covers one or both (in this embodiment, both) of the first covering film 27 and the second covering film 28 inside the gap 37.

FIG. 7D is an enlarged cross-sectional view which shows the second projecting structure 20B according to the fifth configuration example. The same reference sign is hereinafter given to the structure corresponding to each structure shown in FIG. 6 and a description thereof is omitted. With reference to FIG. 7D, in this embodiment, the second inorganic film 29 covers an entire region of the top surface covering portion 42 of the first inorganic film 26 and does not have the opening 30. In this embodiment, the second inorganic film 29 covers an entire region of the first inorganic film 26. The organic film 33 faces an entire region of the mesa portion 21 and an entire region of the first inorganic film 26 across the second inorganic film 29.

The SiC semiconductor device 41 may include at least two of the second projecting structures 20B according to the first to fifth configuration examples at the same time. The SiC semiconductor device 41 may include the second projecting structure 20B which includes at least two features among the features of the second projecting structures 20B according to the first to fifth configuration examples at the same time.

As described above, the SiC semiconductor device 41 includes the SiC chip 2 (chip), the functional device, the second projecting structure 20B (projecting structure), and the organic film 33. The SiC chip 2 has the first main surface 5 on one side and the second main surface 6 on the other side. The first main surface 5 includes the active surface 8 set at the inner portion thereof and the outside surface 9 set at the peripheral edge portion thereof. The functional device is formed at the active surface 8 side. The second projecting structure 20B includes the inorganic substance and projects at the outside surface 9 side. That is, the second projecting structure 20B is formed at the outside surface 9 side such as to project to the opposite side of the second main surface 6. The organic film 33 covers the second projecting structure 20B.

According to this structure, adhesion force of the organic film 33 with respect to the SiC chip 2 can be enhanced by the second projecting structure 20B. It is thereby possible to suppress peeling of the organic film 33 from the SiC chip 2. Thus, it is possible to provide the SiC semiconductor device 41 capable of improving reliability.

Preferably, the second projecting structure 20B includes the mesa portion 21 which is constituted of a portion of the SiC chip 2 and formed at the outside surface 9 such as to project to the opposite side of the second main surface 6. Preferably, the mesa portion 21 has the top surface 22, the first wall surface 23 at the active surface 8 side, and the second wall surface 24 at the peripheral edge side of the outside surface 9. Preferably, the second projecting structure 20B includes the first inorganic film 26 which covers the top surface 22, the first wall surface 23 and the second wall surface 24 as a film shape. Preferably, the second projecting structure 20B includes the second inorganic film 29 which covers at least a portion of the first inorganic film 26 and forms the projecting structure with the mesa portion 21 and the first inorganic film 26.

In this case, preferably, the organic film 33 covers the second projecting structure 20B. According to this structure, it is possible to enhance adhesion force of the organic film 33 with respect to the SiC chip 2 by the second projecting structure 20B which includes the mesa portion 21, the first inorganic film 26, and the second inorganic film 29. It is thereby possible to suppress peeling of the organic film 33 from the SiC chip 2. Thus, it is possible to provide the SiC semiconductor device 41 capable of improving reliability.

Preferably, the first inorganic film 26 includes the top surface covering portion 42 which covers the top surface 22, the first covering film 27 which covers the first wall surface 23, and the second covering film 28 which covers the second wall surface 24. Preferably, the second inorganic film 29 covers one or both of the first covering film 27 and the second covering film 28 such as to expose at least a portion of the top surface covering portion 42 (refer to FIG. 6 to FIG. 7C). Preferably, the organic film 33 is in contact with the top surface covering portion 42.

The second inorganic film 29 may cover an entire region of the first covering film 27 and an entire region of the second covering film 28 and may selectively expose the top surface covering portion 42 (refer to FIG. 6 and FIG. 7A). The second inorganic film 29 may expose at least a portion of the top surface covering portion 42, at least a portion of the first covering film 27, and at least a portion of the second covering film 28 (refer to FIG. 7B and FIG. 7C). The second inorganic film 29 may expose an entire region of the first inorganic film 26 (refer to FIG. 7C).

In this case, the second inorganic film 29 may be formed on the outside surface 9 at an interval from the first inorganic film 26 such as to form the gap 37 with the first inorganic film 26 (refer to FIG. 7C). In this case, the organic film 33 may fill the gap 37 on the outside surface 9 to cover the mesa portion 21, the first inorganic film 26, and the second inorganic film 29 (refer to FIG. 7C). As a matter of course, the second inorganic film 29 may cover an entire region of the first inorganic film 26 (refer to FIG. 7D).

FIG. 8 corresponds to FIG. 4 and is an enlarged cross-sectional view which shows an SiC semiconductor device 51 according to the third embodiment of the present invention with a third projecting structure 20C according to the first configuration example. The same reference sign is hereinafter given to the structure corresponding to the structure described for the SiC semiconductor device 1 and a description thereof is omitted.

With reference to FIG. 8, in place of the first projecting structure 20A, the SiC semiconductor device 51 includes at least one (in this embodiment, one) third projecting structure 20C (projecting structure) according to the first configuration example which projects at an outside surface 9 side. As with the first projecting structure 20A, the third projecting structure 20C includes the mesa portion 21, the mesa insulating film 25, the first inorganic film 26, and the second inorganic film 29.

In this embodiment, the third projecting structure 20C includes at least one trench structure 52 which is formed at the top surface 22 of the mesa portion 21 (in this embodiment, three trench structures 52). The plurality of trench structures 52 are constituted of ornamental structures which are electrically separated from the functional device on the top surface 22. The plurality of trench structures 52 are formed in an electrically floating state.

The number of the trench structures 52 is arbitrary and appropriately adjusted according to a width of the mesa portion 21. The third projecting structure 20C may include one trench structure 52 in a cross-sectional view. Preferably, the third projecting structure 20C includes two or more trench structures 52 in a cross-sectional view. Particularly preferably, the third projecting structure 20C includes two or more trench structures 52 in a cross-sectional view and in plan view.

The plurality of trench structures 52 are formed at an interval in a direction orthogonal to the direction in which the mesa portion 21 extends in a cross-sectional view. A planar shape of each of the trench structures 52 is arbitrary. The plurality of trench structures 52 may be each formed in a band shape extending in the direction in which the mesa portion 21 extends in plan view. That is, the plurality of trench structures 52 may be formed as stripes (in a plurality of band shapes) in plan view. The plurality of trench structures 52 may be each formed in an annular shape extending along the mesa portion 21 in plan view. The plurality of trench structures 52 may be formed as dots at intervals in the direction in which the mesa portion 21 extends and in a direction orthogonal to the direction in which the mesa portion 21 extends.

The plurality of trench structures 52 each include a side wall and a bottom wall. The plurality of trench structures 52 may be each formed in a vertical shape having a substantially constant opening width. The plurality of trench structures 52 may be each formed in a tapered shape which has an opening width that narrows toward the bottom wall. Preferably, the bottom wall of each of the trench structures 52 is each formed in a curved shape toward the second main surface 6. As a matter of course, the bottom wall of each of the trench structures 52 may each have a flat surface parallel to the active surface 8.

The plurality of trench structures 52 are each formed at an interval from a bottom portion of the SiC epitaxial layer 4 (SiC substrate 3) to the top surface 22 side and face each other to the SiC substrate 3 across a portion of the SiC epitaxial layer 4. In this embodiment, the plurality of trench structures 52 are each formed at a thickness position between the outside surface 9 and the top surface 22.

The plurality of trench structures 52 each have a trench width WT. The trench width WT is a width of the trench structure 52 in a direction orthogonal to the direction in which the mesa portion 21 extends. The trench width WT may be not less than 0.1 μm and not more than 3 μm. The trench width WT is preferably not less than 0.5 μm and not more than 1.5 μm.

The plurality of trench structures 52 each have a trench depth DT. The trench depth DT may be not less than 0.1 μm and not more than 10 μm. The trench depth DT is preferably not more than 5 μm. The trench depth DT is particularly preferably not more than 2.5 μm. The trench depth DT preferably has a value in a range of within ±10%, with the depression depth DO of the outside surface 9 as a reference. It is particularly preferable that the trench depth DT is substantially equal to the depression depth DO (DT≈DO). That is, preferably, the bottom wall of the trench structure 52 is located at substantially the same plane as the outside surface 9.

The plurality of trench structures 52 are arrayed with a first interval I1 kept therebetween. The first interval I1 is a distance between two trench structures 52 adjacent to each other. The first interval I1 may be not less than 0.1 μm and not more than 2.5 μm. The first interval I1 is preferably not less than 0.5 μm and not more than 1.5 μm. The first interval I1 is preferably less than the trench width WT (I1<WT). As a matter of course, the first interval I1 may be equal to or larger than the trench width WT.

The plurality of trench structures 52 each include a trench 53 and an embedded material 54. Hereinafter, a description will be given of one trench structure 52. The trench 53 is dug down from the top surface 22 toward the second main surface 6. The trench 53 forms a wall surface of the trench structure 52 (side wall and bottom wall). An opening edge portion of the trench 53 is inclined obliquely downward toward the trench 53 from the top surface 22. The opening edge portion is a connection portion of the top surface 22 and the side wall of the trench 53. The opening edge portion may be inclined in a curved shape obliquely downward toward the outside of the mesa portion 21.

The embedded material 54 is constituted of an inorganic substance other than a nitride. In this embodiment, the embedded material 54 includes an insulating film 55 and an inorganic embedded material 56. The insulating film 55 is constituted of an inorganic substance other than a nitride. The insulating film 55 preferably includes a silicon oxide film. The insulating film 55 particularly preferably includes a silicon oxide film which is constituted of an oxide of the mesa portion 21. The insulating film 55 is formed as a film shape in an inner wall of the trench 53 and demarcates a recess space inside the trench 53.

The inorganic embedded material 56 is constituted of an inorganic substance other than a nitride. Preferably, the inorganic embedded material 56 is constituted of a polysilicon. The inorganic embedded material 56 may be constituted of a conductive polysilicon which includes an impurity or may be constituted of an impurity non-doped polysilicon which does not include an impurity. The inorganic embedded material 56 may be constituted of an n-type polysilicon which is doped with an n-type impurity and/or a p-type polysilicon which is doped with a p-type impurity. The inorganic embedded material 56 is preferably constituted of the same material as the side wall structure 13.

The inorganic embedded material 56 is embedded in the trench 53 across the insulating film 55. The inorganic embedded material 56 has an end portion which is exposed from the trench 53. The end portion of the inorganic embedded material 56 may be depressed toward the bottom wall side of the trench 53. In this embodiment, the end portion of the inorganic embedded material 56 is located at an opening side of the trench 53 from an intermediate portion thereof in a depth direction. That is, the inorganic embedded material 56 is embedded in the trench 53 such as to traverse the intermediate portion of the trench 53 in the depth direction from the bottom wall of the trench 53.

The inorganic embedded material 56 may be embedded in the trench 53 at an interval from the mesa insulating film 25 to the bottom wall side of the trench 53 such as to expose the insulating film 55 inside the trench 53. In this case, the inorganic embedded material 56 may be embedded in the trench 53 at an interval from the opening side of the trench 53 to the bottom wall side thereof. The inorganic embedded material 56 forms an uneven structure with the top surface 22. Thereby, the plurality of trench structures 52 form, in the top surface 22, an uneven structure resulting from the trench 53, the insulating film 55, and the inorganic embedded material 56.

The mesa insulating film 25 is continuous with the insulating film 55 of the plurality of trench structures 52 in the top surface 22. The mesa insulating film 25 and the insulating film 55 may be regarded as being constituted of portions of the main surface insulating film 12. As with the case of the first embodiment, the first inorganic film 26 includes the first covering film 27 and the second covering film 28. That is, the first inorganic film 26 exposes at least one or all of the plurality of trench structures 52 from the top surface 22.

In this embodiment, the second inorganic film 29 has at least one opening 30 which selectively exposes at least one or all of the plurality of trench structures 52. In this embodiment, the opening 30 exposes all of the trench structures 52 in a cross-sectional view. The opening 30 preferably exposes all of the trench structures 52 in plan view. An opening area of the opening 30 in a cross-sectional view is preferably equal to or larger than an area of the portion of the top surface 22 which is covered by the second inorganic film 29. As a matter of course, the opening area of the opening 30 may be smaller than the area of the covered portion. It suffices that the opening 30 exposes some of the plurality of trench structures 52 and a planar shape thereof is arbitrary. A description of the shape, etc., of the opening 30 is the same as the previous description, and therefore omitted.

The SiC semiconductor device 51 does not have a nitride film which covers the plurality of trench structures 52. The organic film 33 covers the mesa portion 21 such as to hide the plurality of trench structures 52 in plan view. In this embodiment, the organic film 33 includes a portion which directly covers the first inorganic film 26, a portion which covers the first inorganic film 26 across the second inorganic film 29, and a portion which directly covers the plurality of trench structures 52. Specifically, the organic film 33 rides on the second inorganic film 29 from both sides of the first wall surface 23 and the second wall surface 24 of the mesa portion 21 and covers entire regions of the first covering film 27 and the second covering film 28 across the second inorganic film 29.

The organic film 33 enters into the opening 30 from above the second inorganic film 29 and directly covers the plurality of trench structures 52 inside the opening 30. Specifically, the organic film 33 directly covers the insulating film 55 and the inorganic embedded materials 56 of the plurality of trench structures 52. That is, a nitride film is not interposed between the organic film 33 and the plurality of trench structures 52. As described above, the organic film 33 directly covers an entire region of the third projecting structure 20C in plan view. The organic film 33 is engaged with the third projecting structure 20C and at the same time engaged with the opening 30. Further, the organic film 33 is in contact with the plurality of trench structures 52 inside the opening 30.

The third projecting structure 20C is not limited to the mode shown in FIG. 8 and can assume various types of modes. Hereinafter, with reference to FIG. 9A to FIG. 9K, other configuration examples of the third projecting structure 20C will be shown. FIG. 9A is an enlarged cross-sectional view which shows the third projecting structure 20C according to the second configuration example. The same reference sign is hereinafter given to the structure corresponding to each structure shown in FIG. 8 and a description thereof is omitted.

With reference to FIG. 9A, the inorganic embedded material 56 is embedded in the bottom wall side of the trench 53 such as to expose the insulating film 55 from the inner wall (side wall) of the trench 53. The end portion of the inorganic embedded material 56 may be located at the bottom wall side of the trench 53 from an intermediate portion thereof in the depth direction. The inorganic embedded material 56 forms an uneven structure along the inner wall of the trench 53 with the top surface 22. That is, the plurality of trench structures 52 form an uneven structure in the top surface 22 due to the trench 53, the insulating film 55 and the inorganic embedded material 56.

In this embodiment, the organic film 33 enters into at least one trench 53 (in this embodiment, the plurality of trenches 53) from above the top surface 22 inside the opening 30. That is, the organic film 33 has a portion which is embedded in each of the trenches 53 across the insulating film 55. The organic film 33 is in contact with the insulating film 55 and the inorganic embedded material 56 inside the plurality of trenches 53.

FIG. 9B is an enlarged cross-sectional view which shows the third projecting structure 20C according to the third configuration example. The same reference sign is hereinafter given to the structure corresponding to each structure shown in FIG. 8 and a description thereof is omitted. With reference to FIG. 9B, in this embodiment, the plurality of trench structures 52 each include the trench 53 and the insulating film 55 and do not have the inorganic embedded material 56.

In this embodiment, the organic film 33 enters into at least one trench 53 (in this embodiment, the plurality of trenches 53) from above the top surface 22 inside the opening 30. That is, the organic film 33 has a portion which is embedded in each of the trenches 53 across the insulating film 55. The organic film 33 is in contact with the insulating film 55 inside the plurality of trenches 53. The organic film 33 is thus not in contact with the inorganic embedded material 56 inside the plurality of trenches 53.

FIG. 9C is an enlarged cross-sectional view which shows the third projecting structure 20C according to the fourth configuration example. The same reference sign is hereinafter given to the structure corresponding to each structure shown in FIG. 8 and a description thereof is omitted. With reference to FIG. 9C, the insulating film 55 covers the wall surface of the trench 53 at the bottom wall side thereof such as to expose the wall surface of the trench 53 at the opening side thereof. That is, the insulating film 55 demarcates a recess space at the bottom wall side of the trench 53. The insulating film 55 may expose a portion which is equal to or larger than ⅓ (preferably, equal to or larger than ½) of the trench depth DT from the opening side of the trench 53. That is, the insulating film 55 may be located at the bottom wall side of the trench 53 from an intermediate portion thereof in the depth direction.

The inorganic embedded material 56 is embedded in the bottom wall side of the trench 53 across the insulating film 55 such as to expose the wall surface of the trench 53 at the opening side thereof. The end portion of the inorganic embedded material 56 may be positioned at (projects at) the opening side of the trench 53 from the end portion of the insulating film 55. That is, the inorganic embedded material 56 may demarcate a depression between the wall surface of the trench 53 and the insulating film 55. The end portion of the inorganic embedded material 56 may be located at the bottom wall side of the trench 53 from the intermediate portion thereof in the depth direction.

In this embodiment, the mesa insulating film 25 has a mesa opening 57 which exposes the top surface 22 of the mesa portion 21. The mesa opening 57 exposes the plurality of trench structures 52 (trenches 53). In this embodiment, the opening 30 of the second inorganic film 29 is in communication with the mesa opening 57 and exposes the plurality of trench structures 52 (trenches 53).

In this embodiment, the organic film 33 enters into at least one trench 53 (in this embodiment, the plurality of trenches 53) from above the top surface 22 inside the opening 30. That is, the organic film 33 has a portion which is embedded in each of the trenches 53. The organic film 33 is in contact with the SiC chip 2 (SiC epitaxial layer 4), the insulating film 55, and the inorganic embedded material 56 inside the plurality of trenches 53.

FIG. 9D is an enlarged cross-sectional view which shows the third projecting structure 20C according to the fifth configuration example. The same reference sign is hereinafter given to the structure corresponding to each structure shown in FIG. 8 and a description thereof is omitted. With reference to FIG. 9D, in this embodiment, the plurality of trench structures 52 each include only the trench 53 and do not have the insulating film 55 and the inorganic embedded material 56.

In this embodiment, the mesa insulating film 25 has the mesa opening 57 which exposes the top surface 22 of the mesa portion 21. The mesa opening 57 exposes the plurality of trench structures 52 (trenches 53). In this embodiment, the opening 30 of the second inorganic film 29 is in communication with the mesa opening 57 and exposes the plurality of trench structures 52. In this embodiment, the organic film 33 enters into at least one trench 53 (in this embodiment, the plurality of trenches 53) from above the top surface 22 inside the opening 30. That is, the organic film 33 has a portion which is embedded in each of the trenches 53. The organic film 33 is in contact only with the SiC chip 2 (SiC epitaxial layer 4) inside the plurality of trenches 53.

FIG. 9E is an enlarged cross-sectional view which shows the third projecting structure 20C according to the sixth configuration example. The same reference sign is hereinafter given to the structure corresponding to each structure shown in FIG. 8 and a description thereof is omitted. With reference to FIG. 9E, the second inorganic film 29 has the opening 30 which partially exposes one or both (in this embodiment, both) of the first covering film 27 and the second covering film 28 of the first inorganic film 26, in addition to the plurality of trench structures 52 (top surface 22 of mesa portion 21). The organic film 33 directly covers one or both (in this embodiment, both) of the first covering film 27 and the second covering film 28 inside the opening 30, in addition to the plurality of trench structures 52 (top surface 22 of mesa portion 21).

FIG. 9F is an enlarged cross-sectional view which shows the third projecting structure 20C according to the seventh configuration example. The same reference sign is hereinafter given to the structure corresponding to each structure shown in FIG. 8 and a description thereof is omitted. With reference to FIG. 9F, the second inorganic film 29 has the opening 30 which exposes an entire region of one or both (in this embodiment, both) of the first covering film 27 and the second covering film 28 of the first inorganic film 26, in addition to the plurality of trench structures 52 (top surface 22 of mesa portion 21). The opening 30 forms the gap 37 with one or both (in this embodiment, both) of the first covering film 27 and the second covering film 28.

That is, in this embodiment, the third projecting structure 20C includes the gap 37 that is formed between the first inorganic film 26 and the second inorganic film 29. The width of the gap 37 is arbitrary and may be not less than 0.1 μm and not more than 50 μm. In this embodiment, the organic film 33 directly covers one or both (in this embodiment, both) of the first covering film 27 and the second covering film 28 inside the opening 30, in addition to the plurality of trench structures 52 (top surface 22 of mesa portion 21). The organic film 33 enters into the gap 37 and directly covers one or both (in this embodiment, both) of the first covering film 27 and the second covering film 28 inside the gap 37.

FIG. 9G is an enlarged cross-sectional view which shows the third projecting structure 20C according to the eighth configuration example. The same reference sign is hereinafter given to the structure corresponding to each structure shown in FIG. 8 and a description thereof is omitted. With reference to FIG. 9G, in this embodiment, the second inorganic film 29 covers an entire region of the top surface 22 of the mesa portion 21 and does not have the opening 30. That is, the second inorganic film 29 covers an entire region of the plurality of trench structures 52.

The second inorganic film 29 may have a plurality of depressions 58 which are depressed toward the plurality of trench structures 52 at a portion which covers the plurality of trench structures 52. In other words, the second inorganic film 29 may have an uneven structure resulting from the plurality of depressions 58 at a portion which covers the top surface 22 of the mesa portion 21. The organic film 33 faces an entire region of the mesa portion 21 and an entire region of the first inorganic film 26 across the second inorganic film 29. The organic film 33 fills the plurality of depressions 58 of the second inorganic film 29. The organic film 33 faces the plurality of trench structures 52 across the second inorganic film 29 at a portion which fills each of the depressions 58.

FIG. 9H is an enlarged cross-sectional view which shows the third projecting structure 20C according to the ninth configuration example. The same reference sign is hereinafter given to the structure corresponding to each structure shown in FIG. 8 and a description thereof is omitted. With reference to FIG. 9H, the inorganic embedded material 56 is embedded in the bottom wall side of the trench 53 such as to expose the insulating film 55 from the inner wall (side wall) of the trench 53. The end portion of the inorganic embedded material 56 may be located at the bottom wall side of the trench 53 from an intermediate portion thereof in the depth direction. The inorganic embedded material 56 forms an uneven structure along the inner wall of the trench 53 with the top surface 22. That is, the plurality of trench structures 52 form, in the top surface 22, an uneven structure resulting from the trench 53, the insulating film 55 and the inorganic embedded material 56.

In this embodiment, the second inorganic film 29 covers an entire region of the top surface 22 of the mesa portion 21 and does not have the opening 30. That is, the second inorganic film 29 covers an entire region of the plurality of trench structures 52. The second inorganic film 29 enters into at least one trench 53 (in this embodiment, the plurality of trenches 53) from above the top surface 22. That is, the second inorganic film 29 has a portion which is embedded in each of the trenches 53 across the insulating film 55. The second inorganic film 29 is in contact with the insulating film 55 and the inorganic embedded material 56 inside the plurality of trenches 53.

The second inorganic film 29 may have a plurality of depressions 58 which are depressed toward the plurality of trench structures 52 at a portion which covers the plurality of trench structures 52. In other words, the second inorganic film 29 may have an uneven structure resulting from the plurality of depressions 58 at a portion which covers the top surface 22 of the mesa portion 21. The organic film 33 faces an entire region of the mesa portion 21 and an entire region of the first inorganic film 26 across the second inorganic film 29. The organic film 33 fills the plurality of depressions 58 of the second inorganic film 29. The organic film 33 faces the plurality of trench structures 52 across the second inorganic film 29 at a portion which fills each of the depressions 58.

FIG. 9I is an enlarged cross-sectional view which shows the third projecting structure 20C according to the tenth configuration example. The same reference sign is hereinafter given to the structure corresponding to each structure shown in FIG. 8 and a description thereof is omitted. With reference to FIG. 9I, in this embodiment, the plurality of trench structures 52 each include the trench 53 and the insulating film 55 and do not have the inorganic embedded material 56.

In this embodiment, the second inorganic film 29 covers an entire region of the top surface 22 of the mesa portion 21 and does not have the opening 30. That is, the second inorganic film 29 covers an entire region of the plurality of trench structures 52. The second inorganic film 29 enters into at least one trench 53 (in this embodiment, the plurality of trenches 53) from above the top surface 22. That is, the second inorganic film 29 has a portion which is embedded in each of the trenches 53 across the insulating film 55. The second inorganic film 29 is in contact with the insulating film 55 inside the plurality of trenches 53.

The second inorganic film 29 may have a plurality of depressions 58 which are depressed toward the plurality of trench structures 52 at a portion which covers the plurality of trench structures 52. In other words, the second inorganic film 29 may have an uneven structure resulting from the plurality of depressions 58 at a portion which covers the top surface 22 of the mesa portion 21. The organic film 33 faces an entire region of the mesa portion 21 and an entire region of the first inorganic film 26 across the second inorganic film 29. The organic film 33 fills the plurality of depressions 58 of the second inorganic film 29. The organic film 33 faces the plurality of trench structures 52 across the second inorganic film 29 at a portion which fills each of the depressions 58.

FIG. 9J is an enlarged cross-sectional view which shows the third projecting structure 20C according to the eleventh configuration example. The same reference sign is hereinafter given to the structure corresponding to each structure shown in FIG. 8 and a description thereof is omitted. With reference to FIG. 9J, the insulating film 55 covers the wall surface of the trench 53 at the bottom wall side thereof such as to expose the wall surface of the trench 53 at the opening side thereof. That is, the insulating film 55 demarcates a recess space at the bottom wall side of the trench 53. The insulating film 55 may expose a portion which is equal to or larger than $\frac{1}{3}$ (preferably equal to or larger than $\frac{1}{2}$) of the trench depth DT from the opening side of the trench 53. That is, the insulating film 55 may be located at the bottom wall side of the trench 53 from an intermediate portion thereof in the depth direction.

The inorganic embedded material 56 is embedded in the bottom wall side of the trench 53 across the insulating film 55 such as to expose the wall surface of the trench 53 at the opening side thereof. The end portion of the inorganic embedded material 56 may be located at the opening side of the trench 53 from the end portion of the insulating film 55. That is, the inorganic embedded material 56 may demarcate a depression between the wall surface of the trench 53 and the insulating film 55. The end portion of the inorganic embedded material 56 may be located at the bottom wall side of the trench 53 from the intermediate portion thereof in the depth direction.

In this embodiment, the mesa insulating film 25 has the mesa opening 57 which exposes the top surface 22 of the mesa portion 21. The mesa opening 57 exposes the plurality of trench structures 52 (trenches 53). In this embodiment, the second inorganic film 29 covers an entire region of the top surface 22 of the mesa portion 21 and does not have the opening 30. That is, the second inorganic film 29 covers an entire region of the plurality of trench structures 52. The second inorganic film 29 enters into at least one trench 53 (in this embodiment, the plurality of trenches 53) from above the top surface 22. That is, the second inorganic film 29 has a portion which is embedded in each of the trenches 53. The second inorganic film 29 is in contact with the SiC chip 2 (SiC epitaxial layer 4), the insulating film 55, and the inorganic embedded material 56 inside the plurality of trenches 53.

The second inorganic film 29 may have a plurality of depressions 58 which are depressed toward the plurality of trench structures 52 at a portion which covers the plurality of trench structures 52. In other words, the second inorganic film 29 may have an uneven structure resulting from the plurality of depressions 58 at a portion which covers the top surface 22 of the mesa portion 21. The organic film 33 faces an entire region of the mesa portion 21 and an entire region of the first inorganic film 26 across the second inorganic film 29. The organic film 33 fills the plurality of depressions 58 on the second inorganic film 29. The organic film 33 faces the plurality of trench structures 52 across the second inorganic film 29 at a portion which fills each of the depressions 58.

FIG. 9K is an enlarged cross-sectional view which shows the third projecting structure 20C according to the twelfth configuration example. The same reference sign is hereinafter given to the structure corresponding to each structure shown in FIG. 8 and a description thereof is omitted. With reference to FIG. 9K, in this embodiment, the plurality of trench structures 52 each include only the trench 53 and do not have the insulating film 55 and the inorganic embedded material 56.

In this embodiment, the mesa insulating film 25 has the mesa opening 57 which exposes the top surface 22 of the mesa portion 21. The mesa opening 57 exposes the plurality of trench structures 52 (trenches 53). In this embodiment, the second inorganic film 29 covers an entire region of the top surface 22 of the mesa portion 21 and does not have the opening 30. That is, the second inorganic film 29 covers an entire region of the plurality of trench structures 52. The second inorganic film 29 enters into at least one trench 53 (in this embodiment, the plurality of trenches 53) from above the top surface 22. That is, the second inorganic film 29 has a portion which is embedded in each of the trenches 53. The second inorganic film 29 is in contact with the SiC chip 2 (SiC epitaxial layer 4) inside the plurality of trenches 53.

The second inorganic film 29 may have a plurality of depressions 58 which are depressed toward the plurality of trench structures 52 at a portion which covers the plurality of trench structures 52. In other words, the second inorganic film 29 may have an uneven structure resulting from the plurality of depressions 58 at a portion which covers the top surface 22 of the mesa portion 21. The organic film 33 faces an entire region of the mesa portion 21 and an entire region of the first inorganic film 26 across the second inorganic film 29. The organic film 33 fills the plurality of depressions 58 on the second inorganic film 29. The organic film 33 faces the plurality of trench structures 52 across the second inorganic film 29 at a portion which fills each of the depressions 58.

The SiC semiconductor device 51 may include at least two of the third projecting structures 20C according to the first to twelfth configuration examples at the same time. The SiC semiconductor device 51 may include the third projecting structure 20C which includes at least two features among the features of the third projecting structures 20C according to the first to twelfth configuration examples at the same time.

As described above, the SiC semiconductor device 51 includes the SiC chip 2 (chip), the functional device, the third projecting structure 20C (projecting structure), and the organic film 33. The SiC chip 2 has the first main surface 5 on one side and the second main surface 6 on the other side. The first main surface 5 includes the active surface 8 set at the inner portion thereof and the outside surface 9 set at the peripheral edge portion thereof. The functional device is formed at the active surface 8 side. The third projecting structure 20C includes the inorganic substance and projects at the outside surface 9 side. That is, the third projecting structure 20C is formed at the outside surface 9 side such as to project to the opposite side of the second main surface 6. The organic film 33 covers the third projecting structure 20C.

According to this structure, adhesion force of the organic film 33 with respect to the SiC chip 2 can be enhanced by the third projecting structure 20C. It is thereby possible to suppress peeling of the organic film 33 from the SiC chip 2. Thus, it is possible to provide the SiC semiconductor device 51 capable of improving reliability.

The third projecting structure 20C preferably includes the mesa portion 21 which is constituted of a portion of the SiC chip 2, which is formed at the outside surface 9 such as to project toward the opposite side of the second main surface 6, and which has the top surface 22. The third projecting structure 20C preferably includes the trench 53 which is formed in the top surface 22 of the mesa portion 21. The third projecting structure 20C preferably includes the first inorganic film 26 which covers at least a portion of the mesa portion 21 on the outside surface 9. The third projecting structure 20C preferably includes the second inorganic film 29 which covers at least a portion of the first inorganic film 26 on the outside surface 9 and forms the projecting structure with the mesa portion 21 and the first inorganic film 26.

In this case, the organic film 33 preferably covers the mesa portion 21 such as to hide the trench 53 in plan view. According to this structure, adhesion force of the organic film 33 with respect to the SiC chip 2 can be enhanced by using an uneven structure formed in the top surface 22 of the mesa portion 21 resulting from the trench 53. It is thereby possible to suppress peeling of the organic film 33 from the SiC chip 2. Thus, it is possible to provide the SiC semiconductor device 51 capable of improving reliability.

The SiC semiconductor device 51 may include the trench structure 52 including the trench 53 and the embedded material 54 which is embedded in the trench 53. According to this structure, adhesion force of the organic film 33 with respect to the SiC chip 2 can be enhanced by using an uneven structure formed in the top surface 22 of the mesa portion 21 resulting from the trench structure 52.

The embedded material 54 may include the insulating film 55 which covers the wall surface of the trench 53 and the inorganic embedded material 56 which is embedded in the trench 53 across the insulating film 55 (refer to FIG. 8, FIG. 9A, FIG. 9C, FIG. 9E to FIG. 9H, and FIG. 9J). The inorganic embedded material 56 may be embedded in the trench 53 at an interval from the opening side of the trench 53 to the bottom wall side thereof such as to expose the insulating film 55 inside the trench 53.

Preferably, the insulating film 55 is constituted of an oxide film, and the inorganic embedded material 56 is constituted of the polysilicon. It is preferable that the first inorganic film 26 exposes the trench structure 52 and the second inorganic film 29 exposes the trench structure 52. In this case, the organic film 33 is preferably in contact with the embedded material 54. The organic film 33 is preferably in contact with the inorganic embedded material 56.

The inorganic embedded material 56 may be embedded in the trench 53 such as to traverse the intermediate portion of the trench 53 in the depth direction from the bottom wall of the trench 53 (refer to FIG. 8, FIG. 9A, and FIG. 9E to FIG. 9G). The inorganic embedded material 56 may be embedded in the bottom wall side of the trench 53 from the intermediate portion thereof in the depth direction (refer to FIG. 9C, FIG. 9H, and FIG. 9J). In these cases, the inorganic embedded material 56 is preferably embedded in the trench 53 at an interval from the opening side of the trench 53 to the bottom wall side thereof such as to expose the insulating film 55 inside the trench 53. In addition, the organic film 33 may include a portion which is positioned inside the trench 53 (refer to FIG. 8, FIG. 9A, FIG. 9C, FIG. 9E, and FIG. 9F) and the second inorganic film 29 may include a portion which is positioned inside the trench 53 (refer to FIG. 9G, FIG. 9H, and FIG. 9J).

The SiC semiconductor device 51 may include the trench structure 52 which includes the trench 53 and the insulating film 55 that covers the wall surface of the trench 53 and does not have the inorganic embedded material 56 (refer to FIG. 9B and FIG. 9I). In this case, the organic film 33 may include a portion which is positioned inside the trench 53 (refer to FIG. 9B) and the second inorganic film 29 may include a portion which is positioned inside the trench 53 (refer to FIG. 9I).

The SiC semiconductor device 51 may include the trench structure 52 which is constituted only of the trench 53 (refer to FIG. 9D and FIG. 9K). In this case, the organic film 33 may include a portion which is positioned inside the trench 53 (refer to FIG. 9D) and the second inorganic film 29 may include a portion which is positioned inside the trench 53 (refer to FIG. 9K).

The SiC semiconductor device 51 may include the trench structure 52 which includes the trench 53, the insulating film 55 that covers the wall surface of the trench 53 at the bottom wall side thereof such as to expose the wall surface of the trench 53 at the opening side thereof, and the inorganic embedded material 56 that is embedded in the bottom wall side of the trench 53 across the insulating film 55 such as to expose the wall surface of the trench 53 at the opening side thereof (refer to FIG. 9C and FIG. 9J). In this case, the organic film 33 may include a portion which is positioned inside the trench 53 (refer to FIG. 9C) and the second inorganic film 29 may include a portion which is positioned inside the trench 53 (refer to FIG. 9J).

The first inorganic film 26 preferably includes the first covering film 27 which covers the first wall surface 23 of the mesa portion 21 and the second covering film 28 which covers the second wall surface 24 of the mesa portion 21. The second inorganic film 29 may have the opening 30 which overlaps at least a portion of the top surface 22 of the mesa portion 21 in plan view (refer to FIG. 8 to FIG. 9F). In this case, the second inorganic film 29 may cover an entire region of the first covering film 27 and an entire region of the second covering film 28 (refer to FIG. 8 to FIG. 9D). The second inorganic film 29 may expose at least a portion of the first covering film 27 and at least a portion of the second covering film 28 (refer to FIG. 9E and FIG. 9F). The second inorganic film 29 may expose an entire region of the first covering film 27 and an entire region of the second covering film 28 (refer to FIG. 9F).

In this case, the second inorganic film 29 may be formed on the outside surface 9 at intervals from the first covering film 27 and the second covering film 28 such as to form the gap 37 between the first covering film 27 and the second covering film 28 (refer to FIG. 9F). In this case, the organic film 33 may fill the gap 37 on the outside surface 9 to cover the mesa portion 21, the first inorganic film 26, and the second inorganic film 29 (refer to FIG. 9F). As a matter of course, the second inorganic film 29 may cover an entire region of the mesa portion 21 (refer to FIG. 9G).

FIG. 10 corresponds to FIG. 4 and is an enlarged cross-sectional view which shows an SiC semiconductor device 61 according to the fourth embodiment of the present invention with a fourth projecting structure 20D according to the first configuration example. The SiC semiconductor device 61 has a mode in which the SiC semiconductor device 51 according to the third embodiment is modified. The same reference sign is hereinafter given to the structure corresponding to the structure described for the SiC semiconductor device 51 and a description thereof is omitted.

With reference to FIG. 10, in place of the third projecting structure 20C, the SiC semiconductor device 61 includes at least one (in this embodiment, one) fourth projecting structure 20D according to the first configuration example which projects at an outside surface 9 side. As with the third projecting structure 20C, the fourth projecting structure 20D includes the mesa portion 21, the mesa insulating film 25, the first inorganic film 26, and the second inorganic film 29. In this embodiment, the first inorganic film 26 includes the top surface covering portion 42 which covers the top surface 22 of the mesa portion 21 on the mesa insulating film 25 as a film shape, in addition to the first covering film 27 and the second covering film 28. The top surface covering portion 42 covers an entire region of the top surface 22 and is continuous with the first covering film 27 and the second covering film 28.

That is, the first inorganic film 26 covers the top surface 22 the first wall surface 23 and the second wall surface 24 of the mesa portion 21 as a film shape. Specifically, the first inorganic film 26 has one surface on the SiC chip 2 side and another surface on the opposite side of the one surface. The first inorganic film 26 covers the top surface 22, the first wall surface 23 and the second wall surface 24 such that both of one surface and another surface extend as a film shape along the top surface 22, the first wall surface 23 and the second wall surface 24. The first inorganic film 26 preferably covers an entire region of the mesa portion 21 as a film shape.

The top surface covering portion 42 is continuous with the inorganic embedded material 56 of the plurality of trench structures 52. In this embodiment, the first inorganic film 26 also serves as the inorganic embedded material 56 of the plurality of trench structures 52. That is, the first inorganic film 26 includes a portion which enters into the trench 53 from above the top surface 22 of the mesa portion 21 as the inorganic embedded material 56. The first inorganic film 26 may have a plurality of depressions 62 which are depressed toward the plurality of trench structures 52 at a portion which covers the plurality of trench structures 52. In other words, the first inorganic film 26 may have an uneven structure resulting from the plurality of depressions 62 at a portion which covers the top surface 22 of the mesa portion 21.

The second inorganic film 29 is formed such that both of one surface and another surface extend along an outer surface of the first inorganic film 26 (first covering film 27, second covering film 28 and top surface covering portion 42). In this embodiment, the second inorganic film 29 rides on the first covering film 27 and the second covering film 28 from both sides of the first wall surface 23 and the second wall surface 24 of the mesa portion 21 and selectively covers the top surface covering portion 42.

In this embodiment, the second inorganic film 29 has at least one opening 30 which selectively exposes the top surface covering portion 42. An opening area of the opening 30 in a cross-sectional view is preferably equal to or larger than an area of a portion of the top surface covering portion 42 which is covered by the second inorganic film 29. As a matter of course, the opening area of the opening 30 may be smaller than the area of the covered portion. A description of the shape, etc., of the opening 30 is the same as the previous description, and therefore omitted.

In this embodiment, the organic film 33 includes a portion which directly covers the first inorganic film 26 and a portion which covers the first inorganic film 26 across the second inorganic film 29. Specifically, the organic film 33 rides on the second inorganic film 29 from both sides of the first wall surface 23 and the second wall surface 24 of the mesa portion 21 and covers entire regions of the first covering film 27 and the second covering film 28 across the second inorganic film 29.

The organic film 33 enters into the opening 30 from above the second inorganic film 29 and directly covers the top surface covering portion 42 of the first inorganic film 26 inside the opening 30. The organic film 33 covers the top surface 22 of the mesa portion 21 across the top surface covering portion 42 and the mesa insulating film 25 inside the opening 30. The organic film 33 fills the plurality of depressions 62 at the top surface covering portion 42.

The organic film 33 faces the plurality of trench structures 52 across the first inorganic film 26 at a portion which fills each of the depressions 62. As described above, the organic film 33 directly covers an entire region of the fourth projecting structure 20D in plan view. The organic film 33 is engaged with the fourth projecting structure 20D and at the same time engaged with the opening 30. Further, the organic film 33 is in contact with the top surface covering portion 42 inside the opening 30.

The fourth projecting structure 20D is not limited to the mode shown in FIG. 10 and can assume various types of modes. Hereinafter, with reference to FIG. 11A to FIG. 11C, other configuration examples of the fourth projecting structure 20D will be shown.

FIG. 11A is an enlarged cross-sectional view which shows the fourth projecting structure 20D according to the second configuration example. The same reference sign is hereinafter given to the structure corresponding to each structure shown in FIG. 10 and a description thereof is omitted. With reference to FIG. 11A, the second inorganic film 29 has the opening 30 which partially exposes one or both (in this embodiment, both) of the first covering film 27 and the second covering film 28 of the first inorganic film 26, in addition to the top surface covering portion 42. The organic film 33 directly covers one or both (in this embodiment, both) of the first covering film 27 and the second covering film 28 inside the opening 30, in addition to the top surface covering portion 42.

FIG. 11B is an enlarged cross-sectional view which shows the fourth projecting structure 20D according to the third configuration example. The same reference sign is hereinafter given to the structure corresponding to each structure shown in FIG. 10 and a description thereof is omitted. With reference to FIG. 11B, the second inorganic film 29 has the opening 30 which exposes an entire region of one or both (in this embodiment, both) of the first covering film 27 and the second covering film 28 of the first inorganic film 26, in addition to the top surface covering portion 42. The opening 30 forms the gap 37 with one or both (in this embodiment, both) of the first covering film 27 and the second covering film 28.

That is, in this embodiment, the fourth projecting structure 20D includes the gap 37 formed between the first inorganic film 26 and the second inorganic film 29. The width of the gap 37 is arbitrary and may be not less than 0.1 μm and not more than 50 μm. In this embodiment, the organic film 33 directly covers one or both (in this embodiment, both) of the first covering film 27 and the second covering film 28 inside the opening 30, in addition to the top surface covering portion 42. The organic film 33 enters into the gap 37 and directly covers one or both (in this embodiment, both) of the first covering film 27 and the second covering film 28 inside the gap 37.

FIG. 11C is an enlarged cross-sectional view which shows the fourth projecting structure 20D according to the fifth configuration example. The same reference sign is herein-after given to the structure corresponding to each structure shown in FIG. 10 and a description thereof is omitted. With reference to FIG. 11C, in this embodiment, the second inorganic film 29 covers an entire region of the first inorganic film 26 and does not have the opening 30.

The second inorganic film 29 may have a plurality of depressions 58 which are depressed toward the plurality of trench structures 52 at a portion which covers a depression 62 of the first inorganic film 26. In other words, the second inorganic film 29 may have an uneven structure resulting from the plurality of depressions 58 at a portion which covers the top surface 22 of the mesa portion 21. The organic film 33 faces an entire region of the mesa portion 21 and an entire region of the first inorganic film 26 across the second inorganic film 29.

The SiC semiconductor device 61 may include at least two of the fourth projecting structures 20D according to the first to fourth configuration examples at the same time. The SiC semiconductor device 61 may include the fourth projecting structure 20D which includes at least two features among the features of the fourth projecting structures 20D according to the first to fourth configuration examples at the same time.

As described above, the SiC semiconductor device 61 includes the SiC chip 2 (chip), the functional device, the fourth projecting structure 20D (projecting structure), and the organic film 33. The SiC chip 2 has the first main surface 5 on one side and the second main surface 6 on the other side. The first main surface 5 includes the active surface 8 set at the inner portion thereof and the outside surface 9 set at the peripheral edge portion thereof. The functional device is formed at the active surface 8 side. The fourth projecting structure 20D includes an inorganic substance and projects at the outside surface 9 side. That is, the fourth projecting structure 20D is formed at the outside surface 9 side such as to project to the opposite side of the second main surface 6. The organic film 33 covers the fourth projecting structure 20D.

According to this structure, adhesion force of the organic film 33 with respect to the SiC chip 2 can be enhanced by the fourth projecting structure 20D. It is thereby possible to suppress peeling of the organic film 33 from the SiC chip 2.

Thus, it is possible to provide the SiC semiconductor device 61 capable of improving reliability.

The fourth projecting structure 20D preferably includes the mesa portion 21 which is constituted of a portion of the SiC chip 2, which is formed at the outside surface 9 such as to project toward the opposite side of the second main surface 6, and which has the top surface 22. The fourth projecting structure 20D preferably includes the trench structure 52 which includes the trench 53 that is formed in the top surface 22, the insulating film 55 that covers the inner wall of the trench 53, and the inorganic embedded material 56 that is embedded in the trench 53 across the insulating film 55. The fourth projecting structure 20D preferably includes the first inorganic film 26 which covers the top surface 22 of the mesa portion 21. The fourth projecting structure 20D preferably includes the second inorganic film 29 which covers at least a portion of the first inorganic film 26 and forms the projecting structure with the mesa portion 21 and the first inorganic film 26.

In this case, the organic film 33 preferably covers the mesa portion 21. According to this structure, adhesion force of the organic film 33 with respect to the SiC chip 2 can be enhanced by an uneven structure resulting from the mesa portion 21 and the trench structure 52. It is thereby possible to suppress peeling of the organic film 33 from the SiC chip 2. Thus, it is possible to provide the SiC semiconductor device 61 capable of improving reliability.

The first inorganic film 26 is preferably constituted of the same material as the inorganic embedded material 56 and formed integrally with the inorganic embedded material 56. In other words, the inorganic embedded material 56 is preferably constituted of a portion of the first inorganic film 26. That is, the first inorganic film 26 preferably includes a portion which enters into trench 53 as the inorganic embedded material 56 from above the top surface 22. Preferably, the insulating film 55 is constituted of an oxide film, the inorganic embedded material 56 is constituted of a polysilicon, and the first inorganic film 26 is constituted of a polysilicon.

The mesa portion 21 may have the first wall surface 23 at the active surface 8 side and the second wall surface 24 at the peripheral edge side of the outside surface 9. In this case, the first inorganic film 26 preferably includes the top surface covering portion 42 which covers the top surface 22, the first covering film 27 which covers the first wall surface 23, and the second covering film 28 which covers the second wall surface 24. The second inorganic film 29 preferably covers the first covering film 27 and the second covering film 28 such as to expose at least a portion of the top surface covering portion 42 (refer to FIG. 10 to FIG. 11B). In this case, the organic film 33 is preferably in contact with the top surface covering portion 42.

The second inorganic film 29 may cover an entire region of the first covering film 27 and an entire region of the second covering film 28 and may selectively expose the top surface covering portion 42 (refer to FIG. 10). The second inorganic film 29 may expose at least a portion of the top surface covering portion 42, at least a portion of the first covering film 27, and at least a portion of the second covering film 28 (refer to FIG. 10 to FIG. 11B). The second inorganic film 29 may expose an entire region of the first inorganic film 26 (refer to FIG. 11B).

In this case, the second inorganic film 29 may be formed on the outside surface 9 at an interval from the first inorganic film 26 such as to form the gap 37 with the first inorganic film 26 (refer to FIG. 11B). In this case, the organic film 33 may fill the gap 37 on the outside surface 9 to cover the mesa portion 21, the first inorganic film 26, and the second inorganic film 29 (refer to FIG. 11B). As a matter of course, the second inorganic film 29 may cover an entire region of the first inorganic film 26 (refer to FIG. 11C).

FIG. 12 corresponds to FIG. 4 and is an enlarged cross-sectional view which shows an SiC semiconductor device 71 according to the fifth embodiment of the present invention with a fifth projecting structure 20E according to the first configuration example. The same reference sign is hereinafter given to the structure corresponding to the structure described for the SiC semiconductor device 1 and a description thereof is omitted.

With reference to FIG. 12, in place of the first projecting structure 20A, the SiC semiconductor device 71 includes at least one (in this embodiment, one) fifth projecting structure 20E (projecting structure) according to the first configuration example which projects at an outside surface 9 side. Specifically, the fifth projecting structure 20E includes an inorganic substance (film-shaped inorganic substance) and is formed at the main surface insulating film 12. In this embodiment, the fifth projecting structure 20E is constituted of a projecting portion (protruding portion) which projects toward the opposite side of the second main surface 6 with the main surface insulating film 12 as a starting point and forms an uneven structure on the outside surface 9.

The fifth projecting structure 20E has a thickness which is less than the thickness of the active mesa 11 and is formed at the outside surface 9 side from the active surface 8. That is, when a straight line which extends from the active surface 8 horizontally (in the first direction X or in the second direction Y) in a cross-sectional view is set, an upper end portion (tip portion) of the fifth projecting structure 20E is formed at an interval from the straight line to the SiC chip 2 side. The fifth projecting structure 20E faces the active mesa 11 (at least one of first to fourth connecting surfaces 10A to 10D) in the plane direction of the outside surface 9. The fifth projecting structure 20E is constituted of an ornamental structure which is electrically separated from the functional device.

Preferably, the fifth projecting structure 20E does not have a nitride film (nitride) at least on an outer surface thereof. The fifth projecting structure 20E is preferably constituted of an inorganic substance other than a nitride. Unlike the first to fourth projecting structures 20A to 20E, the fifth projecting structure 20E does not have the mesa portion 21 and the mesa insulating film 25, and includes the first inorganic film 26 and the second inorganic film 29. The first inorganic film 26 is constituted of an inorganic substance other than a nitride. The second inorganic film 29 is constituted of an inorganic substance other than a nitride that is different from the first inorganic film 26.

The first inorganic film 26 may be constituted of the same material and the same thickness (first thickness T1) as the first inorganic film 26 according to the first embodiment. The first inorganic film 26 forms a projecting portion which is formed as a film shape on the main surface insulating film 12 to project toward the opposite side of the second main surface 6 on the main surface insulating film 12. That is, the first inorganic film 26 forms a main body of the fifth projecting structure 20E. The first inorganic film 26 is formed in a region between a peripheral edge of the active surface 8 and a peripheral edge of the outside surface 9 at intervals from the peripheral edge of the active surface 8 (first to fourth connecting surfaces 10A to 10D) and the peripheral edge of the outside surface 9 (first to fourth side surfaces 7A to 7D) in plan view. Specifically, the first inorganic film 26 is formed at an interval from the side wall structure 13.

The first inorganic film 26 is formed in a band shape extending along the active surface 8 (first to fourth connecting surfaces 10A to 10D) in plan view. In this embodiment, the first inorganic film 26 is formed in an annular shape (specifically, in a quadrilateral annular shape) which surrounds the active surface 8 in plan view. The first inorganic film 26 (fifth projecting structure 20E) may be formed with ends or may be formed in an endless shape in plan view. The first inorganic film 26 has the first side at the active surface 8 side and the second side at the peripheral edge side of the outside surface 9.

The first side and the second side of the first inorganic film 26 form the first side and the second side of the fifth projecting structure 20E. The first side has four sides parallel to the active surface 8 in plan view. The second side has four sides parallel to the first side in plan view. A planar shape of the first side and that of the second side are each arbitrary and not necessarily formed parallel to the active surface 8 and may be formed in a meandering manner.

The second inorganic film 29 may be constituted of the same material and the same thickness (second thickness T2) as the second inorganic film 29 according to the first embodiment. The second inorganic film 29 has one surface on the SiC chip 2 side and another surface on the opposite side of the one surface. The second inorganic film 29 is formed such that both of one surface and another surface extend along an outer surface of the main surface insulating film 12 and an outer surface of the first inorganic film 26.

In this embodiment, the second inorganic film 29 rides on a peripheral edge portion of the first inorganic film 26 from both sides of the first side and the second side and covers a peripheral edge portion of the first inorganic film 26 on the side of the first side thereof and a peripheral edge portion thereof on the side of the second side thereof. A portion of the second inorganic film 29 which covers the first inorganic film 26 is located at the outside surface 9 side from the active surface 8. The second inorganic film 29 forms one fifth projecting structure 20E with the first inorganic film 26. The second inorganic film 29 may partially cover the first side such as to partially expose the first side. The second inorganic film 29 may cover the first side along its entire periphery. Further, the second inorganic film 29 may partially cover the second side such as to partially expose the second side. The second inorganic film 29 may cover the second side along its entire periphery.

In this embodiment, the second inorganic film 29 has at least one opening 30 which selectively exposes the first inorganic film 26. In a cross-sectional view, an opening area of the opening 30 is preferably equal to or larger than an area of a portion of the first inorganic film 26 which is covered by the second inorganic film 29. As a matter of course, the opening area of the opening 30 may be smaller than the area of the covered portion. It suffices that the opening 30 exposes at least a portion of the first inorganic film 26, and a planar shape thereof is arbitrary. A description of the shape, etc., of the opening 30 is the same as the previous description, and therefore omitted.

The second inorganic film 29 is led out from the first inorganic film 26 side to the peripheral edge of the outside surface 9 and covers the main surface insulating film 12 as a film shape in a region between the peripheral edge of the outside surface 9 and the first inorganic film 26. The second inorganic film 29 has a peripheral end wall which is formed at an interval inward from the peripheral edge of the outside surface 9 (first to fourth side surfaces 7A to 7D) and exposes a peripheral edge portion of the outside surface 9. The peripheral end wall of the second inorganic film 29 demarcates the notch opening 31 which exposes the peripheral edge portion of the outside surface 9 with the peripheral end wall of the main surface insulating film 12.

The second inorganic film 29 is led out from the first inorganic film 26 side toward the active surface 8 side and covers the main surface insulating film 12 as a film shape in a region between the active surface 8 and the first inorganic film 26. The second inorganic film 29 is led out onto the side wall structure 13 from above the main surface insulating film 12. The second inorganic film 29 covers an entire region of the side wall structure 13 as a film shape and is led out onto the outside surface 9 from above the active surface 8 by traversing the first to fourth connecting surfaces 10A to 10D. The second inorganic film 29 covers an entire region of the active surface 8 across the main surface insulating film 12.

As described above, the second inorganic film 29 has a portion which covers the active surface 8 and a portion which covers the first inorganic film 26. The portion of the second inorganic film 29 which covers the first inorganic film 26 is located at the second main surface 6 side from the portion of the second inorganic film 29 which covers active surface 8. The second inorganic film 29 forms a portion of the fifth projecting structure 20E at the outside surface 9 and at the same time covers the active surface 8, the outside surface 9 and the first to fourth connecting surfaces 10A to 10D (side wall structure 13).

In this embodiment, the SiC semiconductor device 71 does not have a nitride film which covers the fifth projecting structure 20E. The SiC semiconductor device 71 does not have a nitride film which covers a region between the fifth projecting structure 20E and the active surface 8. The SiC semiconductor device 71 does not have a nitride film which covers a region between the fifth projecting structure 20E and the peripheral edge of the outside surface 9. The SiC semiconductor device 71 does not have a nitride film which covers a first main surface electrode 32.

The SiC semiconductor device 71 includes the organic film 33 which covers the fifth projecting structure 20E on the outside surface 9 side. The organic film 33 may be constituted of the same material and the same thickness as the organic film 33 according to the first embodiment. The organic film 33 directly covers the fifth projecting structure 20E on the outside surface 9 side. Therefore, a nitride film is not interposed between the fifth projecting structure 20E and the organic film 33. A nitride film is not interposed between the outside surface 9 and the organic film 33. Only an inorganic substance other than a nitride film is interposed between the outside surface 9 and the organic film 33.

The organic film 33 rides on the second inorganic film 29 from both sides of the first side and the second side of the first inorganic film 26 and covers the first inorganic film 26. Specifically, the organic film 33 enters into the opening 30 from above the second inorganic film 29 and covers the first inorganic film 26 inside the opening 30. The organic film 33 directly covers the first inorganic film 26 and the second inorganic film 29. In this embodiment, the organic film 33 directly covers an entire region of the fifth projecting structure 20E. The organic film 33 is engaged with the fifth projecting structure 20E and at the same time engaged with the opening 30.

The organic film 33 is led out from the fifth projecting structure 20E side toward the peripheral edge of the outside surface 9 and covers the second inorganic film 29 in a region between the peripheral edge of the outside surface 9 and the first inorganic film 26. The organic film 33 has a peripheral end wall which is formed at an interval inward from the peripheral edge of the outside surface 9 (first to fourth side surfaces 7A to 7D) and exposes a peripheral edge portion of the outside surface 9. The peripheral end wall of the organic film 33 demarcates a dicing street 34 which exposes the peripheral edge portion of the outside surface 9. The peripheral end wall of the organic film 33 may be formed at an interval from the peripheral end wall of the second inorganic film 29 (notch opening 31) to the active surface 8 side. That is, the dicing street 34 may expose not only the peripheral edge portion of the outside surface 9 but also the second inorganic film 29.

The organic film 33 is led out from the fifth projecting structure 20E side toward the active surface 8 side and covers the second inorganic film 29 in a region between the active surface 8 and the fifth projecting structure 20E. The organic film 33 is led out onto the side wall structure 13 from above the second inorganic film 29. The organic film 33 covers an entire region of the side wall structure 13 across the second inorganic film 29 and is led out onto the outside surface 9 from above the active surface 8 by traversing the first to fourth connecting surfaces 10A to 10D.

The organic film 33 covers a peripheral edge portion of the first main surface electrode 32 on the active surface 8. Preferably, the organic film 33 covers the peripheral edge portion of the first main surface electrode 32 along its entire periphery. That is, the organic film 33 covers the active surface 8 (peripheral edge portion of the first main surface electrode 32), the outside surface 9 (fifth projecting structure 20E), and the first to fourth connecting surfaces 10A to 10D (side wall structure 13) such as to refill a step between the active surface 8 and the outside surface 9.

The fifth projecting structure 20E is not limited to the mode shown in FIG. 12 and can assume various types of modes. Hereinafter, with reference to FIG. 13A to FIG. 13C, other configuration examples of the fifth projecting structure 20E will be shown. FIG. 13A is an enlarged cross-sectional view which shows the fifth projecting structure 20E according to the second configuration example. The same reference sign is hereinafter given to the structure corresponding to the structure shown in FIG. 12 and a description thereof is omitted. With reference to FIG. 13A, the second inorganic film 29 may have the opening 30 which exposes one or both of the first side and the second side of the first inorganic film 26. The opening 30 may form the gap 37 with one or both of the first side and the second side of the first inorganic film 26.

That is, in this embodiment, the fifth projecting structure 20E includes the gap 37 which is formed between the first inorganic film 26 and the second inorganic film 29. The width of the gap 37 is arbitrary and may be not less than 0.1 μm and not more than 50 μm. The opening 30 may be formed at an interval from the first inorganic film 26 and may expose an entire region of the first inorganic film 26. In this embodiment, the organic film 33 directly covers the first inorganic film 26 inside the opening 30. The organic film 33 enters into the gap 37 and directly covers one or both of the first side and the second side of the first inorganic film 26 inside the gap 37.

FIG. 13B is an enlarged cross-sectional view which shows the fifth projecting structure 20E according to the third configuration example. The same reference sign is hereinafter given to the structure corresponding to each structure shown in FIG. 12 and a description thereof is omitted. With reference to FIG. 13B, the first inorganic film 26 may have at least one removed portion 42a and at least one covering portion 42b which are alternately formed along one or both of the first direction X and the second direction Y. The removed portion 42a is constituted of an opening or a notched portion from which the first inorganic film 26 is partially removed such as to selectively expose the main surface insulating film 12. The covering portion 42b is constituted of a portion of the first inorganic film 26 which selectively covers the main surface insulating film 12.

It suffices that the first inorganic film 26 has an uneven structure which is formed by the removed portion 42a and the covering portion 42b, and the position, the size, the planar shape, etc., of the removed portion 42a and those of the covering portion 42b are each arbitrary. The first inorganic film 26 can assume various types of modes depending on the shape of at least one removed portion 42a and at least one covering portion 42b.

For example, when the first inorganic film 26 has at least one removed portion 42a, at least the one removed portion 42a may be formed in a band shape, an annular shape, or a zigzag shape (in a meandering manner) extending in the first direction X and/or in the second direction Y in plan view. When the first inorganic film 26 has a plurality of the removed portions 42a, the plurality of removed portions 42a may be formed as dots or stripes (in a plurality of band shapes) at an interval in the first direction X and/or in the second direction Y.

Similarly, when the first inorganic film 26 has at least one covering portion 42b, at least the one covering portion 42b may be formed in a band shape, an annular shape, or a zigzag shape (in a meandering manner) extending in the first direction X and/or in the second direction Y in plan view. When the first inorganic film 26 has a plurality of the covering portions 42b, the plurality of covering portions 42b may be formed as dots or stripes (in a plurality of band shapes) at an interval in the first direction X and/or in the second direction Y.

In this embodiment, the organic film 33 directly covers the first inorganic film 26 inside the opening 30 of the second inorganic film 29. Specifically, the organic film 33 enters into the removed portion 42a from above the covering portion 42b inside the opening 30 and directly covers the main surface insulating film 12 and the first inorganic film 26 inside the removed portion 42a. In this embodiment, a description has been given of an example in which the removed portion 42a exposes the main surface insulating film 12. However, the removed portion 42a may penetrate through the main surface insulating film 12 to expose the SiC chip 2 (SiC epitaxial layer 4). In this case, the organic film 33 directly covers the SiC chip 2, the main surface insulating film 12, and the first inorganic film 26 inside the removed portion 42a.

FIG. 13C is an enlarged cross-sectional view which shows the fifth projecting structure 20E according to the fourth configuration example. The same reference sign is hereinafter given to the structure corresponding to each structure shown in FIG. 12 and a description thereof is omitted. With reference to FIG. 13C, in this embodiment, the second inorganic film 29 covers an entire region of the first inorganic film 26 and does not have the opening 30. The organic film 33 faces the entire region of the first inorganic film 26 across the second inorganic film 29. The fifth projecting structure 20E having the above-described mode may be adopted.

The SiC semiconductor device 71 may have at least two of the fifth projecting structures 20E according to the first to fourth configuration examples at the same time. The SiC semiconductor device 71 may include the fifth projecting structure 20E which includes at least two features among the features of the fifth projecting structures 20E according to the first to fourth configuration examples at the same time.

As described above, the SiC semiconductor device 71 includes the SiC chip 2 (chip), the functional device, the fifth projecting structure 20E (projecting structure), and the organic film 33. The SiC chip 2 has the first main surface 5 on one side and the second main surface 6 on the other side. The first main surface 5 includes the active surface 8 set at the inner portion thereof and the outside surface 9 set at the peripheral edge portion thereof. The functional device is formed at the active surface 8 side. The fifth projecting structure 20E includes an inorganic substance and projects at the outside surface 9 side. That is, the fifth projecting structure 20E is formed at the outside surface 9 side such as to project to the opposite side of the second main surface 6. The organic film 33 covers the fifth projecting structure 20E.

According to this structure, adhesion force of the organic film 33 with respect to the SiC chip 2 can be enhanced by the fifth projecting structure 20E. It is thereby possible to suppress peeling of the organic film 33 from the SiC chip 2. Thus, it is possible to provide the SiC semiconductor device 71 capable of improving reliability.

The fifth projecting structure 20E preferably includes the first inorganic film 26 which projects on the outside surface 9. The fifth projecting structure 20E may include the second inorganic film 29 which covers at least a portion of the first inorganic film 26 on the outside surface 9 and forms the projecting structure with the first inorganic film 26 (refer to FIG. 12 to FIG. 13C).

In this case, the organic film 33 preferably covers at least the second inorganic film 29 on the outside surface 9. According to this structure, adhesion force of the organic film 33 with respect to the SiC chip 2 can be enhanced by the fifth projecting structure 20E which includes the first inorganic film 26 and the second inorganic film 29. It is thereby possible to suppress peeling of the organic film 33 from the SiC chip 2. Thus, it is possible to provide the SiC semiconductor device 71 capable of improving reliability.

The second inorganic film 29 may have the opening 30 which overlaps at least a portion of the first inorganic film 26 in plan view (refer to FIG. 12 to FIG. 13C). That is, the second inorganic film 29 may expose at least a portion of the first inorganic film 26. Preferably, the organic film 33 directly covers the first inorganic film 26.

The second inorganic film 29 may expose an entire region of the first inorganic film 26 (refer to FIG. 13B). In this case, the second inorganic film 29 may be formed on the outside surface 9 at an interval from the first inorganic film 26 such as to form the gap 37 with the first inorganic film 26. In this case, the organic film 33 may fill the gap 37 on the outside surface 9 and covers the first inorganic film 26 and the second inorganic film 29. As a matter of course, the second inorganic film 29 may cover an entire region of the mesa portion 21 (refer to FIG. 13C).

FIG. 14 is a plan view for describing a configuration example when an SiC-MISFET is applied as the functional device in the first to fifth embodiments. FIG. 15 is a cross-sectional view taken along line XV-XV shown in FIG. 14. Hereinafter, the SiC semiconductor device which includes the SiC-MISFET is referred to as an "SiC semiconductor device SD." Any one of the SiC semiconductor devices 1, 41, 51, 61, and 71 according to the first to fifth embodiments is applied as the "SiC semiconductor device SD." The same reference sign is hereinafter given to the structure corresponding to the structure described for the first to fifth embodiments and a description thereof is omitted.

With reference to FIG. 14 and FIG. 15, the SiC semiconductor device SD includes the SiC-MISFET as one example of the functional device. The SiC semiconductor device SD includes an n-type (first conductive type) first semiconductor region 81 which is formed in a surface layer portion of the second main surface 6. The first semiconductor region 81 forms a drain of the SiC-MISFET. The first semiconductor region 81 may be referred to as a drain region. The first semiconductor region 81 has an n-type impurity concentration which is substantially constant in a thickness direction. The first semiconductor region 81 is formed in an entire region of the surface layer portion of the second main surface 6 and has the second main surface 6 and portions of first to fourth side surfaces 7A to 7D. In this embodiment, the first semiconductor region 81 is formed by the n-type SiC substrate 3.

The SiC semiconductor device SD includes an n-type second semiconductor region 82 which is formed in a surface layer portion of a first main surface 5. The second semiconductor region 82 is electrically connected to the first semiconductor region 81 and forms the drain of the SiC-MISFET with the first semiconductor region 81. The second semiconductor region 82 may be referred to as a drift region. The second semiconductor region 82 has an n-type impurity concentration which is less than the n-type impurity concentration of the first semiconductor region 81. The second semiconductor region 82 is formed in an entire region of the surface layer portion of the first main surface 5 and has the first main surface 5 and portions of the first to fourth side surfaces 7A to 7D. In this embodiment, the second semiconductor region 82 is formed by the n-type SiC epitaxial layer 4.

The SiC semiconductor device SD includes a p-type (second conductive type) body region 83 which is formed in a surface layer portion of the active surface 8. The body region 83 forms a portion of a body diode of the SiC-MISFET. The body region 83 may be formed in an entire region of the surface layer portion of the active surface 8.

The SiC semiconductor device SD includes an n-type source region 84 which is formed at a surface layer portion of the body region 83. The source region 84 forms a source of the SiC-MISFET. The source region 84 may be formed in an entire region of the surface layer portion of the body region 83. The source region 84 has an n-type impurity concentration exceeding the n-type impurity concentration of the second semiconductor region 82. The source region 84 forms a channel of the SiC-MISFET with the second semiconductor region 82 inside the body region 83.

The SiC semiconductor device SD includes a plurality of trench gate structures 85 which are formed in the active surface 8 such as to traverse the body region 83 and the source region 84 and reach the second semiconductor region 82. The plurality of trench gate structures 85 form a gate of the SiC-MISFET to control on and off of the channel. That is, the SiC-MISFET is constituted of a trench gate type.

The plurality of trench gate structures 85 may be each formed in a band shape (rectangular shape) extending in the first direction X in plan view and formed at an interval in the second direction Y. Each of the trench gate structures 85 is formed in the active surface 8 side at an interval from the bottom portion of the second semiconductor region 82 and faces the first semiconductor region 81 across a portion of the second semiconductor region 82.

The plurality of trench gate structures 85 each have a gate width WG. The gate width WG is the width in a direction orthogonal to the direction in which the trench gate structure 85 extends. The gate width WG may be not less than 0.1 μm and not more than 3 μm. The gate width WG is preferably not less than 0.5 μm and not more than 1.5 μm. The gate width WG preferably has a value in a range of within ±10% of the value of the trench width WT of the trench structure 52. Preferably, the gate width WG is substantially equal to the trench width WT (WG≈WT).

The plurality of trench gate structures 85 each have a first depth D1. The first depth D1 is preferably less than the depression depth DO (D1<DO). That is, the first depth D1 is preferably less than the trench depth DT of the trench structure 52 (D1<DT).

Each of the trench gate structures 85 includes a gate trench 86, a gate insulating film 87, and a gate electrode 88. The gate trench 86 is formed in the active surface 8 and forms a side wall and a bottom wall of the trench gate structure 85. The gate insulating film 87 is formed as a film shape in the inner wall of the gate trench 86 and covers the second semiconductor region 82, the body region 83 and the source region 84. The gate electrode 88 is embedded in the gate trench 86 across the gate insulating film 87. The gate electrode 88 faces the second semiconductor region 82, the body region 83 and the source region 84 across the gate insulating film 87. A gate potential is applied to the gate electrode 88.

The SiC semiconductor device SD includes a plurality of trench source structures 89 which are formed in the active surface 8 such as to traverse the body region 83 and the source region 84 and reach the second semiconductor region 82. The plurality of trench source structures 89 are each formed in a region between two trench gate structures 85 adjacent to each other in the active surface 8. The plurality of trench source structures 89 may be each formed in a band shape extending in the first direction X in plan view. Each of the trench source structures 89 is formed in the active surface 8 side at an interval from the bottom portion of the second semiconductor region 82 and faces the first semiconductor region 81 across a portion of the second semiconductor region 82.

The plurality of trench source structures 89 each have a source width WS. The source width WS is the width in a direction orthogonal to the direction in which the trench source structure 89 extends. The source width WS may be not less than 0.1 μm and not more than 3 μm. The source width WS is preferably not less than 0.5 μm and not more than 1.5 μm. The source width WS preferably has a value in a range of within ±10% of the value of the trench width WT of the trench structure 52. Preferably, the source width WS is substantially equal to the trench width WT (WS≈WT).

The trench source structures 89 each have a second depth D2 exceeding the first depth D1 of the trench gate structure 85 (D1<D2). The second depth D2 is preferably not less than 1.5 times and not more than 3 times the first depth D1. A bottom wall of each of the trench source structures 89 is located at the bottom portion side of the second semiconductor region 82 with respect to the bottom wall of each of the trench gate structures 85. The second depth D2 preferably has a value in a range of ±10% of the value of the trench depth DT of the trench structure 52. Preferably, the second depth D2 is substantially equal to the trench depth DT (D2≈DT). As a matter of course, each of the trench source structures 89 may have the second depth D2 substantially equal to the first depth D1 (D1≈D2).

The plurality of trench source structures 89 are arrayed, with a second interval I2 kept from the plurality of trench gate structures 85. The second interval I2 is a distance between a trench gate structure 85 and a trench source structure 89 which are adjacent to each other. The second interval I2 may be not less than 0.1 μm and not more than 2.5 μm. The second interval I2 is preferably not less than 0.5 μm and not more than 1.5 μm.

The second interval I2 is preferably less than the gate width WG (source width WS) (I2<WG, WS). As a matter of course, the second interval I2 may be equal to or larger than the gate width WG (source width WS). The second interval I2 preferably has a value in a range of within ±10% of the value of the first interval I1 of the trench structure 52. Preferably, the second interval I2 is substantially equal to the first interval I1 (I1≈I2).

Each of the trench source structures 89 includes a source trench 90, a source insulating film 91, and a source electrode 92. The source trench 90 is formed in the active surface 8 and forms a side wall and a bottom wall of the trench source structure 89. The source insulating film 91 is formed as a film shape in the inner wall of the source trench 90 and covers the second semiconductor region 82, the body region 83, and the source region 84. The source electrode 92 is embedded in the source trench 90 across the source insulating film 91. A source potential is applied to the source electrode 92.

The SiC semiconductor device SD includes a plurality of p-type well regions 93 which are each formed in a region along the plurality of trench source structures 89 at the surface layer portion of the active surface 8. P-type impurity concentrations of the plurality of well regions 93 preferably exceed the p-type impurity concentration of the body region 83. Each of the well regions 93 covers the trench source structure 89 corresponding in a one-to-one correspondence relationship. Each of the well regions 93 may be formed in a band shape extending along a corresponding trench source structure 89. Each of the well regions 93 covers a side wall and a bottom wall of each of the trench source structures 89 and is electrically connected to the body region 83.

The SiC semiconductor device SD includes a plurality of p-type gate well regions 94 which are each formed in a region along the plurality of trench gate structures 85 at the surface layer portion of the active surface 8. Preferably, p-type impurity concentrations of the plurality of gate well regions 94 are substantially equal to the p-type impurity concentration of the well region 93. The plurality of gate well regions 94 may cover the trench gate structures 85 corresponding in a one-to-one correspondence relationship.

Each of the gate well regions 94 may be formed in a band shape extending along a corresponding trench gate structure 85. Each of the gate well regions 94 covers a side wall and a bottom wall of each of the trench gate structures 85 and is electrically connected to the body region 83. Bottom portions of the plurality of gate well regions 94 are located at the bottom wall side of the trench gate structure 85 with respect to the bottom portions of the plurality of well regions 93.

FIG. 16A is a cross-sectional view which shows a cross-sectional structure along line XVI-XVI shown in FIG. 15 with the third projecting structure 20C. Here, a description will be given of a case in which the third projecting structure 20C is formed at the outside surface 9 side, however, in place of the third projecting structure 20C, at least one of the first projecting structure 20A, the second projecting structure 20B, and the fourth projecting structure 20D may be formed. Further, in place of the third projecting structure 20C, a projecting structure that includes at least two features among the features of the first projecting structure 20A, the second projecting structure 20B, and the fourth projecting structure 20D at the same time may be included.

With reference to FIG. 16A, the SiC semiconductor device SD may include a p-type floating body region 95 which is formed in an electrically floating state at the surface layer portion of the top surface 22 of the mesa portion 21. The floating body region 95 has a p-type impurity concentration equal to the p-type impurity concentration of the body region 83. The floating body region 95 is formed in an entire region of the surface layer portion of the top surface 22 and exposed from the first wall surface 23 and the second wall surface 24 of the mesa portion 21.

The SiC semiconductor device SD may include an n-type floating source region 96 which is formed in an electrically floating state at a surface layer portion of the floating body region 95. The floating source region 96 has an n-type impurity concentration equal to the n-type impurity concentration of the source region 84. The floating source region 96 is formed in an entire region of the surface layer portion of the floating body region 95 and exposed from the first wall surface 23 and the second wall surface 24 of the mesa portion 21. The floating source region 96 forms one floating impurity region at the surface layer portion of the top surface 22 with the floating body region 95. The above-described trench structure 52 is formed in the top surface 22 such as to penetrate through the floating body region 95 and the floating source region 96.

The SiC semiconductor device SD may include a plurality of p-type floating well regions 97 which are each formed in an electrically floating state in a region along the plurality of trench structures 52 at the surface layer portion of the top surface 22 of the mesa portion 21. In the case of the first and second projecting structures 20A and 20B which are not provided with the trench structure 52, the floating well region 97 may be removed.

The plurality of floating well regions 97 have a p-type impurity concentration which is equal to the p-type impurity concentration of the well region 93. Each of the floating well regions 97 covers a corresponding trench structure 52 in a one-to-one correspondence relationship. The plurality of floating well regions 97 may be each formed in a band shape extending along a corresponding trench source structure 89. Each of the floating well regions 97 covers a side wall and a bottom wall of each of the trench source structures 89 and is connected to the floating body region 95.

The SiC semiconductor device SD may include a plurality of p-type second floating well regions 98 which are each formed in an electrically floating state in a region along one or both of the first wall surface 23 and the second wall surface 24 inside the mesa portion 21. In this embodiment, the SiC semiconductor device SD includes the plurality of second floating well regions 98 which are formed at the surface layer portion of the first wall surface 23 and at the surface layer portion of the second wall surface 24.

The plurality of second floating well regions 98 have a p-type impurity concentration which is equal to the p-type impurity concentration of the well region 93. The plurality of second floating well regions 98 may cover an entire region of the first wall surface 23 and an entire region of the second wall surface 24. The second floating well region 98 may be led out to the active surface 8 side via corner portions of the first wall surface 23 and of the outside surface 9 at the surface layer portion of the outside surface 9. The second floating well region 98 may be led out to the peripheral edge portion side of the outside surface 9 via corner portions of the second wall surface 24 and of the outside surface 9 at the surface layer portion of the outside surface 9. Each of the second floating well regions 98 covers a side wall and a bottom wall of each of the trench source structures 89 and is connected to the floating body region 95.

In FIG. 16A, a description has been given of an example in which the SiC semiconductor device SD includes the floating body region 95, the floating source region 96, the floating well region 97, and the second floating well region 98. However, the SiC semiconductor device SD is not necessarily required to include all of the floating body region 95, the floating source region 96, the floating well region 97, and the second floating well region 98 at the same time. The SiC semiconductor device SD may have at least one of the floating body region 95, the floating source region 96, the floating well region 97, and the second floating well region 98. As a matter of course, the SiC semiconductor device SD that does not have any one of the floating body region 95, the floating source region 96, the floating well region 97, and the second floating well region 98 may be adopted.

With reference to FIG. 14 and FIG. 15 again, the SiC semiconductor device SD includes a p-type outer contact region 99 which is formed at the surface layer portion of the outside surface 9. The outer contact region 99 may be referred to as an "anode region." The outer contact region 99 preferably has a p-type impurity concentration exceeding the p-type impurity concentration of the body region 83.

The outer contact region 99 is formed in a region between a peripheral edge of the active surface 8 and a peripheral edge of the outside surface 9 at intervals from the peripheral edge of the active surface 8 (first to fourth connecting surfaces 10A to 10D) and the peripheral edge of the outside surface 9 (first to fourth side surfaces 7A to 7D) in plan view. Specifically, the outer contact region 99 is formed in a region between the active surface 8 and the mesa portion 21 at intervals from the active surface 8 and the mesa portion 21 (third projecting structure 20C) in plan view. The outer contact region 99 is formed in a band shape extending along the mesa portion 21 in plan view. The outer contact region 99 may be formed in an annular shape (specifically, in a quadrilateral annular shape) which surrounds the active surface 8 in plan view.

The outer contact region 99 is formed at an interval from the bottom portion of the second semiconductor region 82 to the outside surface 9. The outer contact region 99 in its entirety is located at the bottom portion side of the second semiconductor region 82 with respect to the bottom walls of the plurality of trench gate structures 85. The bottom portion of the outer contact region 99 is located at the bottom portion side of the second semiconductor region 82 with respect to the bottom wall of the trench structure 52 and the bottom walls of the plurality of trench source structures 89. The outer contact region 99 forms a pn junction portion with the second semiconductor region 82. Thereby, a pn junction diode is formed, with the outer contact region 99 given as an anode and with the second semiconductor region 82 given as a cathode.

The SiC semiconductor device SD includes a p-type outer well region 100 which is formed at the surface layer portion of the outside surface 9. The outer well region 100 has a p-type impurity concentration which is less than the p-type impurity concentration of the outer contact region 99. Preferably, the p-type impurity concentration of the outer well region 100 is substantially equal to the p-type impurity concentration of the well region 93. The outer well region 100 is formed in a region between the peripheral edge of the active surface 8 (first to fourth connecting surfaces 10A to 10D) and the outer contact region 99 in plan view.

The outer well region 100 is formed in a band shape extending along the active surface 8 in plan view. The outer well region 100 may be formed in an annular shape (specifically, in a quadrilateral annular shape) which surrounds the active surface 8 in plan view. The outer well region 100 is electrically connected to the outer contact region 99. The outer well region 100 may extend from the outside surface 9 toward the first to fourth connecting surfaces 10A to 10D to cover the first to fourth connecting surfaces 10A to 10D inside the SiC chip 2. The outer well region 100 may be electrically connected to the body region 83 and the well region 93 at the surface layer portions of the first to fourth connecting surfaces 10A to 10D.

The outer well region 100 is formed deeper than the outer contact region 99. The outer well region 100 is formed at an interval from the bottom portion of the second semiconductor region 82 to the outside surface 9. The outer well region 100 is located at the bottom portion side of the second semiconductor region 82 with respect to the bottom walls of the plurality of trench gate structures 85. The bottom portion of the outer well region 100 is located at the bottom portion side of the second semiconductor region 82 with respect to the bottom wall of the trench structure 52 and the bottom wall of the trench source structure 89.

The outer well region 100 forms a pn junction portion with the second semiconductor region 82 with the outer contact region 99. The outer well region 100 forms the pn junction portion with the second semiconductor region 82 at portions along the first to fourth connecting surfaces 10A to 10D. That is, inside the SiC chip 2, the pn junction portion is formed at the portions along the first to fourth connecting surfaces 10A to 10D.

The SiC semiconductor device SD includes at least one p-type field region 101 (preferably not less than two and not more than 20) which is formed in a region between the outer contact region 99 and the peripheral edge of the outside surface 9 (first to fourth side surfaces 7A to 7D) at the surface layer portion of the outside surface 9. In this embodiment, the SiC semiconductor device SD includes four field regions 101.

The plurality of field regions 101 are formed in a region between the outer contact region 99 and the mesa portion 21 (third projecting structure 20C) in plan view. The plurality of field regions 101 are formed at interval from the outer contact region 99 side toward the mesa portion 21 side. At least one of the field regions 101 may overlap the first covering film 27 of the third projecting structure 20C in plan view.

The field region 101 relaxes an electric field inside the SiC chip 2 in the outside surface 9. The number, the width, the depth, the p-type impurity concentration, etc., of the field region 101 are arbitrary and can take any value depending on an electric field to be relaxed. Each of the field regions 101 may be formed in a band shape extending along the active surface 8 in plan view. Each of the field regions 101 may be formed in an annular shape (specifically, in a quadrilateral annular shape) which surrounds the active surface 8 in plan view. Each of the field regions 101 may be referred to as an FLR (Field Limiting Ring) region.

The innermost field region 101 may be connected to the outer contact region 99. The innermost field region 101 may form a pn junction portion with the second semiconductor region 82 with the outer contact region 99. The field regions 101 other than the innermost field region 101 may be formed in an electrically floating state. Each of the field regions 101 is formed deeper than the outer contact region 99.

Each of the field regions 101 is formed at an interval from the bottom portion of the second semiconductor region 82 to the outside surface 9. Each of the field regions 101 is located at the bottom portion side of the second semiconductor region 82 with respect to the bottom walls of the plurality of trench gate structures 85. The bottom portion of each of the field regions 101 is located at the bottom portion side of the second semiconductor region 82 with respect to the bottom wall of the trench structure 52 and the bottom wall of the trench source structure 89.

The SiC semiconductor device SD includes the above-described main surface insulating film 12 which covers the active surface 8. The main surface insulating film 12 is continuous with the gate insulating film 87 and the source insulating film 91 to expose the gate electrode 88 and the source electrode 92. The SiC semiconductor device SD includes the above-described second inorganic film 29 which is formed on the main surface insulating film 12. The second inorganic film 29 selectively covers the active surface 8 on the main surface insulating film 12. The second inorganic film 29 has a plurality of contact openings 102 which selectively expose each of the trench gate structures 85, each of the trench source structures 89, and the outer contact region 99.

The SiC semiconductor device SD includes the above-described first main surface electrode 32 which is formed on the second inorganic film 29 on the active surface 8. The first main surface electrode 32 includes a gate main surface electrode 111, a source main surface electrode 112, a gate wiring electrode 113, and a source wiring electrode 114. The gate main surface electrode 111 may be referred to as a gate pad electrode. The source main surface electrode 112 may be referred to as a source pad electrode. The gate wiring electrode 113 may be referred to as a gate finger electrode. The source wiring electrode 114 may be referred to as a source finger electrode.

In this embodiment, the gate main surface electrode 111 is arranged in a region adjacent to the central portion of the first connecting surface 10A at the peripheral edge portion of the active surface 8. The gate main surface electrode 111 is formed in a quadrilateral shape having four sides parallel to the first main surface 5 (active surface 8) in plan view. The gate main surface electrode 111 is electrically connected to the plurality of trench gate structures 85 (gate electrode 88) and transmits a gate potential (gate signal) input from outside to the plurality of trench gate structures 85.

The source main surface electrode 112 is arranged on the active surface 8, at an interval from the gate main surface electrode 111. In this embodiment, the source main surface electrode 112 is formed in a quadrilateral shape having four sides parallel to the active surface 8 in plan view. Specifically, the source main surface electrode 112 is formed in a polygonal shape having a recessed portion which is depressed toward an interior of the active surface 8 such as to conform to the gate main surface electrode 111 at the side along the first connecting surface 10A in plan view.

The source main surface electrode 112 enters into the plurality of contact openings 102 from above the second inorganic film 29 and is electrically connected to the plurality of trench source structures 89, the plurality of source regions 84, and the plurality of well regions 93. The source main surface electrode 112 transmits an externally-input source potential to the plurality of trench source structures 89, the plurality of source regions 84, and the plurality of well regions 93.

The gate wiring electrode 113 is led out onto the second inorganic film 29 from the gate main surface electrode 111. The gate wiring electrode 113 is formed inside a region which is surrounded by the peripheral edge of the active surface 8 (first to fourth connecting surfaces 10A to 10D) in plan view. The gate wiring electrode 113 is formed in a band shape extending along the peripheral edge of the active surface 8 in plan view and faces the source main surface electrode 112 from a plurality of directions.

The gate wiring electrode 113 intersects (specifically, be orthogonal to) the end portion of the trench gate structure 85 in plan view. The gate wiring electrode 113 enters into the plurality of contact openings 102 from above the second inorganic film 29 and is electrically connected to the plurality of trench gate structures 85 (gate electrodes 88). The gate wiring electrode 113 transmits a gate potential applied to the gate main surface electrode 111 to the plurality of trench gate structures 85.

The source wiring electrode 114 is led out onto the second inorganic film 29 from the source main surface electrode 112. The source wiring electrode 114 is formed in a band shape extending along the peripheral edge of the active surface 8 (first to fourth connecting surfaces 10A to 10D) in plan view and faces the source main surface electrode 112 from the plurality of directions. In this embodiment, the source wiring electrode 114 is formed in an annular shape (specifically, in a quadrilateral annular shape) which collectively surrounds the gate main surface electrode 111, the source main surface electrode 112, and the gate wiring electrode 113 in plan view.

In this embodiment, the source wiring electrode 114 covers the side wall structure 13 across the second inorganic film 29 and is routed from the active surface 8 side to the outside surface 9 side. The source wiring electrode 114 covers the outer contact region 99 on the outside surface 9. Preferably, the source wiring electrode 114 covers an entire region of the side wall structure 13 and an entire region of the outer contact region 99 along its entire periphery. The source wiring electrode 114 enters into the contact opening 102 from above the second inorganic film 29 and is electrically connected to the outer contact region 99. The source wiring electrode 114 transmits a source potential applied to the source main surface electrode 112 to the plurality of outer contact regions 99.

The SiC semiconductor device SD includes the above-described organic film 33 which selectively covers the second inorganic film 29 and the first main surface electrode 32. The organic film 33 has a plurality of pad openings 35. The plurality of pad openings 35 include a gate pad opening 115 and a source pad opening 116. The gate pad opening 115 exposes an inner portion of the gate main surface electrode 111. The source pad opening 116 exposes an inner portion of the source main surface electrode 112.

The SiC semiconductor device SD includes the above-described second main surface electrode 36 which covers the second main surface 6. The second main surface electrode 36 may be referred to as a drain electrode. The second main surface electrode 36 covers an entire region of the second main surface 6 and is continuous with the peripheral edge of the second main surface 6 (first to fourth side surfaces 7A to 7D). The second main surface electrode 36 forms an ohmic contact with the first semiconductor region 81 (second main surface 6).

FIG. 16B is a cross-sectional view which shows a cross-sectional structure along line XVI-XVI shown in FIG. 15 with the fifth projecting structure 20E. The same reference sign is hereinafter given to the structure corresponding to the structure described in FIG. 14 to FIG. 16A and a description thereof is omitted. With reference to FIG. 16B, the SiC semiconductor device SD has the fifth projecting structure 20E in place of the first to fourth projecting structures 20D. As with the case shown in FIG. 16A, the SiC semiconductor device SD includes an outer contact region 99, an outer well region 100, and at least one field region 101 (in this embodiment, a plurality of field regions 101) on an outside surface 9 side.

The plurality of field regions 101 are formed in a region between the active surface 8 and the fifth projecting structure 20E at intervals from the active surface 8 and the fifth projecting structure 20E in plan view. At least one field region 101 may overlap the first inorganic film 26 in plan view. When the fifth projecting structure 20E is adopted, none of a floating body region 95, a floating source region 96, a floating well region 97, or a second floating well region 98 is formed.

In the SiC semiconductor device SD, the side wall structure 13 may be a side wall wiring which is electrically connected to a trench source structure 89 (source electrode 92). In this case, the trench source structure 89 may penetrate through at least one of first to fourth connecting surfaces 10A to 10D. In this case, the side wall structure 13 may be connected to the trench source structure 89 in the first to fourth connecting surfaces 10A to 10D. Further, in this case, a source electrode 92 may be integral with the side wall structure 13.

In the SiC semiconductor device SD, an SiC-MISFET which does not have the trench source structure 89 may be adopted. Further, a planar gate type SiC-MISFET may be adopted in the SiC semiconductor device SD.

The present invention can be implemented in yet other embodiments.

For example, the first to fifth projecting structures 20A to 20E may be combined in an arbitrary mode among them. That is, an SiC semiconductor device which includes at least two of the first to fifth projecting structures 20A to 20E at the same time may be adopted. Further, an SiC semiconductor device which includes a projecting structure that includes at least two features among the features of the first to fifth projecting structures 20A to 20E at the same time may be adopted.

In each of the embodiments described above, a description has been given of an example in which a single one of the first to fifth projecting structures 20A to 20E is formed at the outside surface 9. However, a plurality of the first to fifth projecting structures 20A to 20E may be formed in each of the embodiments described above. The plurality of first to fifth projecting structures 20A to 20E may be formed at intervals from the active surface 8 side to the outside surface 9 side or may be formed at intervals along the active surface 8 such as to surround the active surface 8 in plan view.

In each of the embodiments described above, the opening 30 may penetrate through the mesa insulating film 25 to expose the top surface 22 (SiC chip 2) of the mesa portion 21. In this case, the organic film 33 directly covers the top surface 22 of the mesa portion 21 inside the opening 30.

In each of the embodiments described above, an SiC-SBD may be adopted as the functional device. In this case, the first main surface electrode 32 is formed as a cathode electrode which forms a Schottky junction with the SiC chip 2 (SiC epitaxial layer 4). Further, the second main surface electrode 36 is formed as an anode electrode which forms an ohmic contact with the SiC chip 2 (SiC substrate 3).

In each of the embodiments described above, a description has been given of an example in which the outside surface 9 is depressed in the thickness direction of the SiC chip 2 (on the second main surface 6 side). However, the outside surface 9 which is located at the same plane as the active surface 8 may be formed.

In each of the embodiments described above, a description has been given of an example in which the first direction X is the m-axis direction of an SiC monocrystal and the second direction Y is the a-axis direction of the SiC monocrystal, however, the first direction X may be the a-axis direction of the SiC monocrystal and the second direction Y may be the m-axis direction of the SiC monocrystal. That is, the first side surface 7A and the second side surface 7B may be formed by m-planes of the SiC monocrystal, and the third side surface 7C and the fourth side surface 7D may be formed by a-planes of the SiC monocrystal. In this case, the off direction may be the a-axis direction of the SiC monocrystal. A specific arrangement of this case is obtained by replacing the m-axis direction pertaining to the first direction X with the a-axis direction and replacing the a-axis direction pertaining to the second direction Y with the m-axis direction in the description above and the attached drawings.

In each of the embodiments described above, in place of the SiC chip 2, a WBG semiconductor chip which is constituted of a WBG (Wide Band Gap) semiconductor other than SiC may be adopted. The WBG semiconductor is a semiconductor having a band gap exceeding a band gap of Si (silicon). A GaAs (gallium arsenide), a GaN (gallium nitride), a diamond, etc. are exemplified as the WBG semiconductor. As a matter of course, in each of the embodiments described above, an Si chip may be adopted in place of the SiC chip 2.

In each of the embodiments described above, a description has been given of an example in which the first conductive type is the n-type and the second conductive type is the p-type, however, the first conductive type may be the p-type and the second conductive type may be the n-type. A specific arrangement of this case is obtained by replacing the n-type region with the p-type region and replacing the p-type region with the n-type region in the description above and the attached drawings.

Examples of features extracted from this description and drawings are indicated below. Each of [A1] to [A32], [B1] to [B29], [C1] to [C30], [D1] to [D40], [E1] to [E33], and [F1] to [F29] indicated below provides a semiconductor device capable of improving reliability. Although alphanumeric characters within parentheses in the following express corresponding components, etc., in the embodiments described above, these are not meant to limit the scopes of the respective Clauses to the embodiments.

[A1] A semiconductor device (1, 41, 51, 61, 71) comprising: a chip (2) which has a first main surface (5) on one side and a second main surface (6) on the other side and which includes an active surface (8) set at an inner portion of the first main surface (5) and an outside surface (9) set at a peripheral edge portion of the first main surface (5); a functional device which is formed at the active surface (8) side; a projecting structure (20A, 20B, 20C, 20D, 20E (hereinafter, simply referred to as "20A to 20E")) which includes an inorganic substance and projects at the outside surface (9) side; and an organic film (33) which covers the projecting structure (20A to 20E).

[A2] The semiconductor device (1, 41, 51, 61, 71) according to A1, wherein the projecting structure (20A to 20E) is formed in an electrically floating state.

[A3] The semiconductor device (1, 41, 51, 61, 71) according to A1 or A2, wherein a nitride film is not interposed between the projecting structure (20A to 20E) and the organic film (33).

[A4] The semiconductor device (1, 41, 51, 61, 71) according to any one of A1 to A3, wherein a nitride film is not interposed between the outside surface (9) and the organic film (33).

[A5] The semiconductor device (1, 41, 51, 61, 71) according to any one of A1 to A4, wherein the projecting structure (20A to 20E) does not have a nitride film.

[A6] The semiconductor device (1, 41, 51, 61, 71) according to any one of A1 to A5, wherein the projecting structure (20A to 20E) is constituted of an inorganic substance.

[A7] The semiconductor device (1, 41, 51, 61, 71) according to any one of A1 to A6, wherein a metal film is not formed in a region between a peripheral edge of the chip (2) and the projecting structure (20A to 20E) in plan view.

[A8] The semiconductor device (1, 41, 51, 61, 71) according to any one of A1 to A7, wherein the projecting structure (20A to 20E) is formed at intervals from the peripheral edge of the chip (2) and the active surface (8) in plan view.

[A9] The semiconductor device (1, 41, 51, 61, 71) according to any one of A1 to A8, wherein the projecting structure (20A to 20E) has a first side at the active surface (8) side and a second side at the peripheral edge side of the chip (2), and the organic film (33) covers the projecting structure (20A to 20E) such as to cover both of the first side and the second side in plan view.

[A10] The semiconductor device (1, 41, 51, 61, 71) according to any one of A1 to A9, wherein the organic film (33) covers an entire region of the projecting structure (20A to 20E) in plan view.

[A11] The semiconductor device (1, 41, 51, 61, 71) according to any one of A1 to A10, wherein the projecting structure (20A to 20E) is formed in a band shape extending along the active surface (8) in plan view.

[A12] The semiconductor device (1, 41, 51, 61, 71) according to any one of A1 to A11, wherein the projecting structure (20A to 20E) surrounds the active surface (8) in plan view.

[A13] The semiconductor device (1, 41, 51, 61, 71) according to any one of A1 to A12, wherein the projecting structure (20A to 20E) is formed in an endless shape in plan view.

[A14] The semiconductor device (1, 41, 51, 61, 71) according to any one of A1 to A13, wherein the organic film (33) covers a portion of the active surface (8) in plan view.

[A15] The semiconductor device (1, 41, 51, 61, 71) according to any one of A1 to A14 further comprising: a main surface electrode (32) that covers the active surface (8) in plan view; wherein the organic film (33) covers a portion of the main surface electrode (32).

[A16] The semiconductor device (1, 41, 51, 61, 71) according to A15, wherein a nitride film is not interposed between the main surface electrode (32) and the organic film (33).

[A17] The semiconductor device (1, 41, 51, 61, 71) according to any one of A1 to A16, wherein the first main surface (5) includes the active surface (8), the outside surface (9) which is depressed to the second main surface (6) side with respect to the active surface (8), and a connecting surface (10A to 10D) which connects the active surface (8) and the outside surface (9), and has a mesa (11) which is demarcated by the active surface (8), the outside surface (9) and the connecting surface (10A to 10D), and the projecting structure (20A to 20E) faces the mesa (11) in a plane direction of the outside surface (9).

[A18] The semiconductor device (1, 41, 51, 61, 71) according to any one of A1 to A17, wherein the projecting structure (20A to 20E) includes at least one of a polysilicon and a silicon oxide.

[A19] The semiconductor device (1, 41, 51, 61, 71) according to any one of A1 to A18, wherein the functional device includes a Schottky barrier diode that is formed in the active surface (8).

[A20] The semiconductor device (1, 41, 51, 61, 71) according to any one of A1 to A19, wherein the functional device includes an insulated gate type transistor that is formed in the active surface (8).

[A21] The semiconductor device (1, 41, 51, 61, 71) according to any one of A1 to A20, wherein the chip (2) is constituted of an SiC chip (2).

[A22] The semiconductor device (1, 41, 51, 61, 71) according to A21, wherein the SiC chip (2) includes an SiC substrate (3) and an SiC epitaxial layer (4).

[A23] The semiconductor device (1, 41, 51, 61, 71) according to A22, wherein the SiC epitaxial layer (4) has an impurity concentration different from that of the SiC substrate (3).

[A24] The semiconductor device (1, 41, 51, 61, 71) according to any one of A1 to A23, wherein the semiconductor device (1, 41, 51, 61, 71) is constituted of an SiC semiconductor device (1, 41, 51, 61, 71).

[A25] A semiconductor device (1, 41, 51, 61, 71) comprising: a chip (2) which has a first main surface (5) on one side and a second main surface (6) on the other side; a mesa (11) which is demarcated in the first main surface (5) by an active surface (8) set at an inner portion of the first main surface (5), an outside surface (9) set at a peripheral edge portion of the first main surface (5) and depressed to the second main surface (6) side with respect to the active surface (8) and a connecting surface (10A to 10D) which connects the active surface (8) and the outside surface (9); a functional device which is formed at the active surface (8) side; a projecting structure (20A to 20E) which includes an inorganic substance, projects at the outside surface (9) side, and faces the mesa (11) in a plane direction of the outside surface (9); and an organic film (33) which covers the projecting structure (20A to 20E).

[A26] The semiconductor device (1, 41, 51, 61, 71) according to A25, wherein the chip (2) includes a semiconductor substrate (3) and an epitaxial layer (4) and includes the first main surface (5) formed by the epitaxial layer (4) and the second main surface (6) formed by the semiconductor substrate (3), and the mesa (11) is formed in the epitaxial layer (4).

[A27] The semiconductor device (1, 41, 51, 61, 71) according to A26, wherein the mesa (11) is formed only in the epitaxial layer (4).

[A28] The semiconductor device (1, 41, 51, 61, 71) according to any one of A25 to A27, wherein a nitride film is not formed in a region between the mesa (11) and the projecting structure (20A to 20E).

[A29] The semiconductor device (1, 41, 51, 61, 71) according to any one of A25 to A28, wherein a nitride film is not formed between the projecting structure (20A to 20E) and a peripheral edge portion of the first main surface (5).

[A30] The semiconductor device (1, 41, 51, 61, 71) according to any one of A25 to A29, wherein a nitride film that covers the projecting structure (20A to 20E) is not formed.

[A31] The semiconductor device (1, 41, 51, 61, 71) according to any one of A25 to A30 further comprising: a main surface electrode (32) that covers the active surface (8) in plan view; wherein the organic film (33) covers a portion of the main surface electrode (32).

[A32] The semiconductor device (1, 41, 51, 61, 71) according to A31, wherein a nitride film is not interposed between the main surface electrode (32) and the organic film (33).

[B1] A semiconductor device (1) comprising: a chip (2) which has a first main surface (5) on one side and a second main surface (6) on the other side and which includes an active surface (8) set at an inner portion of the first main surface (5) and an outside surface (9) set at a peripheral edge portion of the first main surface (5); a functional device which is formed at the active surface (8) side; a mesa portion (21) which is constituted of a portion of the chip (2) and formed at the outside surface (9) such as to project toward the opposite side of the second main surface (6); a first inorganic film (26) which covers at least a portion of the mesa portion (21); a second inorganic film (29) which covers at least a portion of the first inorganic film (26) and forms a projecting structure (20A) with the mesa portion (21) and the first inorganic film (26); and an organic film (33) which covers at least the second inorganic film (29).

[B2] A semiconductor device (1) comprising: a chip (2) which has a first main surface (5) on one side and a second main surface (6) on the other side and which includes an active surface (8) set at an inner portion of the first main surface (5) and an outside surface (9) set at a peripheral edge portion of the first main surface (5); a functional device which is formed at the active surface (8) side; a mesa portion (21) which is constituted of a portion of the chip (2) and formed at the outside surface (9) such as to project toward the opposite side of the second main surface (6); a first inorganic film (26) which covers at least a portion of the mesa portion (21); a second inorganic film (29) which is formed on the outside surface (9) at an interval from the first inorganic film (26) such as to form a gap (37) with the first inorganic film (26) and forms a projecting structure (20A) with the mesa portion (21) and the first inorganic film (26); and an organic film (33) which fills the gap (37) and covers the mesa portion (21), the first inorganic film (26) and the second inorganic film (29).

[B3] The semiconductor device (1) according to B1 or B2, wherein the second inorganic film (29) includes an inorganic substance different from the first inorganic film (26).

[B4] The semiconductor device (1) according to any one of B1 to B3, wherein the first inorganic film (26) is formed in an electrically floating state, and the second inorganic film (29) is formed in an electrically floating state.

[B5] The semiconductor device (1) according to any one of B1 to B4, wherein the first inorganic film (26) includes an inorganic substance other than a nitride, and the second inorganic film (29) includes an inorganic substance other than a nitride.

[B6] The semiconductor device (1) according to any one of B1 to B5, wherein a nitride film is not interposed between the second inorganic film (29) and the organic film (33).

[B7] The semiconductor device (1) according to any one of B1 to B6, wherein a nitride film is not interposed between the first inorganic film (26) and the organic film (33).

[B8] The semiconductor device (1) according to any one of B1 to B7, wherein a nitride film is not interposed between the mesa portion (21) and the organic film (33).

[B9] The semiconductor device (1) according to any one of B1 to B8, wherein a nitride film is not formed on a region between the active surface (8) and the mesa portion (21).

[B10] The semiconductor device (1) according to any one of B1 to B9, wherein a metal film is not formed in a region between a peripheral edge of the chip (2) and the mesa portion (21) in plan view.

[B11] The semiconductor device (1) according to any one of B1 to B10, wherein the mesa portion (21) is formed at intervals from the peripheral edge of the chip (2) and the active surface (8) in plan view.

[B12] The semiconductor device (1) according to any one of B1 to B11, wherein the mesa portion (21) has a first side at the active surface (8) side and a second side at the peripheral edge side of the chip (2), and the organic film (33) covers the mesa portion (21) such as to cover both of the first side and the second side in plan view.

[B13] The semiconductor device (1) according to any one of B1 to B12, wherein the organic film (33) covers an entire region of the mesa portion (21) in plan view.

[B14] The semiconductor device (1) according to any one of B1 to B13, wherein the mesa portion (21) is formed in a band shape extending along the active surface (8) in plan view.

[B15] The semiconductor device (1) according to any one of B1 to B14, wherein the mesa portion (21) surrounds the active surface (8) in plan view.

[B16] The semiconductor device (1) according to any one of B1 to B15, wherein the mesa portion (21) is formed in an endless shape in plan view.

[B17] The semiconductor device (1) according to any one of B1 to B16, wherein the organic film (33) covers a portion of the active surface (8) in plan view.

[B18] The semiconductor device (1) according to any one of B1 to B17 further comprising: a main surface electrode (32) that covers the active surface (8) in plan view; wherein the organic film (33) covers a portion of the main surface electrode (32).

[B19] The semiconductor device (1) according to B18, wherein a nitride film is not interposed between the main surface electrode (32) and the organic film (33).

[B20] The semiconductor device (1) according to any one of B1 to B19 further comprising: a mesa insulating film (25) that covers the mesa portion (21); wherein the first inorganic film (26) covers the mesa insulating film (25).

[B21] The semiconductor device (1) according to any one of B1 to B20, wherein the first main surface (5) includes the active surface (8), the outside surface (9) which is depressed to the second main surface (6) side with respect to the active surface (8), and a connecting surface (10A to 10D) which connects the active surface (8) and the outside surface (9), and has a mesa (11)

which is demarcated by the active surface (8), the outside surface (9) and the connecting surface (10A to 10D), and the mesa portion (21) faces the mesa (11) in a plane direction of the outside surface (9).

[B22] The semiconductor device (1) according to B21, wherein the mesa portion (21) has a top surface (22) which is located at the same plane as the active surface (8).

[B23] The semiconductor device (1) according to any one of B1 to B22, wherein the first inorganic film (26) includes a polysilicon film, and the second inorganic film (29) includes a silicon oxide film.

[B24] The semiconductor device (1) according to any one of B1 to B23, wherein the functional device includes a Schottky barrier diode that is formed in the active surface (8).

[B25] The semiconductor device (1) according to any one of B1 to B24, wherein the functional device includes an insulated gate type transistor that is formed in the active surface (8).

[B26] The semiconductor device (1) according to any one of B1 to B25, wherein the chip (2) is constituted of an SiC chip (2).

[B27] The semiconductor device (1) according to B26, wherein the SiC chip (2) includes an SiC substrate (3) and an SiC epitaxial layer (4), and the mesa portion (21) is constituted of a portion of the SiC epitaxial layer (4).

[B28] The semiconductor device (1) according to B27, wherein the SiC epitaxial layer (4) has an impurity concentration different from that of the SiC substrate (3).

[B29] The semiconductor device (1) according to any one of B1 to B28, wherein the semiconductor device (1) is constituted of an SiC semiconductor device (1).

[C1] A semiconductor device (41) comprising: a chip (2) which has a first main surface (5) on one side and a second main surface (6) on the other side and which includes an active surface (8) set at an inner portion of the first main surface (5) and an outside surface (9) set at a peripheral edge portion of the first main surface (5); a functional device which is formed at the active surface (8) side; a mesa portion (21) which is constituted of a portion of the chip (2), which is formed at the outside surface (9) such as to project toward the opposite side of the second main surface (6), and which has a top surface (22), a first wall surface (23) at the active surface (8) side, and a second wall surface (24) at the peripheral edge side of the outside surface (9); a first inorganic film (26) which covers the top surface (22), the first wall surface (23) and the second wall surface (24) as a film shape; a second inorganic film (29) which covers at least a portion of the first inorganic film (26) and forms a projecting structure (20B) with the mesa portion (21) and the first inorganic film (26); and an organic film (33) which covers at least the second inorganic film (29).

[C2] The semiconductor device (41) according to C1, wherein the first inorganic film (26) includes a top surface covering portion (42) which covers the top surface (22), a first covering portion (27) which covers the first wall surface (23), and a second covering portion (28) which covers the second wall surface (24), the second inorganic film (29) covers the first covering portion (27) and the second covering portion (28) such as to expose at least a portion of the top surface covering portion (42), and the organic film (33) is in contact with the top surface covering portion (42).

[C3] A semiconductor device (41) comprising: a chip (2) which has a first main surface (5) on one side and a second main surface (6) on the other side and which includes an active surface (8) set at an inner portion of the first main surface (5) and an outside surface (9) set at a peripheral edge portion of the first main surface (5); a functional device which is formed at the active surface (8) side; a mesa portion (21) which is constituted of a portion of the chip (2), which is formed at the outside surface (9) such as to project toward the opposite side of the second main surface (6), and which has a top surface (22), a first wall surface (23) at the active surface (8) side, and a second wall surface (24) at the peripheral edge side of the outside surface (9); a first inorganic film (26) which covers the top surface (22), the first wall surface (23) and the second wall surface (24) as a film shape; a second inorganic film (29) which is formed on the outside surface (9) at an interval from the first inorganic film (26) such as to form a gap (37) with the first inorganic film (26) and which forms a projecting structure (20B) with the mesa portion (21) and the first inorganic film (26); and an organic film (33) which fills the gap (37) and covers the mesa portion (21), the first inorganic film (26) and the second inorganic film (29).

[C4] The semiconductor device (41) according to any one of C1 to C3, wherein the second inorganic film (29) includes an inorganic substance different from the first inorganic film (26).

[C5] The semiconductor device (41) according to any one of C1 to C4, wherein the first inorganic film (26) is formed in an electrically floating state, and the second inorganic film (29) is formed in an electrically floating state.

[C6] The semiconductor device (41) according to any one of C1 to C5, wherein the first inorganic film (26) includes an inorganic substance other than a nitride and the second inorganic film (29) includes an inorganic substance other than a nitride.

[C7] The semiconductor device (41) according to any one of C1 to C6, wherein a nitride film is not interposed between the second inorganic film (29) and the organic film (33).

[C8] The semiconductor device (41) according to any one of C1 to C7, wherein a nitride film is not interposed between the first inorganic film (26) and the organic film (33).

[C9] The semiconductor device (41) according to any one of C1 to C8, wherein a nitride film is not interposed between the mesa portion (21) and the organic film (33).

[C10] The semiconductor device (41) according to any one of C1 to C9, wherein a nitride film is not formed on a region between the active surface (8) and the mesa portion (21).

[C11] The semiconductor device (41) according to any one of C1 to C10, wherein a metal film is not formed in a region between a peripheral edge of the chip (2) and the mesa portion (21) in plan view.

[C12] The semiconductor device (41) according to any one of C1 to C11, wherein the mesa portion (21) is formed at intervals from the peripheral edge of the chip (2) and the active surface (8) in plan view.

[C13] The semiconductor device (41) according to any one of C1 to C12, wherein the organic film (33) covers the mesa portion (21) such as to cover the top surface (22), the first wall surface (23) and the second wall surface (24) in plan view.

[C14] The semiconductor device (41) according to any one of C1 to C13, wherein the organic film (33) covers an entire region of the mesa portion (21) in plan view.

[C15] The semiconductor device (41) according to any one of C1 to C14, wherein the mesa portion (21) is formed in a band shape extending along the active surface (8) in plan view.

[C16] The semiconductor device (41) according to any one of C1 to C15, wherein the mesa portion (21) surrounds the active surface (8) in plan view.

[C17] The semiconductor device (41) according to any one of C1 to C16, wherein the mesa portion (21) is formed in an endless shape in plan view.

[C18] The semiconductor device (41) according to any one of C1 to C17, wherein the organic film (33) covers a portion of the active surface (8) in plan view.

[C19] The semiconductor device (41) according to any one of C1 to C18 further comprising: a main surface electrode (32) that covers the active surface (8) in plan view; wherein the organic film (33) covers a portion of the main surface electrode (32).

[C20] The semiconductor device (41) according to C19, wherein a nitride film is not interposed between the main surface electrode (32) and the organic film (33).

[C21] The semiconductor device (41) according to any one of C1 to C20 further comprising: a mesa insulating film (25) that covers the mesa portion (21); wherein the first inorganic film (26) covers the mesa insulating film (25).

[C22] The semiconductor device (41) according to any one of C1 to C21, wherein the first main surface (5) includes the active surface (8), the outside surface (9) which is depressed to the second main surface (6) side with respect to the active surface (8), and a connecting surface (10A to 10D) which connects the active surface (8) and the outside surface (9), and has a mesa (11) which is demarcated by the active surface (8), the outside surface (9) and the connecting surface (10A to 10D), and the mesa portion (21) faces the mesa (11) in a plane direction of the outside surface (9).

[C23] The semiconductor device (41) according to C22, wherein the top surface (22) is located at the same plane as the active surface (8).

[C24] The semiconductor device (41) according to any one of C1 to C23, wherein the first inorganic film (26) includes a polysilicon film, and the second inorganic film (29) includes a silicon oxide film.

[C25] The semiconductor device (41) according to any one of C1 to C24, wherein the functional device includes a Schottky barrier diode that is formed in the active surface (8).

[C26] The semiconductor device (41) according to any one of C1 to C25, wherein the functional device includes an insulated gate type transistor that is formed in the active surface (8).

[C27] The semiconductor device (41) according to any one of C1 to C26, wherein the chip (2) is constituted of an SiC chip (2).

[C28] The semiconductor device (41) according to C27, wherein the SiC chip (2) includes an SiC substrate (3) and an SiC epitaxial layer (4), and the mesa portion (21) is constituted of a portion of the SiC epitaxial layer (4).

[C29] The semiconductor device (41) according to C28, wherein the SiC epitaxial layer (4) has an impurity concentration different from that of the SiC substrate (3).

[C30] The semiconductor device (41) according to any one of C1 to C29, wherein the semiconductor device (41) is constituted of an SiC semiconductor device (41).

[D1] A semiconductor device (51) comprising: a chip (2) which has a first main surface (5) on one side and a second main surface (6) on the other side and which includes an active surface (8) set at an inner portion of the first main surface (5) and an outside surface (9) set at a peripheral edge portion of the first main surface (5); a functional device which is formed at the active surface (8) side; a mesa portion (21) which is constituted of a portion of the chip (2), which is formed at the outside surface (9) such as to project toward the opposite side of the second main surface (6) and which has a top surface (22); a trench (53) which is formed in the top surface (22); a first inorganic film (26) which covers at least a portion of the mesa portion (21); a second inorganic film (29) which covers at least a portion of the first inorganic film (26) and forms a projecting structure (20C) with the mesa portion (21) and the first inorganic film (26); and an organic film (33) which covers the mesa portion (21) such as to hide the trench (53) in plan view.

[D2] A semiconductor device (51) comprising: a chip (2) which has a first main surface (5) on one side and a second main surface (6) on the other side and which includes an active surface (8) set at an inner portion of the first main surface (5) and an outside surface (9) set at a peripheral edge portion of the first main surface (5); a functional device which is formed at the active surface (8) side; a mesa portion (21) which is constituted of a portion of the chip (2), which is formed at the outside surface (9) such as to project toward the opposite side of the second main surface (6) and which has a top surface (22); a trench (53) which is formed in the top surface (22); a first inorganic film (26) which covers at least a portion of the mesa portion (21); a second inorganic film (29) which is formed on the outside surface (9) at an interval from the first inorganic film (26) such as to form a gap (37) with the first inorganic film (26) and forms a projecting structure (20C) with the mesa portion (21) and the first inorganic film (26); and an organic film (33) which fills the gap (37), which covers the mesa portion (21), the first inorganic film (26) and the second inorganic film (29) and which hides the trench (53) in plan view.

[D3] The semiconductor device (51) according to D1 or D2 further comprising: a trench structure (52) that includes the trench (53) and an embedded material (54) that is embedded in the trench (53).

[D4] The semiconductor device (51) according to D3, wherein the embedded material (54) includes an insulating film (55) that covers a wall surface of the trench (53) and an inorganic embedded material (56) that is embedded in the trench (53) across the insulating film (55).

[D5] The semiconductor device (51) according to D4, wherein the inorganic embedded material (56) is embedded in the trench (53) at an interval from the opening side of the trench (53) to the bottom wall side thereof such as to expose the insulating film (55) inside the trench (53).

[D6] The semiconductor device (51) according to D4 or D5, wherein the insulating film (55) is constituted of an oxide film, and the inorganic embedded material (56) is constituted of a polysilicon.

[D7] The semiconductor device (51) according to any one of D3 to D6, wherein the first inorganic film (26) exposes the trench structure (52), the second inorganic film (29) exposes the trench structure (52), and the organic film (33) is in contact with the embedded material (54).

[D8] The semiconductor device (51) according to D1 or D2 further comprising: a trench structure (52) that includes the trench (53) and an insulating film (55) that covers a wall surface of the trench (53).

[D9] The semiconductor device (51) according to D8, wherein the insulating film (55) is constituted of an oxide film.

[D10] The semiconductor device (51) according to D8 or D9, wherein the first inorganic film (26) exposes the trench structure (52), the second inorganic film (29) exposes the trench structure (52), and the organic film (33) enters into the trench (53) from above the top surface (22).

[D11] The semiconductor device (51) according to D1 or D2 further comprising: a trench structure (52) including the trench (53), an insulating film (55) that covers a wall surface of the trench (53) at the bottom wall side thereof such as to expose a wall surface of the trench (53) at the opening side thereof; and an inorganic embedded material (56) that is embedded in the bottom wall side of the trench (53) across the insulating film (55) such as to expose the wall surface of the trench (53) at the opening side thereof.

[D12] The semiconductor device (51) according to D11, wherein the insulating film (55) is constituted of an oxide film, and the inorganic embedded material (56) is constituted of a polysilicon.

[D13] The semiconductor device (51) according to D11 or D12, wherein the first inorganic film (26) exposes the trench structure (52), the second inorganic film (29) exposes the trench structure (52), and the organic film (33) enters into the trench (53) from above the top surface (22).

[D14] The semiconductor device (51) according to any one of D1 to D13, wherein the second inorganic film (29) includes an inorganic substance different from the first inorganic film (26).

[D15] The semiconductor device (51) according to any one of D1 to D14, wherein the first inorganic film (26) is formed in an electrically floating state, and the second inorganic film (29) is formed in an electrically floating state.

[D16] The semiconductor device (51) according to any one of D1 to D15, wherein the first inorganic film (26) includes an inorganic substance other than a nitride, and the second inorganic film (29) includes an inorganic substance other than a nitride.

[D17] The semiconductor device (51) according to any one of D1 to D16, wherein a nitride film is not interposed between the second inorganic film (29) and the organic film (33).

[D18] The semiconductor device (51) according to any one of D1 to D17, wherein a nitride film is not interposed between the first inorganic film (26) and the organic film (33).

[D19] The semiconductor device (51) according to any one of D1 to D18, wherein a nitride film is not interposed between the mesa portion (21) and the organic film (33).

[D20] The semiconductor device (51) according to any one of D1 to D19, wherein a nitride film is not formed on a region between the active surface (8) and the mesa portion (21).

[D21] The semiconductor device (51) according to any one of D1 to D20, wherein a metal film is not formed in a region between a peripheral edge of the chip (2) and the mesa portion (21) in plan view.

[D22] The semiconductor device (51) according to any one of D1 to D21, wherein the mesa portion (21) is formed at intervals from the peripheral edge of the chip (2) and the active surface (8) in plan view.

[D23] The semiconductor device (51) according to any one of D1 to D22, wherein the mesa portion (21) has a first side at the active surface (8) side and a second side at the peripheral edge side of the chip (2), and the organic film (33) covers the mesa portion (21) such as to cover both of the first side and the second side in plan view.

[D24] The semiconductor device (51) according to any one of D1 to D23, wherein the organic film (33) covers an entire region of the mesa portion (21) in plan view.

[D25] The semiconductor device (51) according to any one of D1 to D24, wherein the mesa portion (21) is formed in a band shape extending along the active surface (8) in plan view.

[D26] The semiconductor device (51) according to any one of D1 to D25, wherein the mesa portion (21) surrounds the active surface (8) in plan view.

[D27] The semiconductor device (51) according to any one of D1 to D26, wherein the mesa portion (21) is formed in an endless shape in plan view.

[D28] The semiconductor device (51) according to any one of D1 to D27, wherein the organic film (33) covers a portion of the active surface (8) in plan view.

[D29] The semiconductor device (51) according to any one of D1 to D28 further comprising: a main surface electrode (32) that covers the active surface (8) in plan view; wherein the organic film (33) covers a portion of the main surface electrode (32).

[D30] The semiconductor device (51) according to D29, wherein a nitride film is not interposed between the main surface electrode (32) and the organic film (33).

[D31] The semiconductor device (51) according to any one of D1 to D30 further comprising: a mesa insulating film (25) that covers the mesa portion (21); wherein the first inorganic film (26) covers the mesa insulating film (25).

[D32] The semiconductor device (51) according to any one of D1 to D31, wherein the first main surface (5) includes the active surface (8), the outside surface (9) which is depressed to the second main surface (6) side with respect to the active surface (8), and a connecting surface (10A to 10D) which connects the active surface (8) and the outside surface (9), and has a mesa (11) which is demarcated by the active surface (8), the outside surface (9) and the connecting surface (10A to 10D), and the mesa portion (21) faces the mesa (11) in a plane direction of the outside surface (9).

[D33] The semiconductor device (51) according to D32, wherein the top surface (22) is located at the same plane as the active surface (8).

[D34] The semiconductor device (51) according to any one of D1 to D33, wherein the first inorganic film (26) includes a polysilicon film, and the second inorganic film (29) includes a silicon oxide film.

[D35] The semiconductor device (51) according to any one of D1 to D34, wherein the functional device includes a Schottky barrier diode that is formed in the active surface (8).

[D36] The semiconductor device (51) according to any one of D1 to D35, wherein the functional device includes an insulated gate type transistor that is formed in the active surface (8).

[D37] The semiconductor device (51) according to any one of D1 to D36, wherein the chip (2) is constituted of an SiC chip (2).

[D38] The semiconductor device (51) according to D37, wherein the SiC chip (2) includes an SiC substrate (3) and an SiC epitaxial layer (4), and the mesa portion (21) is constituted of a portion of the SiC epitaxial layer (4).

[D39] The semiconductor device (51) according to D38, wherein the SiC epitaxial layer (4) has an impurity concentration different from that of the SiC substrate (3).

[D40] The semiconductor device (51) according to any one of D1 to D39, wherein the semiconductor device (51) is constituted of an SiC semiconductor device (51).

[E1] A semiconductor device (61) comprising: a chip (2) which has a first main surface (5) on one side and a second main surface (6) on the other side and which includes an active surface (8) set at an inner portion of the first main surface (5) and an outside surface (9) set at a peripheral edge portion of the first main surface (5); a functional device which is formed at the active surface (8) side; a mesa portion (21) which is constituted of a portion of the chip (2), which is formed at the outside surface (9) such as to project toward the opposite side of the second main surface (6) and which has a top surface (22); a trench structure (52) which includes a trench (53) that is formed in the top surface (22), an insulating film (55) that covers an inner wall of the trench (53) and an inorganic embedded material (56) that is embedded in the trench (53) across the insulating film (55); a first inorganic film (26) which covers the top surface (22) such as to hide the trench structure; a second inorganic film (29) which covers at least a portion of the first inorganic film (26) and forms a projecting structure (20D) with the mesa portion (21) and the first inorganic film (26); and an organic film (33) that covers the mesa portion (21) such as to hide the trench structure (52) in plan view.

[E2] A semiconductor device (61) comprising: a chip (2) which has a first main surface (5) on one side and a second main surface (6) on the other side and which includes an active surface (8) set at an inner portion of the first main surface (5) and an outside surface (9) set at a peripheral edge portion of the first main surface (5); a functional device which is formed at the active surface (8) side; a mesa portion (21) which is constituted of a portion of the chip (2), which is formed at the outside surface (9) such as to project toward the opposite side of the second main surface (6) and which has a top surface (22); a trench structure (52) which includes a trench (53) that is formed in the top surface (22), an insulating film (55) that covers an inner wall of the trench (53) and an inorganic embedded material (56) that is embedded in the trench (53) across the insulating film (55); a first inorganic film (26) which covers the top surface (22); a second inorganic film (29) which is formed on the outside surface (9) at an interval from the first inorganic film (26) such as to form a gap (37) with the first inorganic film (26) and forms a projecting structure (20D) with the mesa portion (21) and the first inorganic film (26); and an organic film (33) which fills the gap (37), which covers the mesa portion (21), the first inorganic film (26) and the second inorganic film (29), and which hides the trench structure (52) in plan view.

[E3] The semiconductor device (61) according to E1 or E2, wherein the first inorganic film (26) is constituted of the same material as the inorganic embedded material (56) and integrally formed with the inorganic embedded material (56).

[E4] The semiconductor device (61) according to any one of E1 to E3, wherein the mesa portion (21) has a first wall surface (23) at the active surface (8) side, and a second wall surface (24) at the peripheral edge side of the outside surface (9), and the first inorganic film (26) covers the top surface (22), the first wall surface (23) and the second wall surface (24) as a film shape.

[E5] The semiconductor device (61) according to any one of E1 to E4, wherein the insulating film (55) is constituted of an oxide film, the inorganic embedded material (56) is constituted of a polysilicon, and the first inorganic film (26) is constituted of a polysilicon.

[E6] The semiconductor device (61) according to any one of E1 to E5, wherein the organic film (33) is in contact with the first inorganic film (26).

[E7] The semiconductor device (61) according to any one of E1 to E6, wherein the second inorganic film (29) includes an inorganic substance different from the first inorganic film (26).

[E8] The semiconductor device (61) according to any one of E1 to E7, wherein the first inorganic film (26) is formed in an electrically floating state, and the second inorganic film (29) is formed in an electrically floating state.

[E9] The semiconductor device (61) according to any one of E1 to E8, wherein the first inorganic film (26) includes an inorganic substance other than a nitride, and the second inorganic film (29) includes an inorganic substance other than a nitride.

[E10] The semiconductor device (61) according to any one of E1 to E9, wherein a nitride film is not interposed between the second inorganic film (29) and the organic film (33).

[E11] The semiconductor device (61) according to any one of E1 to E10, wherein a nitride film is not interposed between the first inorganic film (26) and the organic film (33).

[E12] The semiconductor device (61) according to any one of E1 to E11, wherein a nitride film is not interposed between the mesa portion (21) and the organic film (33).

[E13] The semiconductor device (61) according to any one of E1 to E12, wherein a nitride film is not formed on a region between the active surface (8) and the mesa portion (21).

[E14] The semiconductor device (61) according to any one of E1 to E13, wherein a metal film is not formed in a region between a peripheral edge of the chip (2) and the mesa portion (21) in plan view.

[E15] The semiconductor device (61) according to any one of E1 to E14, wherein the mesa portion (21) is formed at intervals from the peripheral edge of the chip (2) and the active surface (8) in plan view.

[E16] The semiconductor device (61) according to any one of E1 to E15, wherein the mesa portion (21) has a first side at the active surface (8) side and a second side at the peripheral edge side of the chip (2), and the organic film (33) covers the mesa portion (21) such as to cover both of the first side and the second side in plan view.

[E17] The semiconductor device (61) according to any one of E1 to E16, wherein the organic film (33) covers an entire region of the mesa portion (21) in plan view.

[E18] The semiconductor device (61) according to any one of E1 to E17, wherein the mesa portion (21) is formed in a band shape extending along the active surface (8) in plan view.

[E19] The semiconductor device (61) according to any one of E1 to E18, wherein the mesa portion (21) surrounds the active surface (8) in plan view.

[E20] The semiconductor device (61) according to any one of E1 to E19, wherein the mesa portion (21) is formed in an endless shape in plan view.

[E21] The semiconductor device (61) according to any one of E1 to E20, wherein the organic film (33) covers a portion of the active surface (8) in plan view.

[E22] The semiconductor device (61) according to any one of E1 to E21 further comprising: a main surface electrode (32) that covers the active surface (8) in plan view; wherein the organic film (33) covers a portion of the main surface electrode (32).

[E23] The semiconductor device (61) according to E22, wherein a nitride film is not interposed between the main surface electrode (32) and the organic film (33).

[E24] The semiconductor device (61) according to any one of E1 to E23 further comprising: a mesa insulating film (25) that covers the mesa portion (21); wherein the first inorganic film (26) covers the mesa insulating film (25).

[E25] The semiconductor device (61) according to any one of E1 to E24, wherein the first main surface (5) includes the active surface (8), the outside surface (9) which is depressed to the second main surface (6) side with respect to the active surface (8), and a connecting surface (10A to 10D) which connects the active surface (8) and the outside surface (9), and has a mesa (11) which is demarcated by the active surface (8), the outside surface (9) and the connecting surface (10A to 10D), and the mesa portion (21) faces the mesa (11) in a plane direction of the outside surface (9).

[E26] The semiconductor device (61) according to E25, wherein the top surface (22) is located at the same plane as the active surface (8).

[E27] The semiconductor device (61) according to any one of E1 to E26, wherein the second inorganic film (29) includes a silicon oxide film.

[E28] The semiconductor device (61) according to any one of E1 to E27, wherein the functional device includes a Schottky barrier diode that is formed in the active surface (8).

[E29] The semiconductor device (61) according to any one of E1 to E28, wherein the functional device includes an insulated gate type transistor that is formed in the active surface (8).

[E30] The semiconductor device (61) according to any one of E1 to E29, wherein the chip (2) is constituted of an SiC chip (2).

[E31] The semiconductor device (61) according to E30, wherein the SiC chip (2) includes an SiC substrate (3) and an SiC epitaxial layer (4), and the mesa portion (21) is constituted of a portion of the SiC epitaxial layer (4).

[E32] The semiconductor device (61) according to E31, wherein the SiC epitaxial layer (4) has an impurity concentration different from that of the SiC substrate (3).

[E33] The semiconductor device (61) according to any one of E1 to E32, wherein the semiconductor device (61) is constituted of an SiC semiconductor device (61).

[F1] A semiconductor device (71) comprising: a chip (2) which has a first main surface (5) on one side and a second main surface (6) on the other side and which includes an active surface (8) set at an inner portion of the first main surface (5) and an outside surface (9) set at a peripheral edge portion of the first main surface (5); a functional device which is formed at the active surface (8) side; a first inorganic film (26) which is formed on the outside surface (9); a second inorganic film (29) which covers at least a portion of the first inorganic film (26) and forms a projecting structure (20E) with the first inorganic film (26); and an organic film (33) which covers at least the second inorganic film (29).

[F2] A semiconductor device (71) comprising: a chip (2) which has a first main surface (5) on one side and a second main surface (6) on the other side and which includes an active surface (8) set at an inner portion of the first main surface (5) and an outside surface (9) set at a peripheral edge portion of the first main surface (5); a functional device which is formed at the active surface (8) side; a first inorganic film (26) which is formed on the outside surface (9); a second inorganic film (29) which is formed on the outside surface (9) at an interval from the first inorganic film (26) such as to form a gap (37) with the first inorganic film (26) and forms a projecting structure (20E) with the first inorganic film (26); and an organic film (33) which fills the gap (37) and covers the first inorganic film (26) and the second inorganic film (29).

[F3] The semiconductor device (71) according to F1 or F2, wherein the second inorganic film (29) includes an inorganic substance different from the first inorganic film (26).

[F4] The semiconductor device (71) according to any one of F1 to F3, wherein the first inorganic film (26) is formed in an electrically floating state, and the second inorganic film (29) is formed in an electrically floating state.

[F5] The semiconductor device (71) according to any one of F1 to F4, wherein the first inorganic film (26) includes an inorganic substance other than a nitride, and the second inorganic film (29) includes an inorganic substance other than a nitride.

[F6] The semiconductor device (71) according to any one of F1 to F5, wherein a nitride film is not interposed between the second inorganic film (29) and the organic film (33).

[F7] The semiconductor device (71) according to any one of F1 to F6, wherein a nitride film is not interposed between the first inorganic film (26) and the organic film (33).

[F8] The semiconductor device (71) according to any one of F1 to F7, wherein a nitride film is not interposed between the outside surface (9) and the organic film (33).

[F9] The semiconductor device (71) according to any one of F1 to F8, wherein a metal film is not formed in a region between a peripheral edge of the chip (2) and the first inorganic film (26) in plan view.

[F10] The semiconductor device (71) according to any one of F1 to F9, wherein the first inorganic film (26) is formed at intervals from the peripheral edge of the chip (2) and the active surface (8) in plan view.

[F11] The semiconductor device (71) according to any one of F1 to F10, wherein the first inorganic film (26) has a first side at the active surface (8) side and a second side at the peripheral edge side of the chip (2), and the organic film (33) covers the first inorganic film (26) such as to cover both of the first side and the second side in plan view.

[F12] The semiconductor device (71) according to any one of F1 to F11, wherein the organic film (33) covers an entire region of the first inorganic film (26) in plan view.

[F13] The semiconductor device (71) according to any one of F1 to F12, wherein the first inorganic film (26) is formed in a band shape extending along the active surface (8) in plan view.

[F14] The semiconductor device (71) according to any one of F1 to F13, wherein the first inorganic film (26) surrounds the active surface (8) in plan view.

[F15] The semiconductor device (71) according to any one of F1 to F14, wherein the first inorganic film (26) is formed in an endless shape in plan view.

[F16] The semiconductor device (71) according to any one of F1 to F15, wherein the organic film (33) covers a portion of the active surface (8) in plan view.

[F17] The semiconductor device (71) according to any one of F1 to F16 further comprising: a main surface electrode (32) that covers the active surface (8) in plan view; wherein the organic film (33) covers a portion of the main surface electrode (32).

[F18] The semiconductor device (71) according to F17, wherein a nitride film is not interposed between the main surface electrode (32) and the organic film (33).

[F19] The semiconductor device (71) according to any one of F1 to F18 further comprising: a main surface insulating film (12) that covers the outside surface (9); wherein the first inorganic film (26) is formed on the main surface insulating film (12).

[F20] The semiconductor device (71) according to any one of F1 to F19, wherein the first main surface (5) includes the active surface (8), the outside surface (9) which is depressed to the second main surface (6) side with respect to the active surface (8), and a connecting surface (10A to 10D) which connects the active surface (8) and the outside surface (9), and has a mesa (11) which is demarcated by the active surface (8), the outside surface (9) and the connecting surface (10A to 10D), and the first inorganic film (26) faces the mesa (11) in a plane direction of the outside surface (9).

[F21] The semiconductor device (71) according to F20, wherein the first inorganic film (26) has a thickness less than a thickness of the mesa (11).

[F22] The semiconductor device (71) according to F20 or F21, wherein when a straight line extending horizontally from the active surface (8) in a cross-sectional view is set, the second inorganic film (29) covers the first inorganic film (26) at an interval from the straight line to the outside surface (9) side.

[F23] The semiconductor device (71) according to any one of F1 to F22, wherein the first inorganic film (26) includes a polysilicon film, and the second inorganic film (29) includes a silicon oxide film.

[F24] The semiconductor device (71) according to any one of F1 to F23, wherein the functional device includes a Schottky barrier diode that is formed in the active surface (8).

[F25] The semiconductor device (71) according to any one of F1 to F24, wherein the functional device includes an insulated gate type transistor that is formed in the active surface (8).

[F26] The semiconductor device (71) according to any one of F1 to F25, wherein the chip (2) is constituted of an SiC chip (2).

[F27] The semiconductor device (71) according to F26, wherein the SiC chip (2) includes an SiC substrate (3) and an SiC epitaxial layer (4).

[F28] The semiconductor device (71) according to F27, wherein the SiC epitaxial layer (4) has an impurity concentration different from that of the SiC substrate (3).

[F29] The semiconductor device (71) according to any one of F1 to F28, wherein the semiconductor device (71) is constituted of an SiC semiconductor device (71).

While the embodiments of the present invention have been described in detail, these are merely specific examples used to clarify the technical contents of the present invention, and the present invention should not be interpreted as being limited to these specific examples and the scope of the present invention is to be limited by the appended claims.

REFERENCE SIGNS LIST

1 SiC semiconductor device (semiconductor device)
2 SiC chip (chip)
5 first main surface
6 second main surface
8 active surface
9 outside surface
10A first connecting surface
10B second connecting surface
100 third connecting surface
10D fourth connecting surface
11 active mesa (mesa)
20A first projecting structure
20B second projecting structure
20C third projecting structure
20D fourth projecting structure
20E fifth projecting structure
32 first main surface electrode (main surface electrode)
33 organic film
41 SiC semiconductor device (semiconductor device)
51 SiC semiconductor device (semiconductor device)
61 SiC semiconductor device (semiconductor device)
71 SiC semiconductor device (semiconductor device)

The invention claimed is:

1. A semiconductor device comprising:
a chip which has a first main surface on one side and a second main surface on the other side and which includes an active surface set at an inner portion of the first main surface and an outside surface set at a peripheral edge portion of the first main surface;
a functional device which is formed at the active surface side;
a projecting structure which includes an inorganic substance and projects at the outside surface side;
an inorganic film which is constituted of an inorganic insulator and covers the projecting structure so as to form a part of the projecting structure and has at least one opening which selectively exposes a top surface of the projecting structure; and
an organic film which covers the projecting structure and the inorganic film.

2. The semiconductor device according to claim 1, wherein the projecting structure is formed in an electrically floating state.

3. The semiconductor device according to claim 1, wherein a nitride film is not interposed between the projecting structure and the organic film.

4. The semiconductor device according to claim 1, wherein a nitride film is not interposed between the outside surface and the organic film.

5. The semiconductor device according to claim 1, wherein the projecting structure does not have a nitride film.

6. The semiconductor device according to claim 1, wherein the projecting structure is constituted of an inorganic substance.

7. The semiconductor device according to claim 1, wherein a metal film is not formed in a region between a peripheral edge of the chip and the projecting structure in plan view.

8. The semiconductor device according to claim 1, wherein the projecting structure is formed at intervals from a peripheral edge of the chip and the active surface in plan view.

9. The semiconductor device according to claim 1, wherein the projecting structure has a first side at the active surface side and a second side at the peripheral edge side of the chip, and
the organic film covers the projecting structure such as to cover both of the first side and the second side in plan view.

10. The semiconductor device according to claim 1, wherein the organic film covers an entire region of the projecting structure in plan view.

11. The semiconductor device according to claim 1, wherein the projecting structure is formed in a band shape extending along the active surface in plan view.

12. The semiconductor device according to claim 1, wherein the projecting structure surrounds the active surface in plan view.

13. The semiconductor device according to claim 12, wherein the projecting structure is formed in an endless annular shape in which surrounds the active surface plan view.

14. The semiconductor device according to claim 1, wherein the organic film covers a portion of the active surface in plan view.

15. The semiconductor device according to claim 1, further comprising:
a main surface electrode that covers the active surface in plan view;
wherein the organic film covers a portion of the main surface electrode.

16. The semiconductor device according to claim 15, wherein a nitride film is not interposed between the main surface electrode and the organic film.

17. The semiconductor device according to claim 1, wherein the first main surface includes the active surface, the outside surface which is depressed to the second main surface side with respect to the active surface, and a connecting surface which connects the active surface and the outside surface, and has a mesa which is demarcated by the active surface, the outside surface and the connecting surfaces, and the projecting structure faces the mesa in a plane direction of the outside surface.

18. The semiconductor device according to claim 1, wherein the projecting structure includes at least one of a polysilicon and a silicon oxide.

19. The semiconductor device according to claim 1, wherein the functional device includes a Schottky barrier diode that is formed in the active surface.

20. The semiconductor device according to claim 1, wherein the functional device includes an insulated gate type transistor that is formed in the active surface.

21. The semiconductor device according to claim 1, wherein the organic film includes a portion which covers the top surface of the projecting structure inside the at least one opening of the inorganic film.

* * * * *